US012606479B2

(12) United States Patent
Naito et al.

(10) Patent No.: US 12,606,479 B2
(45) Date of Patent: Apr. 21, 2026

(54) LEAD-FREE LOW-MELTING GLASS COMPOSITION AND LOW-MELTING GLASS COMPOSITE MATERIAL AND LOW-MELTING GLASS PASTE CONTAINING LEAD-FREE LOW-MELTING GLASS COMPOSITION, AND SEALING STRUCTURE, ELECTRICAL AND ELECTRONIC PART AND COATED PART USING SAME

(71) Applicant: SHOWA DENKO MATERIALS CO., LTD., Tokyo (JP)

(72) Inventors: Takashi Naito, Tokyo (JP); Shinichi Tachizono, Tokyo (JP); Yuji Hashiba, Tokyo (JP); Tatsuya Miyake, Tokyo (JP); Taigo Onodera, Tokyo (JP); Takuya Aoyagi, Tokyo (JP)

(73) Assignee: Resonac Corporation, Tokyo (JP)

( * ) Notice: Subject to any disclaimer, the term of this patent is extended or adjusted under 35 U.S.C. 154(b) by 953 days.

(21) Appl. No.: 17/638,308

(22) PCT Filed: Feb. 3, 2020

(86) PCT No.: PCT/JP2020/003896
§ 371 (c)(1),
(2) Date: May 24, 2022

(87) PCT Pub. No.: WO2021/038905
PCT Pub. Date: Mar. 4, 2021

(65) Prior Publication Data
US 2022/0289621 A1      Sep. 15, 2022

(30) Foreign Application Priority Data
Aug. 30, 2019      (JP) ................................. 2019-158061

(51) Int. Cl.
| | |
|---|---|
| *C03C 8/18* | (2006.01) |
| *C03C 8/20* | (2006.01) |
| *C03C 8/24* | (2006.01) |
| *H01L 23/29* | (2006.01) |
| *H01L 23/31* | (2006.01) |
| *H10K 59/80* | (2023.01) |

(52) U.S. Cl.
CPC .................. *C03C 8/18* (2013.01); *C03C 8/20* (2013.01); *C03C 8/24* (2013.01); *H01L 23/291* (2013.01); *H01L 23/3142* (2013.01); *H10K 59/8722* (2023.02)

(58) Field of Classification Search
CPC .. C03C 3/122; C03C 8/18; C03C 8/20; C03C 8/24; H01K 59/8722; H01L 23/291; H01L 23/3142
See application file for complete search history.

(56) References Cited

U.S. PATENT DOCUMENTS

| | | | |
|---|---|---|---|
| 2014/0145122 A1* | 5/2014 | Sawai ........................ | C03C 8/14 501/15 |
| 2016/0060158 A1 | 3/2016 | Naito et al. | |
| 2016/0229737 A1 | 8/2016 | Naito et al. | |
| 2018/0094475 A1* | 4/2018 | Naito ........................ | C03C 8/14 |
| 2018/0354843 A1* | 12/2018 | Naito ........................ | H01J 11/22 |
| 2019/0367405 A1* | 12/2019 | Naito ........................ | C03C 8/20 |
| 2022/0002188 A1* | 1/2022 | Choi ........................ | C03C 3/122 |
| 2022/0098088 A1* | 3/2022 | Choi ........................ | C03C 3/21 |
| 2024/0368024 A1* | 11/2024 | Sano ........................ | C03C 3/125 |

FOREIGN PATENT DOCUMENTS

| | | |
|---|---|---|
| CN | 108463440 A | 8/2018 |
| JP | 2001-106549 A | 4/2001 |
| JP | 5726698 B2 | 6/2015 |
| JP | 6350126 B2 | 7/2018 |
| JP | 6350127 B2 | 7/2018 |

* cited by examiner

*Primary Examiner* — Elizabeth A. Bolden
(74) *Attorney, Agent, or Firm* — FITCH, EVEN, TABIN & FLANNERY, LLP

(57) ABSTRACT

A lead-free low-melting glass composition containing vanadium oxide, tellurium oxide, silver oxide and lithium oxide, said composition satisfying the following two relational expressions (1) and (2) in terms of oxides.

$$[Ag_2O] \geq [TeO_2] \geq [V_2O_5] \geq [Li_2O] \tag{1}$$

$$2[V_2O_5] \geq [Ag_2O] + [Li_2O] \geq 40 \tag{2}$$

(In the formula, [X] represents a content of component X, and the unit thereof is "mol %"; the same applies hereinafter.) Thus, it is possible to provide a lead-free low-melting glass composition which enables sealing and adhesion at around the melting point (232° C.) of tin and which has high adhesiveness and stickiness.

23 Claims, 20 Drawing Sheets

LEAD-FREE LOW-MELTING GLASS COMPOSITION AND LOW-MELTING GLASS COMPOSITE MATERIAL AND LOW-MELTING GLASS PASTE CONTAINING LEAD-FREE LOW-MELTING GLASS COMPOSITION, AND SEALING STRUCTURE, ELECTRICAL AND ELECTRONIC PART AND COATED PART USING SAME

CROSS-REFERENCE TO RELATED APPLICATIONS

This application is a U.S. national phase application filed under 35 U.S.C. § 371 of International Application No. PCT/JP2020/003896, filed Feb. 3, 2020, designating the United States, which claims priority from Japanese Application No. 2019-158061, filed Aug. 30, 2019, which are hereby incorporated herein by reference in their entirety.

TECHNICAL FIELD

The present invention relates to a lead-free low-melting glass composition and a low-melting glass composite material and a low-melting glass paste containing the lead-free low-melting glass composition, and a sealing structure, an electrical and electronic part and a coated part using the same.

BACKGROUND ART

In parts including a vacuum insulated double glazing panel applied to a window glass, display panels such as a plasma display panel, an organic EL display panel, a fluorescent display tube, and electrical and electronic parts such as a quartz oscillator, an IC ceramic package, a semiconductor sensor, sealing and adhesion is performed by a low-melting glass composite material containing a low-melting glass composition and low thermal expansion filler particles. This low-melting glass composite material is often applied in the form of a low-melting glass paste. The low-melting glass paste is applied to a base material by a screen printing method, a dispenser method or the like, and is fired after drying, and is applied to sealing, adhesion or the like. At the time of the sealing, the adhesion or the like, the low-melting glass composition contained in the low-melting glass composite material or the low-melting glass paste is brought into close contact with the member to be sealed, the member to be adhered or the like by softening and flowing.

Also, in many electrical and electronic parts such as a solar cell, an image display device, a multilayer capacitor, a quartz oscillator, an LED (light emitting diode) and a multilayer circuit board, electrodes and wirings thereof are formed by a low-melting glass composite material containing a low-melting glass composition and metal particles. The low-melting glass composite material is also used as a conductive joint for electrically conducting and a heat-dissipating joint for conducting heat. Even at the time of forming the electrodes, the wirings and the heat-dissipating joint and the like, the low-melting glass composition contained in the low-melting glass composite material or the low-melting glass paste softens and flows, whereby sintering of the metal particles and adhesion to the substrate are performed.

In the past, PbO—B₂O₃ based low-melting glass compositions containing a very large amount of lead oxide have been widely applied as the above-mentioned low-melting glass composite materials and the low-melting glass pastes thereof. The PbO—B₂O₃ low-melting glasses have a low softening point of 350 to 400° C., good softening fluidity at 400 to 450° C., and relatively high chemical stabilities.

However, in recent years, the trend of green procurement and green design has become stronger worldwide, and safer materials have been required. For example, in Europe, Directive by the European Union (EU) on restrictions of the use of specific hazardous substances in electronic and electrical equipment (RoHS Directive) came into force on Jul. 1, 2006. In the RoHS Directive, lead, mercury, cadmium and hexavalent chromium are designated as prohibited substances. For this reason, the above-mentioned PbO—B₂O₃ based low-melting glass compositions are practically difficult to use.

Therefore, the development of a novel low-melting glass composition containing no lead has been advanced.

In the Patent Literature 1, a lead-free glass composition is disclosed which contains $Ag_2O$, $V_2O_5$ and $TeO_2$ as main components, of which the total content is 75% by mass or more, the remaining part containing one or more of $P_2O_5$, BaO, $K_2O$, $WO_3$, $Fe_2O_3$, $MnO_2$, $Sb_2O_3$ and ZnO. From Patent Literature 1, it can be read that the lead-free glass composition has a softening point of 320° C. or low obtained from a second endothermic peak temperature of a differential thermal analysis (DTA), and a sample obtained with a desirable result as an example has a softening point of 268° C. or higher. Patent Literature 1 describes a glass frit, a glass paste for sealing and a conductive glass paste containing the lead-free glass composition, and an electrical and electronic part using the same.

In addition, Patent Literature 2 discloses a lead-free low-melting glass composition containing at least vanadium oxide, tellurium oxide and silver oxide as main components and containing 0.1 to 3.0 mol % of any one or more of oxides of yttrium and lanthanoid as additional components, in which the glass composition has a softening point of 280° C. or low. From Patent Literature 2, it can read that a sample of the lead-free low-melting glass composition in which a desirable result can be obtained as an example has a softening point of 198° C. or higher.

Patent Literature 3 discloses a lead-free low-melting glass composition containing at least vanadium oxide, tellurium oxide and silver oxide as main components and containing 0.1 to 3.0 mol % of any one or more of oxides of Group 13 of the Periodic Table as additional components and having a softening point of 280° C. or low. From Patent Literature 3, it can read that a sample of this lead-free low-melting glass composition in which a desirable result can be obtained as an example has a softening point of 194° C. or higher.

CITATION LIST

Patent Literature

Patent Literature 1: Japanese Patent No. 5,726,698
Patent Literature 2: Japanese Patent No. 6,350,126
Patent Literature 3: Japanese Patent No. 6,350,127

SUMMARY OF INVENTION

Technical Problem

The lead-free glass composition disclosed in Patent Literature 1 has a significantly lower softening point than the conventional PbO—B₂O₃ based low-melting glass composition. However, since there is a possibility of crystallization during heating and firing, there remains a problem regarding further lowering the temperature. Further, when mixed with low thermal expansion filler particles or metal particles or when used in the form of a glass paste, this crystallization occurs more remarkably. This has made it difficult to apply to a sealing structure and an electrical and electronic part.

On the other hand, the lead-free low-melting glass compositions disclosed in Patent Literature 2 and Patent Literature 3 are difficult to crystallize. However, its crystallization countermeasures were not sufficient, and further improvement was needed. Further, it is necessary to improve the adhesiveness and stickiness to the material to be sealed and the material to be adhered.

An object of the present invention is to provide a lead-free low-melting glass composition which enables sealing and adhesion at around the melting point (232° C.) of tin and which has high adhesiveness and stickiness.

Solution to Problem

The lead-free low-melting glass composition of the present invention contains vanadium oxide, tellurium oxide, silver oxide and lithium oxide, and satisfies the following two relational expressions (1) and (2) in terms of oxide.

$$[Ag_2O] \geq [TeO_2] \geq [V_2O_5] \geq [Li_2O] \qquad (1)$$

$$2[V_2O_5] \geq [Ag_2O] + [Li_2O] \geq 40 \qquad (2)$$

(In the formula, [X] represents the content of component X, and the unit thereof is "mol %")

ADVANTAGEOUS EFFECTS OF INVENTION

According to the present invention, it is possible to provide a lead-free low-melting glass composition which enables sealing and adhesion at around the melting point (232° C.) of tin and which has high adhesiveness and stickiness.

DESCRIPTION OF EMBODIMENTS

Figure 1:
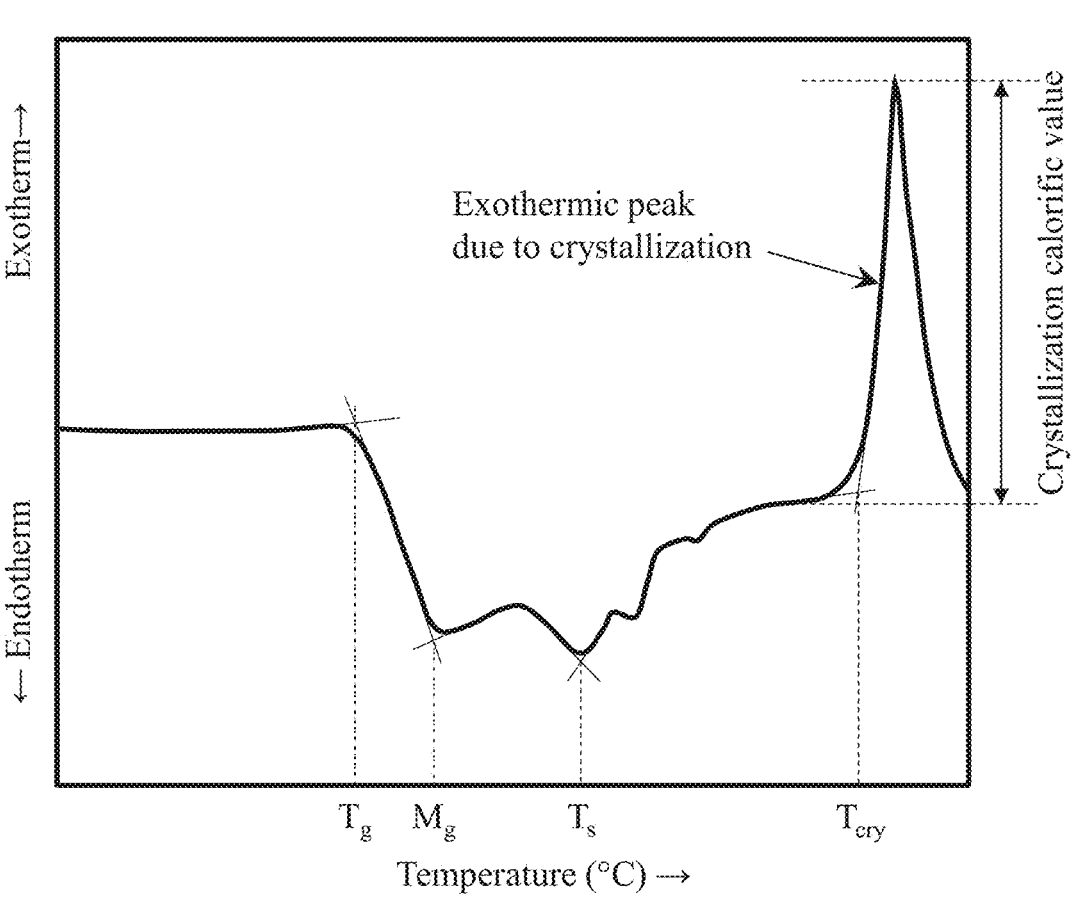
FIG. 1 is a graph showing a result of typical differential thermal analysis (DTA) specific to glass.

Hereinafter, embodiments of the present invention will be described in detail with reference to the drawings. However, the present invention is not limited to the embodiments taken up here, and can be appropriately combined and improved without changing the gist.

(Glass Composition)

In the so-called low-melting glass composition, generally, the lower characteristic temperatures such as a transition point, a yield point and a softening point, the better softening fluidity at a low temperature. On the other hand, if the characteristic temperature is excessively lowered, the crystallization tendency becomes large, and crystallization becomes easy at the time of heat firing. This crystallization is a factor to reduce the softening fluidity at low temperature. Further, the glass having a lower characteristic temperature has inferior chemical stability such as moisture resistance and acid resistance. In addition, there is a tendency that the influence on the environmental load becomes large. For example, in conventional $PbO$—$B_2O_3$ low-melting glassware compositions, the higher the deleterious $PbO$ content, the lower the characteristic temperatures, but the greater the tendency to crystallize, the lower the chemical stabilities, and the greater the environmental impact.

The present inventor has intensively examined a glass composition having excellent softening fluidity at a temperature significantly lower than that of a conventional $PbO$—$B_2O_3$ low-melting glass composition, specifically, at a temperature near the melting point (232° C.) of metal tin (Sn), good adhesiveness and stickiness, and good chemical stabilities, while being a glass composition containing substantially no lead. As a result, the present inventor has found that the above requirements are simultaneously satisfied in a novel lead-free glass composition, and has completed the present invention.

Specifically, the lead-free low-melting glass composition according to the present invention contains vanadium oxide, tellurium oxide, silver oxide and lithium oxide as main components, and the content of these main components satisfies the following two relational expressions (1) and (2) in terms of oxide.

$$[Ag_2O] \geq [TeO_2] \geq [V_2O_5] \geq [Li_2O] \tag{1}$$

$$2[V_2O_5] \geq [Ag_2O] + [Li_2O] \geq 40 \tag{2}$$

Here, in the above inequality, the content of the oxide X is expressed as [X] (the same shall apply hereinafter.). The unit thereof is "mol %" (the same shall apply hereinafter.). The "mol %" is calculated as a ratio of the content of each component contained in the glass composition to the entire glass composition in terms of oxide. Here, 2 $[V_2O_5]$ means $2 \times [V_2O_5]$, that is, twice $[V_2O_5]$.

Further, it is effective that the sum of $V_2O_5$, $TeO_2$, $Ag_2O$ and $Li_2O$ is 90 mol % or more.

Here, the term "lead-free" in the present invention means that the lead (Pb) content is 1000 ppm or less which is an allowable range in the RoHS Directive.

More preferably, the content of $Li_2O$ is 3 mol % or more and 25 mol % or less, particularly preferably 5 mol % or more and 15 mol % or less. It is preferable that the content of $V_2O_5$ is 20 mol % or more and 30 mol % or less, the content of $TeO_2$ is 24 mol % or more and 35 mol % or less, and the content of $Ag_2O$ is 24 mol % or more and 42 mol % or less.

The desirable configuration for the above lead-free low-melting glass composition is summarized as follows.

It is desirable that the lead-free low-melting glass composition satisfies the following relational expression (3).

$$[V_2O_5] + [TeO_2] + [Ag_2O] + [Li_2O] \geq 90 \tag{3}$$

It is desirable that the lead-free low-melting glass composition satisfies the following relational expression (4).

$$3 \geq [Li_2O] \geq 25 \tag{4}$$

It is desirable that the lead-free low-melting glass composition satisfies the following relational expression (5).

$$5 \geq [Li_2O] \geq 15 \tag{5}$$

It is desirable that the lead-free low-melting glass composition satisfies the following three relational expressions (6) to (8).

$$20 \geq [V_2O_5] \geq 30 \tag{6}$$

$$24 \geq [TeO_2] \geq 35 \tag{7}$$

$$24 \geq [Ag_2O] \geq 42 \tag{8}$$

As will be explained in detail later in the description of FIG. 1, the inventors confirmed it by comparing the results of a differential thermal analysis (DTA) and the temperature based on the definition by viscosity with respect to the transition point, the yield point and the softening point of glass that the second endothermic peak temperature by the DTA is almost equal to the softening point measured as the temperature corresponding to the viscosity. Therefore, in this specification, the second endothermic peak temperature due to the DTA is defined as the "softening point $T_s$".

In $V_2O_5$—$TeO_2$—$Ag_2O$—$Li_2O$-based lead-free low-melting glass composition of the present invention, the second endothermic peak temperature by the DTA can be set to 220° C. or low, and the crystallization temperature by the DTA can be set to 260° C. or high. Further, the difference between the crystallization temperature and the second endothermic peak temperature due to the DTA can be 60° C. or more. As a result, it is possible to provide a lead-free low-melting glass composition having a good softening fluidity at around the melting point (232° C.) of metal tin (Sn) and having good adhesiveness and stickiness to various materials to be sealed and materials to be adhered. Further, the $V_2O_5$—$TeO_2$—$Ag_2O$—$Li_2O$-based lead-free low-melting glass composition of the present invention has a high chemical stability such as a moisture resistance and an acid resistance and the like, despite the softening point has been reduced to the low temperature, and corresponds to the RoHS Directive.

The functions of the main components in the $V_2O_5$—$TeO_2$—$Ag_2O$—$Li_2O$-based lead-free low-melting glass composition of the present invention are described below.

The glass structure of the $V_2O_5$—$TeO_2$—$Ag_2O$—$Li_2O$-based lead-free low-melting glass composition of the present invention has a layered structure consisting of $V_2O_5$ and $TeO_2$, with $Ag_2O$ in the form of $Ag^+$ and $Li_2O$ in the form of $Li^+$ between the layers. $Ag_2O$ is mixed for lowering the characteristic temperatures such as a transition point, a yield point, a softening point etc., and to improve the chemical stabilities. Lowering the characteristic temperature is considered because Ag$^+$ enters between layers of the layered structure consisting of V$_2$O$_5$ and TeO$_2$, and an interlayer force weakens. In addition, improving the chemical stabilities is considered because Ag$^+$ enters between the layers and infiltration of water molecules and the like into the layers is prevented. For this reason, as the amount of Ag$^+$ present between the layers increases, the characteristic temperature can be lowered and the chemical stability can be improved.

However, if the content of Ag$_2$O is excessively large, there arise a problem that metal silver (Ag) is precipitated at the time of manufacturing the glass, and a problem that the crystallization tendency of the manufactured glass is increased. In addition, Li$^+$ existing between the layers together with Ag$^+$ exerts great effects on suppressing or preventing crystallization, and further, on improving or improving the adhesiveness or stickiness. It is considered that Li$^+$, which is a monovalent cation with a small ion radius, easily moves in the interlayer when heated, and diffuses into the material to be sealed or the material to be adhered during sealing or adhering, thereby achieving high adhesiveness and stickiness.

However, if the content of Li$_2$O is too large, the chemical stability such as moisture resistance, acid resistance is deteriorated, and therefore it is necessary to pay attention to the content.

It is considered that Ag$^+$ and Li$^+$ existing between the layers are bound to V$_2$O$_5$ forming the layered structure. Up to two Ag$^+$ or Li$^+$ can be put in the ionic state between the layers in the glass structure for one pentavalent vanadium ion (V$^{5+}$). If it exceeds this value, there arises a problem that metal silver (Ag) is precipitated at the time of manufacturing the glass.

If Ag$_2$O as a glass component does not exist in the Ag$^+$ state between the layers in the glass structure, the desired effect of lowering the temperature cannot be obtained. Therefore, when increasing the number of Ag$^+$ and Li$^+$ to be introduced between the layers, it is necessary to appropriately increase the content of V$_2$O$_5$ in addition to increasing the content of Ag$_2$O and Li$_2$O.

As described above, V$_2$O$_5$ forming a layered structure is a glass component that plays an important role in introducing Ag$^+$ and Li$^+$ into the glass structure.

TeO$_2$ is a vitrification component for vitrifying, and glass cannot be formed unless TeO$_2$ is contained. Further, when the content of TeO$_2$ is small, it is difficult to reduce the crystallization tendency. On the other hand, if the content is large, the crystallization tendency can be reduced, but it is difficult to lower the characteristic temperature. Further, when the content of TeO$_2$ is increased, the glass structure is no longer a layered structure for introducing Ag$^+$ and Li$^+$.

In the above-described V$_2$O$_5$—TeO$_2$—Ag$_2$O—Li$_2$O based lead-free low-melting glass composition, it is effective to include any of yttrium oxide, lanthanum oxide, cerium oxide, erbium oxide, ytterbium oxide, aluminum oxide and iron oxide as sub-components to further reduce the crystallization tendency and improve the chemical stability. And the content of the sub-components is preferably 0.5 mol % or more and 3 mol % or less in total in the oxide form of Y$_2$O$_3$, La$_2$O$_3$, CeO$_2$, Er$_2$O$_3$, Yb$_2$O$_3$, Al$_2$O$_3$ and Fe$_2$O$_3$, respectively.

Further, in V$_2$O$_5$—TeO$_2$—Ag$_2$O—Li$_2$O based lead-free low-melting glass composition described above, in order to further reduce the crystallization tendency, it is effective to include any of alkaline earth oxides, tungsten oxide and molybdenum oxide as additional components. And the content of the additional components is preferably 0.5 mol % or more and 5 mol % or less in total in the oxide form of MgO, CaO, SrO, BaO, WO$_3$ and MoO$_3$, respectively.

The above is summarized as follows.

The lead-free low-melting glass composition further includes any one or more of yttrium oxide, lanthanum oxide, cerium oxide, erbium oxide, ytterbium oxide, aluminum oxide, and iron oxide, and it is desirable to satisfy the following relational expression (9).

$$0.5 \leq [Y_2O_3]+[La_2O_3]+[CeO_2]+[Er_2O_3]+[Yb_2O_3]+[Al_2O_3]+[Fe_2O_3] \leq 3 \qquad (9)$$

The lead-free low-melting glass composition further contains one or more of an oxide of an alkaline earth metal, tungsten oxide and molybdenum oxide, and it is desirable to satisfy the following relational expression (10).

$$0.5 \leq [MgO]+[CaO]+[SrO]+[BaO]+[WO_3]+[MoO_3] \leq 5 \qquad (10)$$

In order to apply a low-melting glass composite material containing a lead-free low-melting glass composition and one or more of low thermal expansion filler particles, metal particles, and resin, or a low-melting glass paste in which the low-melting glass composite material is pasted, to a sealing structure, an electrical and electronic part, and a coated part, it is necessary to apply the low-melting glass composition to a low-melting glass composite material or a low-melting glass paste composition having a small crystallization tendency, a good softening fluidity, a high adhesiveness and stickiness to a material to be sealed or a material to be adhered, and a good chemical stability. However, none of the conventional low-melting glass compositions have realized all of these properties.

Here, a characteristic temperature of the glass in the present invention will be described. In the present invention, the characteristic temperature was measured by the DTA Generally, the DTA of glass is measured at a temperature rising rate of 5° C./min in the air using glass particles having a diameter of several tens of micrometers, and using high-purity alumina (α-Al$_2$O$_3$) particles as a reference sample.

FIG. 1 is an example of a typical DTA curve specific to glass. The horizontal axis represents a temperature of a standard sample, and the vertical axis represents a temperature difference (potential difference) between the glass sample to be measured and the standard sample.

In this figure, when the glass is heated at the above temperature rising rate, it starts endothermic process from the transition point T$_g$, reaches the yield point M$_g$ corresponding to a first endothermic peak temperature. Then, the temperature difference becomes small once, and then the temperature difference becomes large again. And the glass reaches the softening point T$_s$ corresponding to the second endothermic peak temperature.

When further heated, heat generation starts from a crystallization temperature T$_{cry}$, and reaches an exothermic peak. The exothermic peak is due to crystallization, and the temperature at which the heat generation starts is called the crystallization temperature T$_{cry}$. Although not shown, the temperature corresponding to the exothermic peak is referred to as a crystallization peak temperature T$_{cry-p}$. The transition point T$_g$ is a starting temperature of the first endothermic peak and the yield point M$_g$ is the first endothermic peak temperature. The respective characteristic temperatures are usually obtained by a tangential method.

Strictly speaking, the transition point T$_g$, the yield point M$_g$ and the softening point T$_s$ are defined by viscosity of the glass. T$_g$, M$_g$ and T$_s$ are respectively equivalent to $10^{13.3}$ poise, $10^{11.0}$ poise and $10^{7.65}$ poise.

The crystallization tendency is determined from the difference (absolute value) between the softening point T$_s$ and the crystallization temperature $T_{cry}$, and a height of the exothermic peak due to the crystallization, i.e., the calorific value of the exothermic peak.

First, if the difference (absolute value) between the softening point $T_s$ and the crystallization temperature $T_{cry}$ is large, even if the glass reaches a temperature exceeding the softening point $T_s$, it is easy to soften and fluidize the glass in a temperature range that does not reach $T_{cry}$. In addition, if the amount of heat generated during crystallization is small, it is unlikely that an uncontrollable temperature rise due to heat generation occurs, so that the progress of the crystallization can be suppressed when the temperature reaches $T_{cry}$ by heating at a constant temperature rising rate.

Therefore, it can be said that high temperature of $T_{cry}$, that is, the increase in difference $T_{cry}$-$T_s$, and the decrease in the calorific value of crystallization indicate glass which are difficult to crystallize. That is, if glass that is determined to have a small crystallization tendency is used, it becomes easy to form a desired sealed part or the like.

The firing temperature when sealing and adhering of various parts and forming of electrodes/wiring and conductive/heat-dissipating joints using a conventional low-melting glass composition is the same as that of the low thermal expansion filler particles and metal particles contained. Although it is affected by the type, content and particle size, and firing conditions such as temperature rising rate, atmosphere, and pressure, it is usually set to be about 30 to 50° C. higher than the softening point $T_s$. At this firing temperature, the low-melting glass composition has good softening fluidity without crystallization.

However, the lead-free low-melting glass composition has significantly lower characteristic temperatures of the transition point $T_g$, the yield point $M_g$, and the softening point $T_s$ than the conventional low-melting glass composition, and the respective temperature differences are smaller. Therefore, the viscosity gradient in this temperature region is large. Therefore, even at a firing temperature in the vicinity of the softening point $T_s$, if the temperature is maintained, good softening fluidity can be obtained. Even if the retention time is short, sufficient softening fluidity is produced if the temperature is about 20 to 30° C. higher than $T_s$.

The lead-free low-melting glass composition has a low softening point $T_s$ of 220° C. or low, a high crystallization temperature $T_{cry}$ of 260° C. or high, and a large temperature difference of 60° C. or more between $T_{cry}$ and $T_s$. Therefore, it can be easily fired at the same temperature level as tin solder.

(Low-Melting Glass Composite Materials and Low-Melting Glass Pastes)

The low-melting glass composite material includes a lead-free low-melting glass composition according to the present invention and any one or more of low thermal expansion filler particles, metal particles, and a resin.

Hereinafter, a low-melting glass composite material containing the low thermal expansion filler particles, the metal particles or the resin will be described.

The low-melting glass composite material containing the low thermal expansion filler particles preferably contains 35% by volume or more and less than 100% by volume of the lead-free low-melting glass composition and 0% by volume or more and 65% by volume or less of the low thermal expansion filler particles. By setting the lead-free low-melting glass composition to 35% by volume or more or the low thermal expansion filler particles to 65% by volume or less, good softening fluidity and good adhesiveness and stickiness to the material to be sealed and the material to be adhered can be obtained.

The low thermal expansion filler particles to be mixed in order to achieve low thermal expansion of the low-melting glass composite material are preferably any one of zirconium tungstate phosphate ($Zr_2(WO_4)(PO_4)_2$), β-eucryptite ($Li_2O \cdot Al_2O_3 \cdot 2SiO_2$), cordierite ($2MgO \cdot 2Al_2O_3 \cdot 5SiO_2$), silica glass ($SiO_2$), niobium oxide ($Nb_2O_5$), and silicon (Si). Low thermal expansion filler particles particularly useful for low thermal expansion of low-melting glass composite material are zirconium tungstate phosphate ($Zr_2(WO_4)$ ($PO_4)_2$) or a compound mainly composed of zirconium tungstate phosphate ($Zr_2(WO_4)(PO_4)_2$), and the preferred content of the low thermal expansion filler particles is 30% by volume or more and 60% by volume or less.

It is preferable that the low-melting glass composite material containing the metal particles contains 10% by volume or more and 80% by volume or less of the lead-free low-melting glass composition and 20% by volume or more and 80% by volume or less of the metal particles. By setting the lead-free low-melting glass composition to 10% by volume or more or 90% by volume or less of the metal particles, sintering between the metal particles and adhesiveness and stickiness to the base material are improved.

From the viewpoint of improving the conductivity and heat dissipation, any one of silver (Ag), silver alloy, copper (Cu), copper alloy, aluminum (Al), aluminum alloy, tin (Sn) and tin alloy is preferable as the metal particles. The metal particles particularly effective for improving the conductivity and heat dissipation of the low-melting glass composite material of the present invention are silver (Ag) or tin (Sn), and the preferable content thereof is 30% by volume or more and 90% by volume or less. This is because the lead-free low-melting glass composition of the present invention can promote sintering of silver (Ag) particles by softening and flowing, and can soften and flow at around the melting point of tin (Sn) particles.

The low-melting glass composite material containing a resin contains 5% by volume or more and less than 100% by volume of a lead-free low-melting glass composition, and contains more than 0% by volume and 95% by volume or less of a resin. By setting the lead-free low-melting glass composition of the present invention to 5% by volume or more, or the resin to 95% by volume or less, the lead-free glass composition and the resin can be effectively composited.

The resin is preferably any one of epoxy resin, phenoxy resin, phenol resin, acrylic resin, urethane resin and fluororesin. By using these resins, the softening fluidity becomes good in the resin of the lead-free low-melting glass composition.

The low-melting glass paste contains a low-melting glass composite material including a lead-free low-melting glass composition according to the present invention, and a solvent. As the solvent, dihydroterpineol, α-terpineol or carbitol acetate is preferably used. This is because these solvents are solvents which are difficult to crystallize for the lead-free low-melting glass composition of the present invention. Further, if necessary, a viscosity modifier, a wetting agent, or the like is added, and the stability and coatability of the low-melting glass paste can be adjusted.

When sealing or adhering in a sealed structure is performed using a low-melting glass composite material containing low thermal expansion filler particles or a low-melting glass paste thereof, it is preferable to dispose or apply the low-melting glass composite material or the low-melting glass paste to a sealed part of an object to be sealed or an adhesive part of an object to be adhered, and to fire the low-melting glass composition in a temperature range from the vicinity of the softening point $T_s$ of the contained lead-free low-melting glass composition to about 20° C. higher than the $T_s$.

Since the glass composite material or the glass paste of the present invention uses a lead-free low-melting glass composition in which the crystallization tendency is reduced and the softening point is lowered, the softening fluidity at a low temperature can be improved and the firing temperature can be lowered. Thus, after reducing the impact on the environmental load, it is possible to reduce the thermal damage of the sealing structure (high functionality) and productivity improvement (tact reduction).

Further, since the lead-free low-melting glass composition of the present invention has good adhesiveness and stickiness and chemical stability, reliability of the sealing structure can be also secured.

Further, when an electrode/wiring and a conductive/heat dissipation joint on the electrical and electronic parts are formed by using the low-melting glass composite material or its low-melting glass paste containing metal particles, it is preferable that the low-melting glass composite material or low-melting glass paste is arranged or coated at a predetermined location on a substrate etc., and it is fired from the vicinity of the softening point $T_s$ of the lead-free low-melting glass composition contained therein to about 20° C. higher than the Ts. In addition, it is desirable that the firing atmosphere be an inert gas or a vacuum in order to prevent oxidation of the metal particles when the metal particles used are a metal that is easily oxidized.

Since the low-melting glass composite material and the low-melting glass paste of the present invention use a lead-free low-melting glass composition in which the crystallization tendency is reduced and the softening point is lowered, the softening fluidity at a low temperature can be improved and the firing temperature can be lowered. As a result, it is possible to lower the formation temperature of the electrode/wiring and the conductive/heat dissipation joint, i.e., the firing temperature. Thus, it is possible to reduce impact on an environmental load, and to reduce thermal damage (high functionality) and productivity improvement (tact reduction) of the electrical and electronic parts. Further, since the lead-free low-melting glass composition of the present invention has good adhesiveness and stickiness and chemical stability, reliability of the electrical and electronic parts can be secured.

In addition, a metal, a ceramic or a glass is effective as a base material when a low-melting glass composite material or a low-melting glass paste containing a resin is used to form a coating film on a coated part. The low-melting glass composite material or the low-melting glass paste is arranged or applied to a specified area of the base material, and fired at a temperature range from around the softening point $T_s$ of the lead-free low-melting glass composition contained therein to about 20° C. higher than $T_s$.

In the low-melting glass composite material or the low-melting glass paste of the present invention, the softening fluidity at a low temperature can be improved and a firing temperature can be lowered by using a lead-free low-melting glass composition in which a crystallization tendency is reduced and a softening point is lowered. As a result, it is possible to improve the reliability such as the coating film stickiness, heat resistance and chemical stability of the coated part while reducing the influence on the environmental load.

(Sealing Structure)

A low-melting glass composite material and a low-melting glass paste of the present invention are suitably used for sealing a vacuum insulated double glazing panel which is applied to a window glass or the like, a display panel such as a plasma display panel, an organic EL display panel, and a fluorescent display tube, and a packaging device such as a quartz oscillator, an IC package, and an MEMS.

A sealing structure of the present invention uses a glass plate, a circuit board or the like, and a low-melting glass composite material or a low-melting glass paste.

The sealing structure may have an internal space separated from the outside. In this case, the boundary between the inner space and the outside may be formed by a sealed part including a low-melting glass composite material. The content of the lead-free low-melting glass composition contained in the low-melting glass composite material forming the sealed part is preferably 40% by volume or more. It is also effective to mix low thermal expansion filler particles into the low-melting glass composite material. Instead of the low thermal expansion filler particles, soft metal particles may be mixed to relieve a residual stress in the sealed part.

(Electrical and Electronic Parts)

A low-melting glass composite material or a low-melting glass paste of the present invention is suitably used for forming an electrode, a wiring, a conductive joint and a heat dissipation joint of electrical and electronic parts such as a solar cell, an image display device, a multilayer capacitor, an inductor, a quartz oscillator, a light emitting diode (LED), a multilayer circuit board, and a semiconductor module. In this case, the content of the metal particles contained in the low-melting glass composite material is preferably 50% by volume or more.

(Coated Parts)

It is also possible to use a low-melting glass composite material or a low-melting glass paste of the present invention as a coating material.

A coated part of the present invention includes a member and a coating film formed by coating a coating material on a surface of the member. The member may be a metal, a ceramic, a glass, or the like. The coating film includes a low-melting glass composite material of the present invention.

A resin may be mixed into the low-melting glass composite material forming the coating film. It is effective that the content of the resin is 50% by volume or more. Suitable examples of the coated parts include an electrical wire, a car body, an airframe, a washing machine tub, a toilet bowl, a bathtub tile and the like.

EXAMPLES

Hereinafter, the present invention will be described in detail based on specific examples. However, the present invention is not limited to the examples taken here, and includes variations thereof.

Example 1

In this Example, a $V_2O_5$—$TeO_2$—$Ag_2O$—$Li_2O$ based lead-free glass composition was prepared, and the effect of the glass composition on the glass property was investigated. As the glass property, vitrified state, characteristic temperature, softening fluidity and chemical stability of the prepared lead-free glass composition were evaluated.

(Preparation of Lead-Free Glass Composition)

Table 1 shows the compositions of the lead-free glass compositions A-01 to A-51 of the Examples. The A-01 to A-51 are lead-free glass-compositions that contains $V_2O_5$, $TeO_2$, $Ag_2O$ and $Li_2O$ as main components and essential components.

Table 2 shows the compositions of the lead-free glass compositions B-01 to B-46 of the Comparative Examples.

These compositions are the proportions combined when producing the glasses.

TABLE 1

| Glass | Main component (mol %) | | | | | Additional component |
|---|---|---|---|---|---|---|
| No. | $V_2O_5$ | $TeO_2$ | $Ag_2O$ | $Li_2O$ | Sub-component (mol %) | (mol %) |
| A-01 | 25.0 | 35.0 | 35.0 | 5.0 | — | — |
| A-02 | 25.0 | 30.0 | 40.0 | 5.0 | — | — |
| A-03 | 30.0 | 30.0 | 30.0 | 10.0 | — | — |
| A-04 | 25.0 | 30.0 | 35.0 | 10.0 | — | — |
| A-05 | 25.0 | 30.0 | 30.0 | 15.0 | — | — |
| A-06 | 25.0 | 30.0 | 25.0 | 20.0 | — | — |
| A-07 | 25.0 | 25.0 | 25.0 | 25.0 | — | — |
| A-08 | 25.0 | 30.0 | 35.0 | 7.0 | $Y_2O_3$:3.0 | — |
| A-09 | 25.0 | 30.0 | 35.0 | 7.0 | $La_2O_3$:3.0 | — |
| A-10 | 25.0 | 30.0 | 35.0 | 7.0 | $CeO_2$:3.0 | — |
| A-11 | 25.0 | 30.0 | 35.0 | 7.0 | $Er_2O_3$:3.0 | — |
| A-12 | 25.0 | 30.0 | 35.0 | 7.0 | $Yb_2O_3$:3.0 | — |
| A-13 | 25.0 | 30.0 | 35.0 | 7.0 | $Al_2O_3$:3.0 | — |
| A-14 | 25.0 | 30.0 | 35.0 | 7.0 | $Fe_2O_3$:3.0 | — |
| A-15 | 24.5 | 30.0 | 40.0 | 4.0 | $La_2O_3$:0.5, $Al_2O_3$:0.5, $Fe_2O_3$:0.5 | — |
| A-16 | 24.5 | 30.0 | 38.0 | 6.0 | $La_2O_3$:0.5, $Al_2O_3$:0.5, $Fe_2O_3$:0.5 | — |
| A-17 | 24.5 | 30.0 | 36.0 | 8.0 | $La_2O_3$:0.5, $Al_2O_3$:0.5, $Fe_2O_3$:0.5 | — |
| A-18 | 24.5 | 30.0 | 34.0 | 10.0 | $La_2O_3$:0.5, $Al_2O_3$:0.5, $Fe_2O_3$:0.5 | — |
| A-19 | 24.5 | 30.0 | 32.0 | 12.0 | $La_2O_3$:0.5, $Al_2O_3$:0.5, $Fe_2O_3$:0.5 | — |
| A-20 | 24.5 | 30.0 | 30.0 | 14.0 | $La_2O_3$:0.5, $Al_2O_3$:0.5, $Fe_2O_3$:0.5 | — |
| A-21 | 26.0 | 26.0 | 31.5 | 15.0 | $La_2O_3$:0.5, $Al_2O_3$:0.5, $Fe_2O_3$:0.5 | — |
| A-22 | 24.5 | 30.0 | 24.0 | 20.0 | $La_2O_3$:0.5, $Al_2O_3$:0.5, $Fe_2O_3$:0.5 | — |
| A-23 | 25.0 | 30.0 | 35.0 | 5.0 | — | MgO:5.0 |
| A-24 | 25.0 | 25.0 | 35.0 | 10.0 | — | MgO:5.0 |
| A-25 | 25.0 | 30.0 | 35.0 | 5.0 | — | CaO:5.0 |
| A-26 | 25.0 | 30.0 | 35.0 | 5.0 | — | SrO:5.0 |
| A-27 | 25.0 | 30.0 | 35.0 | 5.0 | — | BaO:5.0 |
| A-28 | 20.0 | 35.0 | 35.0 | 5.0 | — | $WO_3$:5.0 |
| A-29 | 25.0 | 30.0 | 35.0 | 5.0 | — | $WO_3$:5.0 |
| A-30 | 25.0 | 30.0 | 35.0 | 5.0 | — | $MoO_3$:5.0 |
| A-31 | 24.0 | 30.0 | 40.0 | 3.0 | $La_2O_3$:0.5, $Al_2O_3$:0.5 | MgO:2.0 |
| A-32 | 24.0 | 30.0 | 38.0 | 5.0 | $Al_2O_3$:0.5 | MgO:2.5 |
| A-33 | 24.0 | 30.0 | 38.0 | 5.0 | $La_2O_3$:0.5, $Al_2O_3$:0.5 | MgO:2.0 |
| A-34 | 24.5 | 29.0 | 38.5 | 5.0 | $La_2O_3$:0.5, $Al_2O_3$:0.5 | MgO:2.0 |
| A-35 | 25.0 | 27.0 | 40.0 | 5.0 | $La_2O_3$:0.5, $Al_2O_3$:0.5, $Fe_2O_3$:0.5 | $WO_3$:1.5 |
| A-36 | 24.0 | 31.0 | 35.0 | 5.0 | $La_2O_3$:0.5, $Al_2O_3$:0.5, $Fe_2O_3$:1.0 | $WO_3$:3.0 |
| A-37 | 25.0 | 25.5 | 42.0 | 5.0 | $La_2O_3$:0.5, $Al_2O_3$:0.5, $Fe_2O_3$:0.5 | MgO:1.0 |
| A-38 | 22.0 | 30.0 | 38.0 | 6.0 | $La_2O_3$:0.5, $Al_2O_3$:0.5, $Fe_2O_3$:0.5 | MgO:1.0, $WO_3$:1.5 |
| A-39 | 24.0 | 30.0 | 34.0 | 6.0 | $La_2O_3$:0.5, $Al_2O_3$:0.5, $Fe_2O_3$:1.0 | BaO:2.0, $WO_3$:2.0 |
| A-40 | 23.5 | 30.0 | 35.0 | 6.5 | $La_2O_3$:0.5, $Al_2O_3$:0.5, $Fe_2O_3$:0.5 | $WO_3$:3.5 |
| A-41 | 25.0 | 30.0 | 32.0 | 8.0 | $La_2O_3$:0.5, $Al_2O_3$:0.5, $Fe_2O_3$:1.0 | BaO:3.0 |
| A-42 | 23.5 | 27.0 | 38.0 | 8.0 | $La_2O_3$:0.5, $Al_2O_3$:0.5, $Fe_2O_3$:0.5 | MgO:1.0, $WO_3$:1.0 |
| A-43 | 25.0 | 27.0 | 35.5 | 9.0 | $La_2O_3$:0.5, $Al_2O_3$:0.5, $Fe_2O_3$:0.5 | $WO_3$:2.0 |
| A-44 | 25.5 | 25.5 | 37.0 | 9.5 | $La_2O_3$:0.5, $Al_2O_3$:0.5, $Fe_2O_3$:0.5 | MgO:1.0 |
| A-45 | 23.0 | 29.0 | 36.0 | 9.5 | $La_2O_3$:0.5, $Al_2O_3$:0.5, $Fe_2O_3$:0.5 | MgO:1.0 |
| A-46 | 25.0 | 25.5 | 37.0 | 10.0 | $La_2O_3$:0.5, $Al_2O_3$:0.5, $Fe_2O_3$:0.5 | MgO:1.0 |
| A-47 | 25.0 | 27.0 | 31.5 | 10.0 | $La_2O_3$:0.5, $Al_2O_3$:0.5, $Fe_2O_3$:0.5 | BaO:2.0, $WO_3$:3.0 |
| A-48 | 24.0 | 29.0 | 33.5 | 10.0 | $Al_2O_3$:0.5, $Fe_2O_3$:0.5 | BaO:1.0, $WO_3$:1.5 |
| A-49 | 24.0 | 29.5 | 30.0 | 13.0 | $CeO_2$:0.5, $Al_2O_3$:0.5, $Fe_2O_3$:0.5 | BaO:1.0, $WO_3$:1.0 |
| A-50 | 24.5 | 28.0 | 30.0 | 14.5 | $Al_2O_3$:0.5, $Fe_2O_3$:0.5 | BaO:1.0, $WO_3$:1.0 |
| A-51 | 24.0 | 24.0 | 32.0 | 15.0 | $La_2O_3$:0.5, $Al_2O_3$:0.5, $Fe_2O_3$:0.5 | MgO:1.5, $WO_3$:1.0 |

TABLE 2

| Glass | Main component (mol %) | | | | | Additional component | Other component |
|---|---|---|---|---|---|---|---|
| No. | $V_2O_5$ | $TeO_2$ | $Ag_2O$ | $Li_2O$ | Sub-component (mol %) | (mol %) | (mol %) |
| B-01 | 25.0 | 25.0 | 50.0 | — | — | — | — |
| B-02 | 25.0 | 30.0 | 45.0 | — | — | — | — |
| B-03 | 25.0 | 35.0 | 40.0 | — | — | — | — |
| B-04 | 15.0 | 40.0 | 45.0 | — | — | — | — |
| B-05 | 20.0 | 40.0 | 40.0 | — | — | — | — |
| B-06 | 25.0 | 40.0 | 35.0 | — | — | — | — |

TABLE 2-continued

| Glass No. | Main component (mol %) | | | | | Additional component | Other component |
|---|---|---|---|---|---|---|---|
| | $V_2O_5$ | $TeO_2$ | $Ag_2O$ | $Li_2O$ | Sub-component (mol %) | (mol %) | (mol %) |
| B-07 | 30.0 | 40.0 | 30.0 | — | — | — | — |
| B-08 | 25.0 | 30.0 | 44.0 | — | $La_2O_3$:1.0 | — | — |
| B-09 | 25.0 | 30.0 | 44.0 | — | $CeO_2$:1.0 | — | — |
| B-10 | 25.0 | 30.0 | 44.0 | — | $Al_2O_3$:1.0 | — | — |
| B-11 | 25.0 | 30.0 | 44.0 | — | $Fe_2O_3$:1.0 | — | — |
| B-12 | 24.5 | 30.0 | 44.0 | — | $La_2O_3$:0.5, $Al_2O_3$:0.5, $Fe_2O_3$:0.5 | — | — |
| B-13 | 25.0 | 30.0 | 42.0 | — | $La_2O_3$:1.0, $Al_2O_3$:1.0, $Fe_2O_3$:1.0 | — | — |
| B-14 | 25.0 | 30.0 | 44.0 | — | — | $WO_3$:1.0 | — |
| B-15 | 25.0 | 30.0 | 40.0 | — | — | $WO_3$:5.0 | — |
| B-16 | 20.0 | 40.0 | 30.0 | — | — | $WO_3$:10.0 | — |
| B-17 | 25.0 | 30.0 | 44.0 | — | — | MgO:1.0 | — |
| B-18 | 25.0 | 30.0 | 40.0 | — | — | MgO:5.0 | — |
| B-19 | 25.0 | 30.0 | 44.0 | — | — | BaO:1.0 | — |
| B-20 | 25.0 | 30.0 | 40.0 | — | — | BaO:5.0 | — |
| B-21 | 20.0 | 40.0 | 30.0 | — | — | BaO:10.0 | — |
| B-22 | 21.0 | 38.0 | 38.0 | — | — | BaO:3.0, $WO_3$:1.0 | — |
| B-23 | 25.0 | 30.0 | 44.0 | — | — | — | $ZrO_2$:1.0 |
| B-24 | 20.0 | 38.0 | 39.0 | | | | $P_2O_5$:3.0 |
| B-25 | 25.0 | 30.0 | 35.0 | — | — | — | $Na_2O$:10.0 |
| B-26 | 25.0 | 30.0 | 35.0 | — | — | — | $K_2O$:10.0 |
| B-27 | 23.0 | 31.0 | 40.0 | — | $La_2O_3$:0.5, $Al_2O_3$:0.5, $Fe_2O_3$:1.0 | — | $K_2O$:4.0 |
| B-28 | 23.5 | 34.0 | 37.5 | — | $La_2O_3$:0.5, $Al_2O_3$:0.5, $Fe_2O_3$:1.0 | — | $K_2O$:3.0 |
| B-29 | 24.5 | 30.0 | 41.0 | — | $La_2O_3$:0.5, $Al_2O_3$:0.5, $Fe_2O_3$:0.5 | — | $K_2O$:3.0 |
| B-30 | 23.5 | 31.5 | 40.0 | — | $La_2O_3$:0.5, $Al_2O_3$:0.5, $Fe_2O_3$:1.0 | $WO_3$:3.0 | — |
| B-31 | 25.0 | 30.0 | 40.0 | — | $La_2O_3$:0.5, $Al_2O_3$:0.5, $Fe_2O_3$:1.0 | BaO:3.0 | — |
| B-32 | 24.0 | 30.0 | 40.0 | — | $La_2O_3$:0.5, $Al_2O_3$:0.5, $Fe_2O_3$:1.0 | BaO:2.0, $WO_3$:2.0 | — |
| B-33 | 23.5 | 30.0 | 41.0 | — | $La_2O_3$:0.5, $Al_2O_3$:0.5, $Fe_2O_3$:1.0 | $WO_3$:3.5 | — |
| B-34 | 25.0 | 27.0 | 41.0 | — | $La_2O_3$:0.5, $Al_2O_3$:0.5, $Fe_2O_3$:1.0 | BaO:2.0, $WO_3$:3.0 | — |
| B-35 | 24.0 | 29.0 | 43.5 | — | $Al_2O_3$:0.5, $Fe_2O_3$:0.5 | BaO:1.0, $WO_3$:1.5 | — |
| B-36 | 24.5 | 28.0 | 44.5 | — | $Al_2O_3$:0.5, $Fe_2O_3$:0.5 | BaO:1.0, $WO_3$:1.0 | — |
| B-37 | 24.0 | 29.5 | 43.0 | — | $Y_2O_3$:0.5, $Al_2O_3$:0.5, $Fe_2O_3$:0.5 | BaO:1.0, $WO_3$:1.0 | — |
| B-38 | 23.0 | 30.0 | 45.5 | — | $La_2O_3$:0.5 | $WO_3$:1.0 | — |
| B-39 | 23.0 | 31.0 | 44.0 | — | $Y_2O_3$:0.5, $La_2O_3$:0.5 | $WO_3$:1.0 | — |
| B-40 | 23.0 | 29.0 | 44.0 | — | $La_2O_3$:0.5, $Al_2O_3$:0.5 | $WO_3$:3.0 | — |
| B-41 | 20.0 | 38.0 | 36.0 | — | $La_2O_3$:0.3 | BaO:5.0, $WO_3$:0.7 | — |
| B-42 | 26.0 | 30.0 | 15.0 | 15.0 | $Al_2O_3$:1.0, $Fe_2O_3$:3.0 | MgO:10.0 | — |
| B-43 | 24.0 | 34.5 | 16.0 | 15.0 | $La_2O_3$:1.0, $Al_2O_3$:1.0, $Fe_2O_3$:1.0 | MgO:7.5 | — |
| B-44 | 23.0 | 32.0 | 16.0 | 16.0 | $La_2O_3$:0.5, $Al_2O_3$:0.5, $Fe_2O_3$:1.0 | MgO:8.0, $WO_3$:3.0 | — |
| B-45 | 24.0 | 30.0 | 17.0 | 17.0 | $La_2O_3$:0.5, $Al_2O_3$:0.5, $Fe_2O_3$:1.0 | MgO:8.0, WO3:2.0 | — |
| B-46 | 22.0 | 33.0 | 15.0 | 15.0 | $Al_2O_3$:1.0, $Fe_2O_3$:1.0 | MgO:5.0, $WO_3$:5.0 | ZnO:3.0 |

As the starting materials of the main components, powders of $V_2O_5$ and $TeO_2$ made by Shinko Chemicals Co., Ltd., $Ag_2O$ made by Tanaka Kikai Kogyo Co., Ltd., and $Li_2CO_3$ made by High Purity Chemicals Laboratories Co., Ltd. were used.

Further, as the starting materials of the sub-components, powders of $Y_2O_3$, $La_2O_3$, $CeO_2$, $Er_2O_3$, $Yb_2O_3$, $Al_2O_3$ and $Fe_2O_3$ were used. All of these are manufactured by High Purity Chemical Research Laboratory Co., Ltd.

Further, as the starting materials of the additional components, powders of MgO, $CaCO_3$, $SrCO_3$, $BaCO_3$, $WO_3$ and $MoO_3$ were used. All of these are manufactured by High Purity Chemical Laboratories, Inc.

Further, in the lead-free glass compositions of the Comparative Examples, $P_2O_5$, $Na_2O$, $K_2O$, ZnO and $ZrO_2$ were used as the other components in the lead-free glass compositions, and powders of $P_2O_5$ made by Rasa Kogyo Co., Ltd. and $Na_2CO_3$, $K_2CO_3$, ZnO and $ZrO_2$ made by High Purity Chemical Laboratory, Ltd. were used as the starting materials for the lead-free glass compositions.

The starting material powders were respectively weighed so as to be about 200 g in total, combined, mixed, and charged into a quartz glass crucible. The quartz glass crucible into which the raw material mixed powder was charged was placed in a glass melting furnace, heated to 700 to 750° C. at a temperature rising rate of about 10° C./min, and held for 1 hour while stirring with an alumina rod in order to homogenize the composition of the melt in the quartz glass crucible. Thereafter, the quartz-glass crucible was taken out of the glass melting furnace, and a melt was poured into a stainless-steel mold to produce A-01 to A-51 of the Examples and B-01 to B-46 of the Comparative Examples, respectively. Next, the prepared lead-free glass composition was ground to 45 μm under.

(Evaluation of Vitrified State)

The glassy states of the produced lead-free glass compositions A-01 to A-51 and B-01 to B-46 were evaluated by whether sharp diffraction peaks due to precipitation crystals were observed by X-ray diffraction using the glass powder.

When the X-ray diffraction peak was not observed, that is, when the precipitation of the crystal was not observed, it was determined that the crystal was in the vitrified state, and it was evaluated as "pass". On the other hand, when the X-ray diffraction peak is observed, i.e., when the precipitation of crystals is observed, since the vitrified state is not a uniform amorphous state, it was evaluated as "fail".

(Evaluation of Characteristic Temperature)

The characteristic temperatures of the prepared lead-free glass compositions A-01 to A-51 and B-01 to B-46 were evaluated by the DTA using the glass powders.

A macrocell type was used for the DTA. Approximately 500 mg of glass powder was put into the macrocell, heated from room temperature to 320° C. at a temperature rising rate of 5° C./min in air, to obtain a DTA curve as shown in FIG. 1. Transition point $T_g$, yield point $M_g$, softening point $T_s$, crystallization temperature $T_{cry}$ and crystallization peak temperature $T_{cry-p}$ were measured from the obtained DTA curve. The calorific value (µV) of the crystallization peak was also measured. The temperature difference between $T_{cry}$ and $T_s$ (hereinafter also referred to as "$T_{cry}$-$T_s$") was calculated from the measured temperature difference. However, in evaluating the characteristic temperature, with respect to the lead-free glass composition having a vitrified state of "fail", DTA was not carried out because it is unsuitable for sealing or bonding. Here, the calorific value of the crystallization peaks is also referred to as "$T_{cry-p}$ calorific value".

(Evaluation of Softening Fluidity and Adhesiveness)

Softening fluidity and adhesiveness of the prepared lead-free glass composition A-01 to A-51 and B-01 to B-46 was evaluated in button flow test of a molded powder compact produced using the glass powder.

The molded powder compact was formed into a cylindrical shape having a diameter of about 12 mm and a height of about 3 mm under a condition of 500 kg/cm² by using a die and a hand press. Then, the molded powder compact was placed on a soda lime glass plate, introduced into an electric furnace, heated from room temperature to a temperature 20 to 30° C. higher than the softening point $T_s$ at a temperature rising rate of 10° C./min in the air, and held for 30 minutes. Thereafter, the furnace was cooled, and the softening fluidity, the adhesive property and the crystallization state were evaluated.

With respect to the softening fluidity, it was judged as "pass" when it was clear that a sample of the molded powder compact was not merely deformed but flowed into a liquid state and then solidified in a glossy state. On the other hand, when devitrification (surface crystallization) occurred even when the softening flow occurred, or when the softening flow was insufficient due to the crystallization, it was judged as "fail".

Regarding the adhesiveness, it was judged as "pass" when the molded powder compact softened and flowed and adhered to the soda lime glass substrate, and "fail" when the molded powder compact easily peeled from the soda lime glass substrate even though the molded powder compact softened and flowed, or when the molded powder compact insufficiently softened and flowed by crystallization and peeled easily from the soda lime glass substrate.

Incidentally, when the same button flow test of the conventional leaded low-melting glass composition (84PbO-13B₂O₃-2SiO₂-1Al₂O₃ mass %) having the transition point $T_g$ of 313° C., the yielding point $M_g$ of 332° C. and softening point $T_s$ of 386° C. was carried out at 430° C., both the softening fluidity and the adhesiveness was "pass". However, the occurrence of cracks was recognized by a large difference in thermal expansion between the soda lime glass substrate and the leaded low-melting glass composition. The occurrence of this crack can be prevented by mixing the low thermal expansion filler particles into the powder of the leaded low-melting glass composition.

In evaluating the softening fluidity and adhesiveness, as for the lead-free glass composition having a vitrified state of "fail" and the lead-free glass composition having an unclear softening point $T_s$ due to crystallization, the above button flow test was not performed because it is unsuitable for sealing or bonding. In addition, the above-mentioned button flow test was not carried out as for the lead-free glass composition having the softening point $T_s$ exceeding 250° C. because the lead-free glass composition is not suitable for sealing or adhering in the vicinity of the melting point (232° C.) of the metal tin which is a target.

(Assessment of Chemical Stability)

The chemical stabilities of the prepared lead-free glass compositions A-01 to A-51 and B-01 to B-46 were evaluated by a moisture resistance test and an acid resistance test.

A cullet of about 10 to 20 mm before pulverization was used for glass test pieces. In the moisture resistance test, the cullet was left at a temperature of 80° C. and a humidity of 90% for 7 days. In addition, in the acid resistance test, the cullet was immersed in an aqueous solution of nitric acid aqueous solution with 1 normal at room temperature for 3 days.

The appearance of the cullet after both tests was visually observed. If there was no change in the appearance, it was regarded as "pass", and if there was a change, it was regarded as "fail".

Incidentally, the conventional leaded low-melting glass composition (84PbO-13B₂O₃-2SiO₂-1Al₂O₃ mass %) having the transition point $T_g$ of 313° C., the yield point $M_g$ of 332° C., the softening point $T_s$ of 386° C. was performed the same moisture resistance test and acid resistance test. As a result, it was "fail" in both of the tests.

In evaluating the chemical stability, the lead-free glass composition having the vitrified state of "fail" and the lead-free glass composition having an unclear softening point due to crystallization are unsuitable for sealing or bonding. Therefore, the above moisture resistance test and the acid resistance test were not performed. In addition, even with respect to the lead-free glass composition having a softening point $T_s$ of more than 250° C., since it is not suitable for sealing, adhesion or the like in the vicinity of the melting point (232° C.) of the target metal tin, the above moisture resistance test and the acid resistance test were not performed.

Table 3 shows a vitrified state, a characteristic temperature and the like of A-01 to A-51 of the Examples.

Table 4 shows a vitrified state, a characteristic temperature and the like of B-01 to B-46 of the Comparative Examples.

These tables show $T_{cry-p}$ calorific value.

TABLE 3

| | | Characteristic temperature (° C.) | | | | | | |
|---|---|---|---|---|---|---|---|---|
| Glass No. | Vitrified state | Transition point $T_g$ | Yield point $M_g$ | Softening point $T_s$ | Crystallisation temperature $T_{cry}$ | $T_{cry}$ − $T_s$ | Crystallization peak temperature $T_{cry-p}$ | $T_{cry-p}$ calorific value (µV) |
| A-01 | pass | 159 | 174 | 209 | 275 | 66 | 298 | 21 |
| A-02 | pass | 143 | 161 | 195 | 268 | 73 | 283 | 29 |
| A-03 | pass | 155 | 176 | 203 | 274 | 71 | 291 | 15 |
| A-04 | pass | 146 | 159 | 196 | 256 | 60 | 278 | 13 |
| A-05 | pass | 150 | 164 | 200 | 264 | 64 | 286 | 10 |
| A-06 | pass | 153 | 168 | 205 | 270 | 65 | 295 | 7 |
| A-07 | pass | 150 | 164 | 204 | 283 | 79 | >320 | — |

TABLE 3-continued

| | | Characteristic temperature (° C.) | | | | | |
|---|---|---|---|---|---|---|---|
| Glass No. | Vitrified state | Transition point $T_g$ | Yield point $M_g$ | Softening point $T_s$ | Crystallisation temperature $T_{cry}$ | $T_{cry} - T_s$ | Crystallization peak temperature $T_{cry\text{-}p}$ | $T_{cry\text{-}p}$ calorific value ($\mu$V) |
| A-08 | pass | 160 | 172 | 205 | 294 | 89 | >320 | — |
| A-09 | pass | 158 | 170 | 201 | 299 | 98 | >320 | — |
| A-10 | pass | 159 | 171 | 203 | 298 | 95 | >320 | — |
| A-11 | pass | 156 | 174 | 208 | 290 | 82 | >320 | — |
| A-12 | pass | 157 | 173 | 205 | 293 | 88 | >320 | — |
| A-13 | pass | 172 | 185 | 220 | >320 | >100 | >320 | — |
| A-14 | pass | 165 | 175 | 211 | 299 | 88 | >320 | — |
| A-15 | pass | 148 | 166 | 199 | >320 | >121 | >320 | — |
| A-16 | pass | 149 | 166 | 200 | >320 | >120 | >320 | — |
| A-17 | pass | 150 | 166 | 201 | >320 | >119 | >320 | — |
| A-18 | pass | 154 | 170 | 206 | >320 | >114 | >320 | — |
| A-19 | pass | 155 | 172 | 211 | >320 | >114 | >320 | — |
| A-20 | pass | 159 | 174 | 214 | >320 | >106 | >320 | — |
| A-21 | pass | 152 | 169 | 211 | >320 | >109 | >320 | — |
| A-22 | pass | 166 | 181 | 219 | >320 | >101 | >320 | — |
| A-23 | pass | 163 | 181 | 216 | 317 | 101 | >320 | — |
| A-24 | pass | 151 | 168 | 207 | 277 | 70 | 300 | 13 |
| A-25 | pass | 157 | 176 | 212 | 295 | 83 | >320 | — |
| A-26 | pass | 153 | 174 | 210 | 299 | 89 | >320 | — |
| A-27 | pass | 155 | 172 | 208 | 298 | 90 | >320 | — |
| A-28 | pass | 157 | 175 | 208 | >320 | >112 | >320 | — |
| A-29 | pass | 164 | 178 | 213 | 315 | 102 | >320 | — |
| A-30 | pass | 159 | 173 | 207 | 307 | 100 | >320 | — |
| A-31 | pass | 154 | 171 | 205 | 298 | 93 | >320 | — |
| A-32 | pass | 151 | 169 | 204 | 302 | 98 | >320 | — |
| A-33 | pass | 152 | 170 | 206 | >320 | >114 | >320 | — |
| A-34 | pass | 154 | 172 | 206 | 303 | 97 | >320 | — |
| A-35 | pass | 150 | 166 | 203 | 271 | 68 | 296 | 4 |
| A-36 | pass | 164 | 182 | 218 | >320 | >102 | >320 | — |
| A-37 | pass | 148 | 160 | 196 | 295 | 99 | >320 | — |
| A-38 | pass | 157 | 174 | 206 | >320 | >114 | >320 | — |
| A-39 | pass | 170 | 187 | 220 | >320 | >100 | >320 | — |
| A-40 | pass | 162 | 182 | 217 | >320 | >103 | >320 | — |
| A-41 | pass | 167 | 184 | 219 | 317 | 87 | >320 | — |
| A-42 | pass | 150 | 167 | 201 | >320 | >119 | >320 | — |
| A-43 | pass | 156 | 172 | 207 | >320 | >113 | >320 | — |
| A-44 | pass | 148 | 165 | 198 | >320 | >122 | >320 | — |
| A-45 | pass | 150 | 167 | 202 | >320 | >118 | >320 | — |
| A-46 | pass | 148 | 163 | 195 | >320 | >125 | >320 | — |
| A-47 | pass | 164 | 185 | 220 | >320 | >100 | >320 | — |
| A-48 | pass | 160 | 172 | 215 | >320 | >105 | >320 | — |
| A-49 | pass | 168 | 178 | 210 | >320 | >110 | >320 | — |
| A-50 | pass | 163 | 178 | 218 | >320 | >102 | >320 | — |
| A-51 | pass | 149 | 163 | 203 | >320 | >117 | >320 | — |

TABLE 4

| | | Characteristic temperature (° C.) | | | | | |
|---|---|---|---|---|---|---|---|
| Glass No. | Vitrified state | Transition point $T_g$ | Yield point $M_g$ | Softening point $T_s$ | Crystallisation temperature $T_{cry}$ | $T_{cry} - T_s$ | Crystallization peak temperature $T_{cry\text{-}p}$ | $T_{cry\text{-}p}$ calorific value ($\mu$V) |
| B-01 | pass | 135 | 145 | — | 183 | 0 | 196 | 60 |
| B-02 | pass | 146 | 157 | 191 | 206 | 15 | 217 | 23 |
| B-03 | pass | 157 | 169 | 204 | 239 | 25 | 267 | 187 |
| B-04 | fail | — | — | — | — | — | — | — |
| B-05 | pass | 156 | 170 | 204 | 247 | 33 | 273 | 152 |
| B-06 | pass | 173 | 185 | 218 | 265 | 45 | 289 | 124 |
| B-07 | pass | 188 | 199 | 234 | 289 | 55 | 307 | 83 |
| B-08 | pass | 148 | 160 | 191 | 209 | 18 | 225 | 7 |
| B-09 | pass | 149 | 161 | 193 | 208 | 15 | 220 | 8 |
| B-10 | pass | 152 | 166 | 202 | 250 | 48 | 260 | 15 |
| B-11 | pass | 153 | 164 | 197 | 208 | 11 | 231 | 13 |
| B-12 | pass | 157 | 172 | 205 | 243 | 38 | 259 | 5 |
| B-13 | pass | 162 | 177 | 218 | 273 | 55 | 307 | 3 |
| B-14 | pass | 150 | 161 | 195 | 212 | 17 | 226 | 7 |
| B-15 | pass | 164 | 178 | 213 | 279 | 66 | 303 | 18 |
| B-16 | pass | 211 | 231 | 268 | >320 | — | >320 | — |
| B-17 | pass | 151 | 162 | 194 | 211 | 17 | 224 | 13 |

TABLE 4-continued

| | | Characteristic temperature (° C.) | | | | | | |
|---|---|---|---|---|---|---|---|---|
| Glass No. | Vitrified state | Transition point $T_g$ | Yield point $M_g$ | Softening point $T_s$ | Crystallisation temperature $T_{cry}$ | $T_{cry} - T_s$ | Crystallization peak temperature $T_{cry-p}$ | $T_{cry-p}$ calorific value (μV) |
| B-18 | pass | 163 | 181 | 216 | 281 | 65 | 298 | 59 |
| B-19 | pass | 148 | 159 | 190 | 210 | 20 | 223 | 13 |
| B-20 | pass | 155 | 172 | 208 | 249 | 41 | 270 | 15 |
| B-21 | pass | 185 | 218 | 254 | >320 | — | >320 | — |
| B-22 | pass | 167 | 182 | 216 | 273 | 57 | 291 | 17 |
| B-23 | pass | 147 | 159 | 192 | 208 | 16 | 221 | 11 |
| B-24 | pass | 165 | 185 | 218 | 277 | 59 | 305 | 85 |
| B-25 | fail | — | — | — | — | — | — | — |
| B-26 | fail | — | — | — | — | — | — | — |
| B-27 | pass | 156 | 172 | — | 222 | 0 | 242 | 10 |
| B-28 | pass | 164 | 182 | 216 | 232 | 16 | 255 | 13 |
| B-29 | pass | 153 | 169 | 206 | 250 | 44 | 268 | 12 |
| B-30 | pass | 170 | 186 | 224 | 311 | 87 | >320 | — |
| B-31 | pass | 167 | 184 | 220 | 306 | 86 | >320 | — |
| B-32 | pass | 171 | 188 | 221 | >320 | — | >320 | — |
| B-33 | pass | 169 | 188 | 226 | 291 | 65 | >320 | — |
| B-34 | pass | 169 | 187 | 225 | 317 | 92 | >320 | — |
| B-35 | pass | 157 | 169 | 203 | 261 | 58 | 288 | 20 |
| B-36 | pass | 153 | 166 | 198 | 230 | 32 | 247 | 9 |
| B-37 | pass | 158 | 172 | 205 | 225 | 20 | 247 | 6 |
| B-38 | pass | 148 | 161 | 190 | 245 | 55 | 272 | 8 |
| B-39 | pass | 147 | 158 | 193 | 256 | 63 | 278 | 5 |
| B-40 | pass | 163 | 174 | 210 | 294 | 84 | >320 | — |
| B-41 | pass | 168 | 189 | 220 | 311 | 91 | >320 | — |
| B-42 | pass | 229 | 251 | 296 | >320 | — | >320 | — |
| B-43 | pass | 217 | 240 | 285 | >320 | — | >320 | — |
| B-44 | pass | 213 | 235 | 278 | >320 | — | >320 | — |
| B-45 | pass | 208 | 229 | 272 | >320 | — | >320 | — |
| B-46 | pass | 218 | 239 | 285 | >320 | — | >320 | — |

First, a B-01 to B-46 of the Comparative Examples shown in Table 4 will be described.

Precipitates of B-04, B-25 and B-26 were also observed visually at the time of making glasses. In the X-ray diffraction, the diffraction peak was also observed, and the precipitation of the crystal was recognized. From the results, the vitrified states of B-04, B-25 and B-26 were judged as "fail". In the lead-free glass composition of the other Comparative Examples, such a phenomenon was not observed, and it was considered that the glass composition had a uniform amorphous state, and the vitrified state thereof was determined to be "pass".

With respect to the lead-free glass composition of the Comparative Examples in which the vitrified state was "passed", the characteristic temperature was measured by the DTA. Since the crystallization tendency of B-01 and B-27 was remarkable, the softening point $T_s$ could not be observed due to exothermic peaks due to crystallization. This is a result which suggested that the desired softening fluidity cannot be obtained by crystallization. Therefore, for these, the button flow test, the moisture resistance test and the acid resistance test thereafter were not performed.

On the other hand, B-16, B-21 and B-42 to B-46 had a very high crystallization temperature $T_{cry}$ of more than 320° C. and a high softening temperature $T_s$ of more than 250° C. and could not be used as an intended lead-free glass composition. Therefore, the subsequent button flow test, moisture resistance test and acid resistance test were not performed on these.

The softening point $T_s$ of B-02, B-03, B-05, B-08, B-09, B-11, B-14, B-17, B-19, B-23, B-28, B-36 and B-37 was observed at a low temperature of 220° C. or low. But its $T_{cry}$-$T_s$ is 33° C. or less, and thus it is easy to crystalize. In other words, it can be said that a lead-free glass composition in which a desired softening fluidity is hardly obtained.

For B-06, B-07, B-10, B-12, B-13, B-15, B-18, B-20, B-22, B-24, B-29 to B-35 and B-38 to B-41, although these lead-free glassy compositions have the softening point $T_s$ slightly above 220° C., the softening point $T_s$ is low, the crystallization temperature $T_{cry}$ is high, and $T_{cry}$-$T_s$ is as large as 38 to 91° C. For this reason, a desired softening fluidity is obtained for these. Therefore, it is easy to apply to sealing, adhesion and the like. In particular, for B-15, B-18, B-31 and B-39 to B-41, the softening point $T_s$ is as low as 220° C. or low, and $T_{cry}$-$T_s$ is as large as 60° C. or more. Therefore, a desired softening fluidity can be obtained in the vicinity of the melting point (232° C.) of the metal tin (Sn). Therefore, it is considered that these have effective characteristics for a low-temperature sealing and a low-temperature adhesion and the like.

The button flow tests, the moisture resistance tests and the acid resistance tests were carried out on B-02, B-03, B-05 to B-15, B-17 to B-20, B-22 to B-24 and B-28 to B-41 selected from the results of the vitrified states and the characteristic temperatures.

Table 5 shows the results of the button flow test, the moisture resistance test and the acid resistance test for the Comparative Examples.

TABLE 5

| | Button flow test | | Chemical stability | |
|---|---|---|---|---|
| Glass No. | Softening fluidity | Adhesiveness | Moisture resistance | Acid resistance |
| B-01 | — | — | — | — |
| B-02 | fail | fail | pass | pass |
| B-03 | fail | fail | pass | pass |
| B-04 | — | — | — | — |
| B-05 | fail | fail | pass | pass |

TABLE 5-continued

| Glass No. | Button flow test | | Chemical stability | |
|---|---|---|---|---|
| | Softening fluidity | Adhesiveness | Moisture resistance | Acid resistance |
| B-06 | pass | fail | pass | pass |
| B-07 | pass | fail | pass | pass |
| B-08 | fail | fail | pass | pass |
| B-09 | fail | fail | pass | pass |
| B-10 | pass | fail | pass | pass |
| B-11 | fail | fail | pass | pass |
| B-12 | pass | fail | pass | pass |
| B-13 | pass | fail | pass | pass |
| B-14 | fail | fail | pass | pass |
| B-15 | pass | fail | pass | pass |
| B-16 | — | — | — | — |
| B-17 | fail | fail | pass | pass |
| B-18 | pass | fail | pass | pass |
| B-19 | fail | fail | pass | pass |
| B-20 | pass | fail | pass | pass |
| B-21 | — | — | — | — |
| B-22 | pass | fail | pass | pass |
| B-23 | fail | fail | pass | pass |
| B-24 | pass | fail | pass | pass |
| B-25 | — | — | — | — |
| B-26 | — | — | — | — |
| B-27 | — | — | — | — |
| B-28 | fail | fail | pass | pass |
| B-29 | pass | fail | pass | pass |
| B-30 | pass | fail | pass | pass |
| B-31 | pass | fail | pass | pass |
| B-32 | pass | fail | pass | pass |
| B-33 | pass | fail | pass | pass |
| B-34 | pass | fail | pass | pass |
| B-35 | pass | fail | pass | pass |
| B-36 | fail | fail | pass | pass |
| B-37 | fail | fail | pass | pass |
| B-38 | pass | fail | pass | pass |
| B-39 | pass | fail | pass | pass |
| B-40 | pass | fail | pass | pass |
| B-41 | pass | fail | pass | pass |
| B-42 | — | — | — | — |
| B-43 | — | — | — | — |
| B-44 | — | — | — | — |
| B-45 | — | — | — | — |
| B-46 | — | — | — | — |

As shown in this table, in any of the Comparative Examples in which the above tests are performed, the moisture resistance and the acid resistance are "pass" Therefore, the chemical stability is sufficiently high.

Regarding B-02, B-03, B-05, B-08, B-09, B-11, B-14, B-17, B-19, B-23, B-28, B-36 and B-37 in which $T_{cry}$-$T_s$ is small, the crystallization progressed in the button flow test, the desired softening fluidity could not be obtained. Thus, the evaluation of the softening fluidity was judged to be "fail". Further, since the desired softening fluidity could not be obtained, it was easily peeled off from the soda lime glass substrate. For these reasons, the adhesiveness was judged to be "fail".

Further, since B-06, B-07, B-10, B-12, B-13, B-15, B-18, B-20, B-22, B-24, B-29 to B-35 and B-38 to B-41 having a large $T_{cry}$-$T_s$ have the desired softening flexibility in the button-flow test, it was judged to be "pass".

In particular, B-15, B-18, B-31 and B-39 to B-41, the softening point $T_s$ is as low as 220° C. or low, and $T_{cry}$-$T_s$ is as large as 60° C. or more. Therefore, these can be said to have particularly excellent softening fluidity among the Comparative Examples having a desired softening fluidity. However, for these, it has been found that it is easily peeled off from the soda lime glass substrate, despite having a desired softening fluidity. The button flow test was carried out in the same way by changing the substrate to an alumina ($Al_2O_3$) substrate, a borosilicate ($SiO_2$—$B_2O_3$ based) glass substrate, and a silicon substrate, but the result was the same as that of the soda lime glass substrate.

Therefore, it can be seen that the lead-free glass composition of the Comparative Examples has insufficient adhesiveness and stickiness to various substrates even if it has a desired softening fluidity.

Next, A-01 to A-51 of the Examples will be described.

Table 6 shows the results of button flow test, moisture resistance test and acid resistance test for the Examples.

TABLE 6

| Glass No. | Button flow test | | Chemical stability | |
|---|---|---|---|---|
| | Softening fluidity | Adhesiveness | Moisture resistance | Acid resistance |
| A-01 | pass | pass | pass | pass |
| A-02 | pass | pass | pass | pass |
| A-03 | pass | pass | pass | pass |
| A-04 | pass | pass | pass | pass |
| A-05 | pass | pass | pass | pass |
| A-06 | pass | pass | pass | pass |
| A-07 | pass | pass | pass | pass |
| A-08 | pass | pass | pass | pass |
| A-09 | pass | pass | pass | pass |
| A-10 | pass | pass | pass | pass |
| A-11 | pass | pass | pass | pass |
| A-12 | pass | pass | pass | pass |
| A-13 | pass | pass | pass | pass |
| A-14 | pass | pass | pass | pass |
| A-15 | pass | pass | pass | pass |
| A-16 | pass | pass | pass | pass |
| A-17 | pass | pass | pass | pass |
| A-18 | pass | pass | pass | pass |
| A-19 | pass | pass | pass | pass |
| A-20 | pass | pass | pass | pass |
| A-21 | pass | pass | pass | pass |
| A-22 | pass | pass | pass | pass |
| A-23 | pass | pass | pass | pass |
| A-24 | pass | pass | pass | pass |
| A-25 | pass | pass | pass | pass |
| A-26 | pass | pass | pass | pass |
| A-27 | pass | pass | pass | pass |
| A-28 | pass | pass | pass | pass |
| A-29 | pass | pass | pass | pass |
| A-30 | pass | pass | pass | pass |
| A-31 | pass | pass | pass | pass |
| A-32 | pass | pass | pass | pass |
| A-33 | pass | pass | pass | pass |
| A-34 | pass | pass | pass | pass |
| A-35 | pass | pass | pass | pass |
| A-36 | pass | pass | pass | pass |
| A-37 | pass | pass | pass | pass |
| A-38 | pass | pass | pass | pass |
| A-39 | pass | pass | pass | pass |
| A-40 | pass | pass | pass | pass |
| A-41 | pass | pass | pass | pass |
| A-42 | pass | pass | pass | pass |
| A-43 | pass | pass | pass | pass |
| A-44 | pass | pass | pass | pass |
| A-45 | pass | pass | pass | pass |
| A-46 | pass | pass | pass | pass |
| A-47 | pass | pass | pass | pass |
| A-48 | pass | pass | pass | pass |
| A-49 | pass | pass | pass | pass |
| A-50 | pass | pass | pass | pass |
| A-51 | pass | pass | pass | pass |

As shown in the table, all A-01 to A-51 were stable, uniform glasses without problems, and their vitrified state was judged to be "pass".

Further, the softening point $T_s$ by DTA is 220° C. or low, the crystallization temperature $T_{cry}$ is 260° C. or high, $T_{cry}$-$T_s$ is 60° C. or more. This suggests a desired softening fluidity near the melting point (232° C.) of metal tin (Sn).

Furthermore, unlike tin solder, there is an advantage that the firing atmosphere is not limited.

In addition, it is considered that it is possible to adhere to various materials such as ceramics, glass, metal, semiconductor, and heat-resistant resin. In particular, A-13, A-15 to A-22, A-28, A-33, A-36, A-38 to A-40 and A-42 to A-51 have crystallization temperatures $T_{cry}$ higher than 320° C. and have $T_{cry}$-$T_s$ more than 100° C. Therefore, it is possible to obtain excellent softening fluidity without the influence of high viscosity due to crystallization. This is a property suitable for application to low-temperature sealing, adhesion and the like.

When the results of DTA were confirmed with the softening fluidity of the button flow test, it was confirmed that the desired softening fluidity had in all of the Examples. In particular, A-13, A-15 to A-22, A-28, A-33, A-36, A-38 to A-40 and A-42 to A-51 having the high crystallization temperatures $T_{cry}$ and the high $T_{cry}$-$T_s$ exhibited the excellent softening fluidity.

From this, the softening fluidity in all of A-01 to 51 of the Examples were judged to be "pass".

As for the adhesiveness of A-01 to 51 of the Examples, all of them were judged to be "pass" because they were firmly adhered to and sticked to the soda lime glass substrates. However, in the lead-free glass compositions of the Examples, the thermal expansion coefficient was larger than that of the soda lime glass substrate, and therefore, cracks were observed in at least one of them. This cracking can countermeasure by mixing low thermal expansion filler particles with the powder of the lead-free glass composition.

The button flow tests were carried out similarly by changing the substrate to the alumina ($Al_2O_3$) substrate, the borosilicate ($SiO_2$—$B_2O_3$ based) glass substrate, and the silicon (Si) substrate in A-13, A-15 to A-22, A-28, A-33, A-36, A-38 to A-40 and A-42 to A-51 having a high crystallization temperature $T_{cry}$ and a high $T_{cry}$-$T_s$, and it was found that excellent softening fluidity was exhibited on any of the substrates. Furthermore, on any of the substrates, it was possible to confirm the same adhesiveness and stickiness as those of the soda lime glass substrate.

With respect to adhesiveness and stickiness, it was greatly different from the Comparative Examples. This factor is considered to be due to the content of $Li_2O$. It is considered in the Examples that it has a layered glass structure consisting of a $V_2O_5$ and a $TeO_2$ and there is a $Li^+$ between the layers. it is considered that it is easy to move in the interlayer when heating, and is easy to diffuse into various substrates when sealing or bonding since the ion radii of $Li^+$ are small.

For A-01 to A-51 of the Examples, the moisture resistance and the acid resistance are all "pass." Therefore, they have the same high chemical stability as in the Comparative Examples.

In the following Examples, a glass composite material and a glass paste containing a lead-free glass composition, and a sealing structure, an electrical and electronic part, and a coated part to which the glass composite material and the glass paste are applied will be described in detail using representative examples.

Example 2

In Example 2, metal base materials, glass base materials, ceramic base materials and semiconducting base materials of the same kind were respectively bonded together by using glass composite materials containing lead-free glass compositions having a softening point $T_s$ of 220° C. or low and low thermal expansion filler particles. And their bonded states were evaluated by a shear stress.

As the lead-free glass compositions, three types of the Examples A-20 and A-44 shown in Table 1 and the Comparative Example B-13 shown in Table 2, and seven types (C-01 to C-07) shown in Table 7 were used as the low thermal expansion filler particles.

Table 7 shows a composition, density and coefficient of thermal expansion of the low thermal expansion filler particles.

As shown in the table, the low thermal expansion filler particles have densities ranging from 2.2 to 4.6 $g/cm^3$ and coefficients of thermal expansion ranging from $-60 \times 10^{-7}$ to $28 \times 10^{-7}/°$ C.

TABLE 7

| | | Density and Thermal Expansion Coefficient of Ceramic Particles Used for Examination | |
|---|---|---|---|
| No. | Ceramics particle | Density $(g/cm^3)$ | Coefficient of thermal expansion $(\times 10^{-7}/°$ C.$)$ |
| C-01 | Zirconium tungstate phosphate ($Zr_2(WO_4)(PO_4)_2$) | 3.8 | −40 |
| C-02 | Zirconium tungstate phosphate containing a small amount of iron tungstate $Zr_2(WO_4)(PO_4)_2$ containing a small amount of $FeWO_4$ | 3.8 | −38 |
| C-03 | β-eucryptite $Li_2O•Al_2O_3•2SiO_2$ | 2.4 | −60 |
| C-04 | Cordierite $2MgO•2Al_2O_3•5SiO_2$ | 2.5 | 1 |
| C-05 | Quartz glass $SiO_2$ | 2.2 | 5 |
| C-06 | Niobium oxide $Nb_2O_5$ | 4.6 | 12 |
| C-07 | Silicon Si | 2.3 | 28 |

In contrast, the lead-free glass compositions shown in Tables 1 and 2 have the densities ranging approximately from 5 to 6 g/cm³ and the coefficients of thermal expansion ranging approximately from $165 \times 10^{-7}$ to $185 \times 10^{-7}/°$ C. Aluminum (Al), nickel (Ni), and iron (Fe) were used as the metal base material, soda lime ($SiO_2$—$Na_2O$—$CaO$ based) glass and borosilicate ($SiO_2$—$B_2O_3$ based) glass were used as the glass base material, alumina ($Al_2O_3$) was used as the ceramic base material, and silicon (Si) was used as the semiconducting base material.

Evaluation samples were first prepared glass pastes containing particles of lead-free glass composition, low thermal expansion filler particles and a solvent, which was applied to each base material, dried and temporarily fired. Thereafter, the same base material was bonded by combining and heating.

(Preparation of Glass Paste)

A powder of a lead-free glass composition, a low thermal expansion filler particle, and a solvent were combined and mixed to prepare a glass paste. A-20, A-44 and B-13 under 45 μm in particle diameter were used for the powders of the lead-free glass compositions. Zirconium tungstate phosphate (C-01), zirconium tungstate phosphate containing a small amount of iron tungstate (C-02), β-eucryptite (C-03), cordierite (C-04), quartz glass (C-05), niobium oxide (C-06) and silicon (C-07) having particle diameters of about 10 to 30 μm were used for the low thermal expansion filler particles. Either dihydroterpineol, α-terpineol and carbitol acetate were used for the solvents.

In addition, no resin binder was used in this Example. In the mixing ratio of the powder of the lead-free glass composition and the low thermal expansion filler particles, each glass paste was prepared in a range of 100% by volume or less and 30% by volume or more in the lead-free glass composition and 0% by volume or more and 70% by volume or less in the low thermal expansion filler particles. In addition, the solid content (the sum of the particles of the lead-free glass composition and the low thermal expansion filler particles) in the glass paste was set to be about 75 to 80% by mass.

(Preparation of Evaluation Samples)

Figure 2:
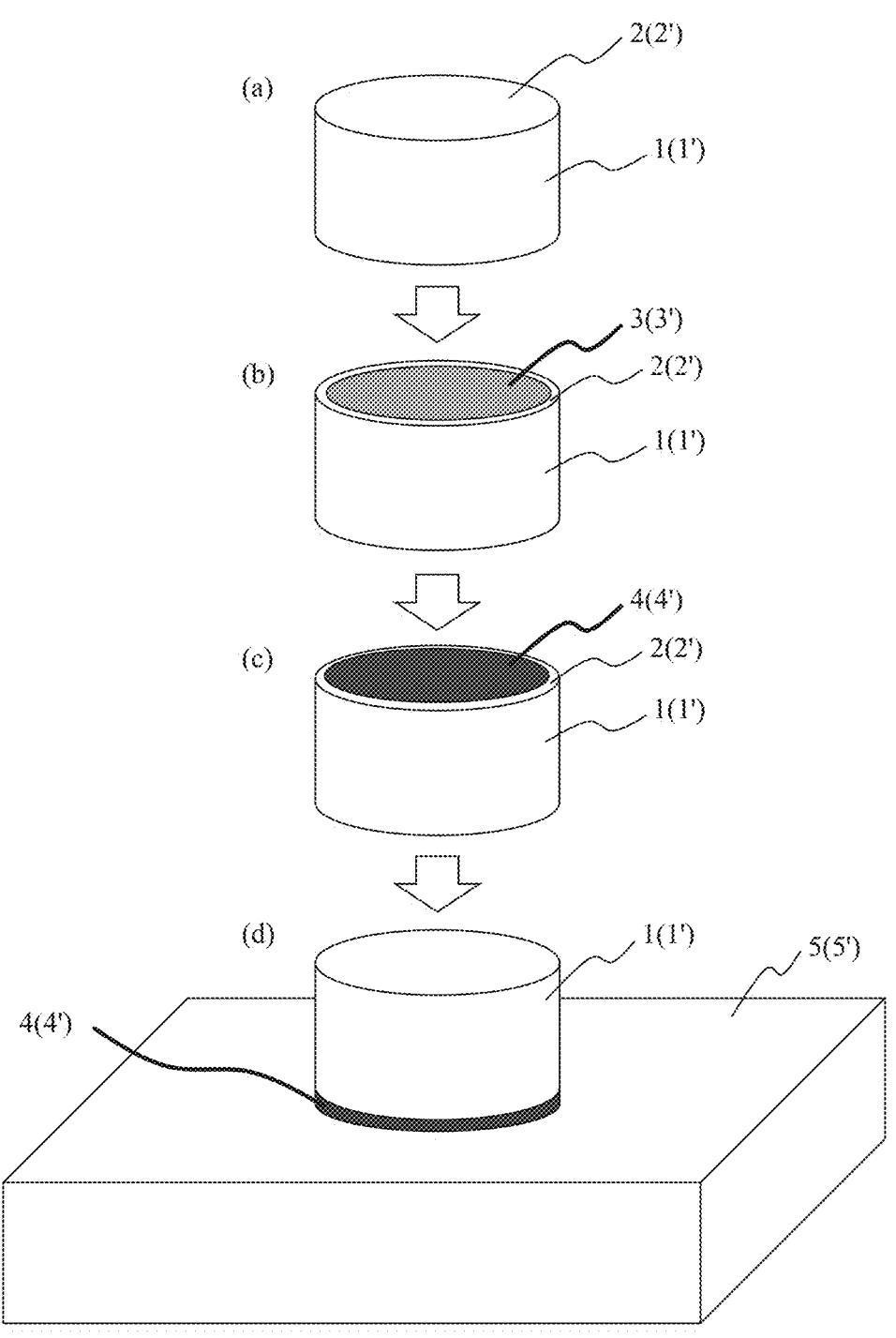
FIG. 2 is a schematic diagram showing a manufacturing method of a bonded body for measuring a shear stress.

FIG. 2 shows a method for producing an evaluation sample.

First, a cylindrical base material 1 having a diameter of 3 mm and a thickness of 2 mm and having a bonding surface 2 was prepared (a).

Next, the glass paste 3 was applied to the bonding surface 2 of the cylindrical base material 1 by a dispenser method (b).

Thereafter, it was dried at 150° C. for 30 minutes in air. The glass composite material was put into an electric furnace, heated to a temperature 20 to 30° C. higher than each softening point $T_s$ at a temperature rising rate of 10° C./min in the air, and held for 15 minutes, whereby the glass composite material 4 was formed on the bonding surface 2 of the cylindrical base material 1 (c).

This was placed on a plate-shaped base material 5 of the same kind with a thickness of 1 to 3 mm, sandwiched therebetween by a heat-resistant clip, heated to a temperature of 10 to 20° C. higher than each softening point $T_s$ at a temperature rising rate of 10° C./min in the air, and held for 30 minutes, thereby producing a bonded body (d).

The shear stress was measured using this bonded body. In consideration of the coefficient of thermal expansion of the base material, the mixing ratio of the powder of the lead-free glass composition and the low thermal expansion filler particles in the glass paste and the type of the low thermal expansion filler particles were selected. Regarding the thermal expansion coefficients of the used base material, Aluminum (Al) is $224 \times 10^{-7}/°$ C., nickel (Ni) is $133 \times 10^{-7}/°$ C., iron (Fe) is $127 \times 10^{-7}/°$ C., soda lime ($SiO_2$—$Na_2O$—$CaO$ based) glass is $88 \times 10^{-7}/°$ C., borosilicate ($SiO_2$—$B_2O_3$ based) glass is $30 \times 10^{-7}/°$ C., alumina ($Al_2O_3$) is $77 \times 10^{-7}/°$ C., silicon (Si) was $28 \times 10^{-7}/°$ C.

(Assessment of Bonded State)

The shear stresses of the bonded bodies produced using the respective glass pastes were evaluated. The assessment of the shear stresses was judged as "pass (excellent)" when it was above 30 MPa, "pass (good)" when it was 20 to 30 MPa, and "fail" when it was below 20 MPa.

Tables 8 to 14 show the evaluation results of the shear stress of the bonded body on each base material.

Table 8 is a result of a bonded body of two aluminum (Al) base materials.

Table 9 is a result of a bonded body of two nickel (Ni) base materials.

Table 10 is a result of a bonded body of two iron (Fe) base materials.

Table 11 is a result of a bonded body of two soda lime ($SiO_2$—$Na_2O$—$CaO$ based) glass base materials.

Table 12 is a result of a bonded body of two borosilicate ($SiO_2$—$B_2O_3$ based) glass.

Table 13 is a result of a bonded body of two $Al_2O_3$.

Table 14 is a result of a bonded body of two silicon (Si) base material.

TABLE 8

| Shear Stress Evaluation Results of Bonded Body of Aluminum Substrates | | | | |
|---|---|---|---|---|
| | | Mixing ratio of lead-free low-melting glass composition (volume %) | | |
| | | 100 | 90 | 80 |
| | | Percentage of low thermal expansion filler particles (volume %) | | |
| | | 0 | 10 | 20 |
| A-20 | C-05 | pass (excellent) | pass (excellent) | pass (excellent) |
| (Examples) | C-06 | pass (excellent) | pass (excellent) | pass (excellent) |
| | C-07 | pass (excellent) | pass (excellent) | pass (excellent) |
| A-44 | C-05 | pass (excellent) | pass (excellent) | pass (excellent) |
| (Examples) | C-06 | pass (excellent) | pass (excellent) | pass (excellent) |
| | C-07 | pass (excellent) | pass (excellent) | pass (excellent) |
| B-13 | C-05 | pass (excellent) | pass (excellent) | pass (excellent) |
| (Comparative | C-06 | pass (excellent) | pass (excellent) | pass (good) |
| Examples) | | | | |
| | C-07 | pass (excellent) | pass (excellent) | pass (good) |

TABLE 9

Shear Stress Evaluation Results of Bonded Body of Nickel Substrates

| | | Mixing ratio of lead-free low-melting glass composition (volume %) | | |
| | | 80 | 70 | 60 |
| | | Percentage of low thermal expansion filler particles (volume %) | | |
| | | 20 | 30 | 40 |
|---|---|---|---|---|
| A-20 | C-05 | pass (excellent) | pass (excellent) | pass (excellent) |
| (Examples) | C-06 | pass (excellent) | pass (excellent) | pass (excellent) |
| | C-07 | pass (excellent) | pass (excellent) | pass (excellent) |
| A-44 | C-05 | pass (excellent) | pass (excellent) | pass (excellent) |
| (Examples) | C-06 | pass (excellent) | pass (excellent) | pass (excellent) |
| | C-07 | pass (excellent) | pass (excellent) | pass (excellent) |
| B-13 | C-05 | pass (excellent) | pass (good) | fail |
| (Comparative | C-06 | pass (good) | pass (good) | fail |
| Examples) | | | | |
| | C-07 | pass (good) | fail | fail |

TABLE 10

Shear Stress Evaluation Results of Bonded Body between Iron Substrates

| | | Mixing ratio of lead-free low-melting glass composition (volume %) | | |
| | | 80 | 70 | 60 |
| | | Percentage of low thermal expansion filler particles (volume %) | | |
| | | 20 | 30 | 40 |
|---|---|---|---|---|
| A-20 | C-04 | pass (excellent) | pass (excellent) | pass (excellent) |
| (Examples) | C-05 | pass (excellent) | pass (excellent) | pass (excellent) |
| | C-06 | pass (excellent) | pass (excellent) | pass (excellent) |
| A-44 | C-04 | pass (excellent) | pass (excellent) | pass (excellent) |
| (Examples) | C-05 | pass (excellent) | pass (excellent) | pass (excellent) |
| | C-06 | pass (excellent) | pass (excellent) | pass (excellent) |
| B-13 | C-04 | pass (good) | fail | fail |
| (Comparative | C-05 | pass (excellent) | pass (good) | fail |
| Examples) | | | | |
| | C-06 | pass (good) | pass (good) | fail |

40

TABLE 11

Shear Stress Evaluation Results of Bonded Body of Soda lime Glass Substrates

| | | Mixing ratio of lead-free low-melting glass composition (volume %) | | | | |
| | | 70 | 60 | 50 | 40 | 30 |
| | | Percentage of low thermal expansion filler particles (volume %) | | | | |
| | | 30 | 40 | 50 | 60 | 70 |
|---|---|---|---|---|---|---|
| A-20 | C-01 | pass (good) | pass (excellent) | pass (excellent) | pass (good) | fail |
| (Examples) | C-02 | pass (good) | pass (excellent) | pass (excellent) | pass (good) | fail |
| | C-03 | pass (good) | pass (excellent) | pass (good) | pass (good) | fail |
| | C-04 | fail | pass (good) | pass (excellent) | pass (good) | fail |
| | C-05 | fail | pass (good) | pass (excellent) | pass (good) | fail |
| A-44 | C-01 | pass (good) | pass (excellent) | pass (excellent) | pass (good) | fail |
| (Examples) | C-02 | pass (good) | pass (excellent) | pass (excellent) | pass (good) | fail |
| | C-03 | pass (good) | pass (excellent) | pass (good) | pass (good) | fail |
| | C-04 | fail | pass (good) | pass (excellent) | pass (good) | fail |
| | C-05 | fail | pass (good) | pass (excellent) | pass (good) | fail |
| B-13 | C-01 | fail | pass (good) | pass (good) | fail | fail |
| (Comparative Examples) | C-02 | fail | pass (good) | pass (good) | fail | fail |
| | C-03 | fail | fail | fail | fail | fail |
| | C-04 | fail | fail | fail | fail | fail |
| | C-05 | fail | fail | pass (good) | fail | fail |

TABLE 12

Shear Stress Evaluation Results of Bonded Body of Borosilicate Glass Substrates

| | | Mixing ratio of lead-free low-melting glass composition (volume %) | | | |
| | | 45 | 40 | 35 | 30 |
| | | Percentage of low thermal expansion filler particles (volume %) | | | |
| | | 55 | 60 | 65 | 70 |
|---|---|---|---|---|---|
| A-20 | C-01 | pass (good) | pass (excellent) | pass (excellent) | fail |
| (Examples) | C-02 | pass (good) | pass (excellent) | pass (excellent) | fail |
| | C-03 | pass (good) | pass (excellent) | pass (good) | fail |
| A-44 | C-01 | pass (good) | pass (excellent) | pass (excellent) | fail |
| (Examples) | C-02 | pass (good) | pass (excellent) | pass (excellent) | fail |
| | C-03 | pass (good) | pass (excellent) | pass (good) | fail |
| B-13 | C-01 | fail | pass (good) | fail | fail |
| (Comparative Examples) | C-02 | fail | pass (good) | fail | fail |
| | C-03 | fail | fail | fail | fail |

TABLE 13

Shear Stress Evaluation Results of Bonded Body of Alumina Substrates

| | | Mixing ratio of lead-free low-melting glass composition (volume %) | | | | |
| | | 70 | 60 | 50 | 40 | 35 |
| | | Percentage of low thermal expansion filler particles (volume %) | | | | |
| | | 30 | 40 | 50 | 60 | 65 |
|---|---|---|---|---|---|---|
| A-20 | C-01 | pass (good) | pass (excellent) | pass (excellent) | pass (excellent) | pass (good) |
| (Examples) | C-02 | pass (good) | pass (excellent) | pass (excellent) | pass (excellent) | pass (good) |
| A-44 | C-01 | pass (good) | pass (excellent) | pass (excellent) | pass (excellent) | pass (good) |
| (Examples) | C-02 | pass (good) | pass (excellent) | pass (excellent) | pass (excellent) | pass (good) |
| B-13 | C-01 | fail | fail | pass (good) | pass (good) | fail |
| (Comparative Examples) | C-02 | fail | fail | pass (good) | pass (good) | fail |

TABLE 14

Shear Stress Evaluation Results of Bonded Body of Silicon Substrates

| | | Mixing ratio of lead-free low-melting glass composition (volume %) | | | |
| | | 45 | 40 | 35 | 30 |
| | | Percentage of low thermal expansion filler particles (volume %) | | | |
| | | 55 | 60 | 65 | 70 |
|---|---|---|---|---|---|
| A-20 | C-01 | pass (good) | pass (excellent) | pass (excellent) | fail |
| (Examples) | C-02 | pass (good) | pass (excellent) | pass (excellent) | fail |
| | C-03 | pass (good) | pass (excellent) | pass (good) | fail |
| A-44 | C-01 | pass (good) | pass (excellent) | pass (excellent) | fail |
| (Examples) | C-02 | pass (good) | pass (excellent) | pass (excellent) | fail |
| | C-03 | pass (good) | pass (excellent) | pass (good) | fail |
| B-13 | C-01 | fail | pass (good) | fail | fail |
| (Comparative Examples) | C-02 | fail | pass (good) | fail | fail |
| | C-03 | fail | fail | fail | fail |

As shown in Table 8, three kinds of C-05 to C-07 shown in Table 7 were used as low thermal expansion filler particles in the bonded body of two aluminum (Al) base materials, and the mixing ratio was examined in the range of 0 to 20% by volume, and the range of 100 to 80% by volume as the lead-free glass composition A-20, A-44 and the lead-free glass composition B-13.

Regardless of the Examples and the Comparative Examples, it was found that the shear stress of the bonded body "passed" under all conditions, and good adhesiveness and stickiness were obtained with respect to the aluminum (Al) base material in both the Examples and the Comparative Examples. In comparison between the Examples A-20 and A-44 and the Comparative Example B-13, the shear stresses of the bonded bodies were slightly higher in the Examples, and the adhesiveness and stickiness of the Examples were more excellent. In addition, almost no difference was observed in the shear stresses of the Examples A-20 and A-44.

As shown in Table 9, three types of C-05 to C-07 shown in Table 7 were used as low thermal expansion filler particles in the bonded body of two nickel (Ni) base materials, and the mixing ratio thereof was investigated in the range of 20 to 40% by volume, and in the range of 80 to 60% by volume as the lead-free glass composition A-20, A-44 and the lead-free glass composition B-13.

In the bonded body of the Example, it had a high shear stress under all conditions, and was "pass (excellent)". In the Examples A-20 and A-44, it was found that excellent adhesiveness and stickiness can be obtained in the nickel (Ni) base as well as in the aluminum (Al) base. In addition, almost no difference was observed in the shear stresses of the Examples A-20 and A-44. On the other hand, in Comparative Example B-13, the shear stress of the bonded body was lower than that in the Example, and the adhesiveness and stickiness were poor depending on the type of low thermal expansion filler particles or the mixing ratio thereof, resulting in "fail". It was recognized that it tends to be "fail" when the mixing ratio of the low thermal expansion filler particles is large, that is, when the mixing ratio of the lead-free glass composition is small.

As shown in Table 10, three types of C-04 to C-06 shown in Table 7 were used as low thermal expansion filler particles in the bonded body of two iron (Fe) base materials, and the mixing ratio thereof was investigated in the range of 20 to 40% by volume, and in the range of 80 to 60% by volume as the lead-free glass composition A-20, A-44 and B-13.

In the bonded body of the Example, it had a high shear stress under all conditions, and was "pass (excellent)". In the Examples A-20 and A-44, it was found that excellent adhesiveness and stickiness can be obtained in the iron (Fe) base material as well as the aluminum (Al) base material and the nickel (Ni) base material. In addition, almost no difference was observed in the shear stresses of the Examples A-20 and A-44. On the other hand, in the Comparative Example B-13, similarly to the above nickel (Ni) base material, the shear stress of the bonded body was lower than that in the Example, and the adhesiveness and stickiness were poor depending on the type of low thermal expansion filler particles or the mixing ratio thereof, resulting in "fail". It was recognized that it tends to be "fail" when the mixing ratio of the low thermal expansion filler particles is large, that is, when the mixing ratio of the lead-free glass composition is small.

As shown in Table 11, five kinds of C-01 to 05 in Table 7 were used as low thermal expansion filler particles in the bonded body of two soda lime ($SiO_2$—$Na_2O$—$CaO$ based) glass base materials, and the mixing ratio was examined in the range of 30 to 70% by volume, and the range of 70 to 30% by volume as the lead-free glass compositions A-20, A-44 and B-13.

In the bonded body of the Examples, difference between A-20 and A-44 were hardly observed in the shear stresses, and in particular, when the low thermal expansion filler particles having a low thermal expansion coefficient C-01 to C-03 were included in the range of 30 to 60% by volume and the lead-free glass composition was included in the range of 70 to 40% by volume, evaluation results of "pass (excellent)" or "pass (good)" were obtained, and it was found that excellent or good adhesiveness and stickiness were obtained.

However, when the low thermal expansion filler particles were 70% by volume, the lead-free glass composition was as small as 30% by volume, so that a good softening fluidity as a glass composite material was not obtained, and the adhesiveness and stickiness to a soda lime ($SiO_2$—$Na_2O$—$CaO$ based) glass base material became inadequate, and the evaluation result of "fail" was obtained. In any of the low thermal expansion filler particles and any of the lead-free glass compositions, when the low thermal expansion filler particles were 70% by volume and the lead-free glass composition was 30% by volume, the evaluation result of "fail" was obtained in the same manner as described above. When the low thermal expansion filler particles are C-04 and C-05, since the thermal expansion coefficient is larger than that of C-01 to C-03, even if the lead-free glass is as large as 70% by volume, that is, even if the softening fluidity as a glass composite material is good, the thermal expansion coefficient of the soda lime ($SiO_2$—$Na_2O$—$CaO$ based) glass base material cannot be matched, and the evaluation result of "fail" is obtained.

As the bonded body of the Example, in particular, it has been found that the combination with the low thermal expansion filler particles of C-01 or C-02 can obtain the best adhesiveness and stickiness. On the other hand, in the bonded body of the Comparative Example, the shear stress is lower than the bonded body of the Example, although there is an influence of the type of the low thermal expansion filler particles or the mixing ratio thereof, poor adhesiveness and stickiness, results that fail were often observed. In particular, when C-03 or C-04 is combined with low thermal expansion filler particles, all of them are evaluated as "fail" in the range of the studied mixing ratios. This is considered to have been attributed to the fact that the lead-free glass composition B-13 used in the Comparative Examples reacted with C-03 or C-04 at the time of bonding and crystallized, so that good softening fluidity was not obtained, and the adhesiveness and stickiness to the soda lime ($SiO_2$—$Na_2O$—$CaO$ based) glass base material became poor.

As shown in Table 12, in the joints between borosilicate ($SiO_2$—$B_2O_3$ based) glass base materials, three types of C-01 to 03 shown in Table 7 were used as low thermal expansion filler particles, and their mixing ratio was examined in the range of 55 to 70% by volume, and the range of 45 to 30% by volume for the lead-free glass composition A-20, A-44 and B-13.

In the bonded body of the Examples, differences between A-20 and A-44 were hardly observed in the shear stresses, and when the low thermal expansion filler particles contained 55 to 65% by volume and the lead-free glass composition contained 45 to 35% by volume, the shear stresses were evaluated as "pass (excellent)" or "pass (good)" and excellent or good adhesiveness and stickiness were obtained. In particular, it has been found that the best adhesiveness and stickiness can be obtained by combining with low thermal expansion filler particles of C-01 or C-02.

However, when the low thermal expansion filler particles were 70% by volume, similarly to the above-mentioned soda lime ($SiO_2$—$Na_2O$—$CaO$ based) glass base material, since the lead-free glass composition was as small as 30% by volume, good softening fluidity was not obtained as a glass composite material, and adhesiveness and stickiness to a borosilicate ($SiO_2$—$B_2O_3$ based) glass base material was insufficient, and the evaluation result of "fail" was obtained. On the other hand, in the bonded body of the Comparative Example, the shear stress is lower than the bonded body of the Example, although there is an influence of the type of the low thermal expansion filler particles or the mixing ratio thereof, poor adhesiveness and stickiness, results that fail were often observed. In particular, in the case of combining C-03 with the low thermal expansion filler particles, all of the soda lime ($SiO_2$—$Na_2O$—$CaO$ based) glass base materials were evaluated as "fail" in the range of the mixing ratios examined, similarly to the above-mentioned soda lime ($SiO_2$—$Na_2O$—$CaO$ based) glass base material. It is considered probable that this was caused by the fact that the lead-free glass composition B-13 used in the Comparative Examples reacted with C-03 at the time of bonding and crystallized, so that good softening fluidity was not obtained, and the adhesiveness and stickiness to the borosilicate ($SiO_2$—$B_2O_3$ based) glass base material were poor.

As shown in Table 13, two types of C-01 and C-02 in Table 7 were used as the low thermal expansion filler particles in the bonded body of two alumina ($Al_2O_3$) glass base materials, and the mixing ratio was examined in the range of 30 to 65% by volume, and in the range of 70 to 35% by volume as the lead-free glass compositions A-20, A-44 and B-13.

In the bonded body of the Example, it was found that the shear stress evaluation result of "pass (excellent)" or "pass (good)" was obtained under all conditions, and excellent or good adhesiveness and stickiness were obtained. And the difference between A-20 and A-44 was hardly recognized in the shear stresses. On the other hand, in the bonded body of the Comparative Example, the shear stress was lower than that of the bonded body of the Example, and depending on the mixing ratio of the low thermal expansion filler particles, the adhesiveness and stickiness were low, and "fail" sometimes occurred.

As shown in Table 14, three kinds of C-01 to 03 in Table 7 were used as low thermal expansion filler particles in the bonded structure of silicon (Si) base materials, and the mixing ratio was 55 to 70% by volume, and 45 to 30% by volume of lead-free glass compositions A-20, A-44 and B-13 were investigated.

In the bonded body of the Examples, differences between A-20 and A-44 were hardly observed in the shear stresses, and when the low thermal expansion filler particles contained 55 to 65% by volume and the lead-free glass composition contained 45 to 35% by volume, the shear stresses were evaluated as "pass (excellent)" or "pass (good)" and excellent or good adhesiveness and stickiness were obtained. In particular, it has been found that the best adhesiveness and stickiness can be obtained by combining with low thermal expansion filler particles of C-01 or C-02.

However, when the low thermal expansion filler particles were 70% by volume, the lead-free glass composition was as small as 30% by volume similar to the above-mentioned soda lime ($SiO_2$—$Na_2O$—$CaO$ based) glass base material and borosilicate ($SiO_2$—$B_2O_3$ based) glass base material, so that good softening fluidity was not obtained as a glass composite material, and adhesiveness and stickiness to a silicon (Si) base material was insufficient, and the evaluation result of "fail" was obtained.

On the other hand, in the bonded body of the Comparative Example, the shear stress is lower than the bonded body of the Example, although there is an influence of the type of the low thermal expansion filler particles or the mixing ratio thereof, poor adhesiveness and stickiness, results that fail were often observed. In particular, in combination with the low thermal expansion filler particles of C-03, similarly to the soda lime ($SiO_2$—$Na_2O$—$CaO$ based) glass base material and the glass base material and borosilicate ($SiO_2$—$B_2O_3$ based) glass base material, all in the range of mixing ratio examined was evaluated as "fail". This is considered to be caused by the fact that the lead-free glass composition B-13 used in the Comparative Example reacted with C-03 at the time of bonding, and thus, good softening fluidity cannot be obtained because of crystallization, and the adhesiveness and stickiness to the silicon (Si) base material become poor.

From the above, it was found that by using a glass composite material containing 35 to 100% by volume of a predetermined lead-free glass composition and 0 to 65% by volume of low thermal expansion filler particles, various base materials can be hermetically sealed and bonded at a low temperature. In this Example, A-20 and A-44 are represented as the lead-free glass composition, and B-13 is represented as the Comparative Example, but even when the other lead-free glass composition of Example 1 is used, equivalent performance can be obtained.

As described above, when low thermal expansion filler particles are mixed in glass composite materials or glass pastes, zirconium tungstate phosphate ($Zr_2(WO_4)(PO_4)_2$), β-eucryptite ($Li_2O*Al_2O_3·2SiO_2$), cordierite ($2MgO·2Al_2O_3·5SiO_2$), silica glass ($SiO_2$), niobium oxide ($Nb_2O_5$) and silicon (Si) have been studied as the low thermal expansion filler particles. And among these, zirconium tungstate phosphate ($Zr_2(WO_4)(PO_4)_2$) or a compound mainly composed of zirconium tungstate phosphate ($Zr_2(WO_4)(PO_4)_2$) are particularly preferable. Further, the mixing ratio thereof is 30% by volume or more and 60% by volume or less. The above results have been described, but the low thermal expansion filler particles are not limited to the above results.

Example 3

In Example 3, a glass composite material containing a lead-free glass composition and metal particles was used to join together metal base materials of the same type and different types, and the bonded state was evaluated by the electrical resistance (connection resistance) between the metal base materials.

A-38 shown in Table 1 was used as the lead-free glass composition. And four kinds of silver (Ag), copper (Cu), aluminum (Al) and tin (Sn) were used as the metal particles. Further, aluminum (Al), copper (Cu), nickel (Ni) and iron (Fe) were used as the metal base materials. A glass paste containing a powder of the lead-free glass composition, the metal particles and a solvent was prepared, and the glass paste was applied to an aluminum (Al) base material, dried and temporarily fired.

Thereafter, the same kind and different kind of metal base materials were combined and bonded by a resistance welding to obtain evaluation samples.
(Preparation of Glass Paste)

A powder of a lead-free glass composition, metal particles, and a solvent were combined and mixed to prepare a glass paste. For the powder of the lead-free glass composition, A-38 particles having a particle diameter of about 3 μm, spherical silver (Ag) particles having a mean particle diameter of about 2 μm, spherical copper (Cu) particles having a mean particle diameter of about 15 μm, spherical aluminum (Al) particles having a mean particle diameter of about 3 μm, and tin (Sn) particles having a mean particle diameter of about 30 μm were used. In addition, as a solvent, any of dihydroterpineol, α-terpineol and carbitol acetate was used. In addition, no resin binder was used in this Example.

Regarding the mixing ratio of the powder and the metal particles of the lead-free glass composition, each glass paste was prepared in a range of 80% by volume or less and 10% by volume or more of the lead-free glass composition and 20% by volume or more and 90% by volume or less of the metal particles. In addition, the solid content (the sum of the powder of the lead-free glass composition and the metal particles) in the glass paste was set to 75 to 80% by mass.
(Preparation of Evaluation Samples)

The same evaluation sample and its producing method as in Example 2 were applied to evaluation samples for measuring the connection resistance between the metal base material and a producing method thereof. That is, in this Example, they were according to the evaluation sample and its producing method shown in FIG. 2.

First, a cylindrical metal base material 1' made of aluminum (Al) was prepared which has a bonding surface 2' and has a diameter of 3 mm and a thickness of 2 mm (a).

Next, a glass paste 3' was applied to the bonding surface 2' of the cylindrical metal base material 1' by a dispenser method (b).

Thereafter, it was dried at 150° C. in air. This was charged into the electric furnace, and a glass composite material 4' was formed on the bonding surface 2' of the cylindrical metal base material 1' made of aluminum (Al) by heating to a temperature 20 to 30° C. higher than the softening point $T_s$ at a heating rate of 10° C./min in air and holding for 15 minutes (c).

This was placed on a plate-shaped metal base material 5' made of aluminum (Al), copper (Cu), nickel (Ni) and iron (Fe) with a thickness of about 1 mm, and bonded bodies of Al and Al, Al and Cu, Al and Ni, and Al and Fe were produced by a condition of a load of 100 to 150 N, an applied current of 5 kA and an applied time of 100 to 200 msec in a resistance welding machine (d).

The connection resistance between the metal base materials was measured using these bonded bodies.

(Assessment of Bonded State)

In each bonded body prepared, a connection resistance (electrical resistance) between the metal base material by the four-terminal method was measured. For comparison, a bonding was carried out by using a lead-free tin solder in an inert gas (argon) at 250° C. for 10 minutes. The connecting resistances by this solder were $3.1 \times 10^{-3}$ $\Omega/mm^2$ in the Al—Al solder bonded body, $1.3 \times 10^{-3}$ $\Omega/mm^2$ in the Al—Cu solder bonded body, $1.5 \times 10^{-3}$ $\Omega/mm^2$ in the Al—Ni solder bonded body, and $1.6 \times 10^{-3}$ $\Omega/mm^2$ in the Al—Fe bonded body. These connection resistances were about three orders of magnitude larger because the connection resistances of the Cu and Cu solder bonded bodies were $5.8 \times 10^{-6}$ $\Omega/mm^2$. The reason for this is considered to be that a natural oxide film having a high electrical resistance is formed on the surface of the Al base material.

Figure 3:
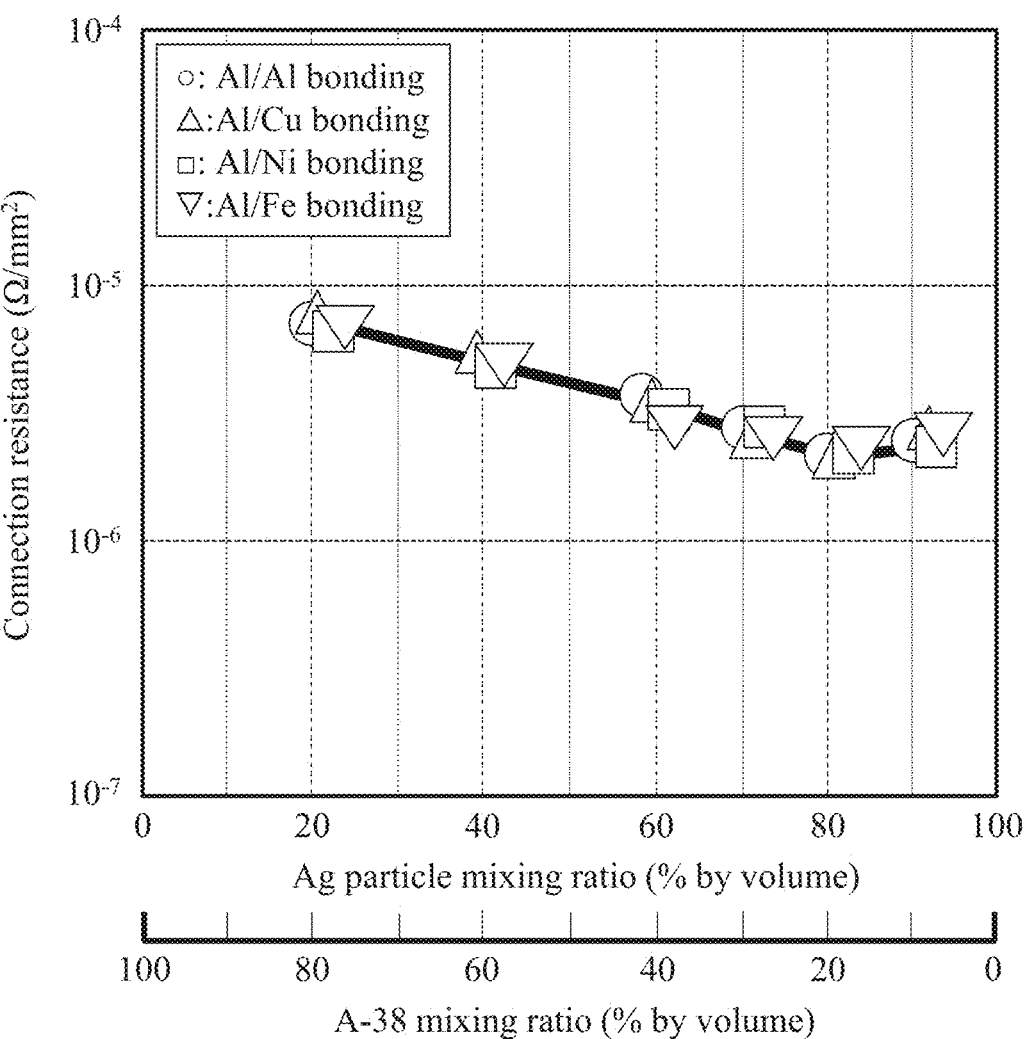
FIG. 3 is a graph showing a relationship between a connection resistance of a bonded body which was bonded with a lead-free glass composition of an Example, and a glass composite material containing Ag particles, and a mixing ratio of the lead-free glass composition and the Ag particles in the glass composite material.

FIG. 3 shows a relationship between a connection resistance and a mixing ratio, the connection resistance being a value when each of Al and Al, Al and Cu, Al and Ni, and Al and Fe is bonded by a glass composite material containing the lead-free glass composition A-38 and the metal particles Ag, and the mixing ratio being of the A-38 and the Ag particles in the glass composite material.

In any of the bonded bodies of Al and Al, Al and Cu, Al and Ni, and Al and Fe, the connection resistances in the $10^{-6}$ $\Omega/mm^2$ range were achieved in a wide range of 10 to 80% by volume of A-38 and 20 to 90% by volume of Ag particles. In particular, the connecting resistances were stably low when the content of A-38 in the glass composite material was 40 to 10% by volume and the content of Ag particles was 60 to 90% by volume. These connection resistances were about three orders of magnitude smaller than those of solder bonded bodies of Al, and were as good as or less than those of solder bonded bodies of Cu and Cu.

This is considered to be due to reduction of an electrical resistance of the interface in the following way. That is, a reaction of A-38 and the Al base material occurred since the A-38 in the glass composite material was softened and fluidized, the native oxide film formed on the Al base material surface was removed, the alloy of Al and V such as $Al_3V$ was generated at the interface region, V also came out of the A-38, and metal Ag was precipitated.

Furthermore, metal Ag precipitated at the interface was grown in the direction of the applied current by the applied current of resistance welding. Therefore, even when the Ag particles are not mixed in the glass composite material, the connection resistance of the bonded body was achieved to a $10^{-5}$ $\Omega/mm^2$ degree. However, sparks occurred between the electrodes of the resistance welder, and the life of the electrode became very short.

Further, it is considered that a part of the Ag particles was dissolved in A-38 when A-38 was softened and flowed, and the Ag was re-precipitated as nanoparticles, whereby necking between the Ag particles progressed, and the connection resistance was further lowered. The optimum A-38 content in the glass-composite material is considered to be 40 to 10% by volume, and the optimum Ag particle content is considered to be 60 to 90% by volume.

On the other hand, when A-38 content was less than 10% by volume, the connection resistance tended to increase. It is considered that this is because the reaction with the Al base material is reduced and the amount of nano-Ag precipitated from A-38 is reduced, so that the necking between the Ag particles is not promoted.

Figure 4:
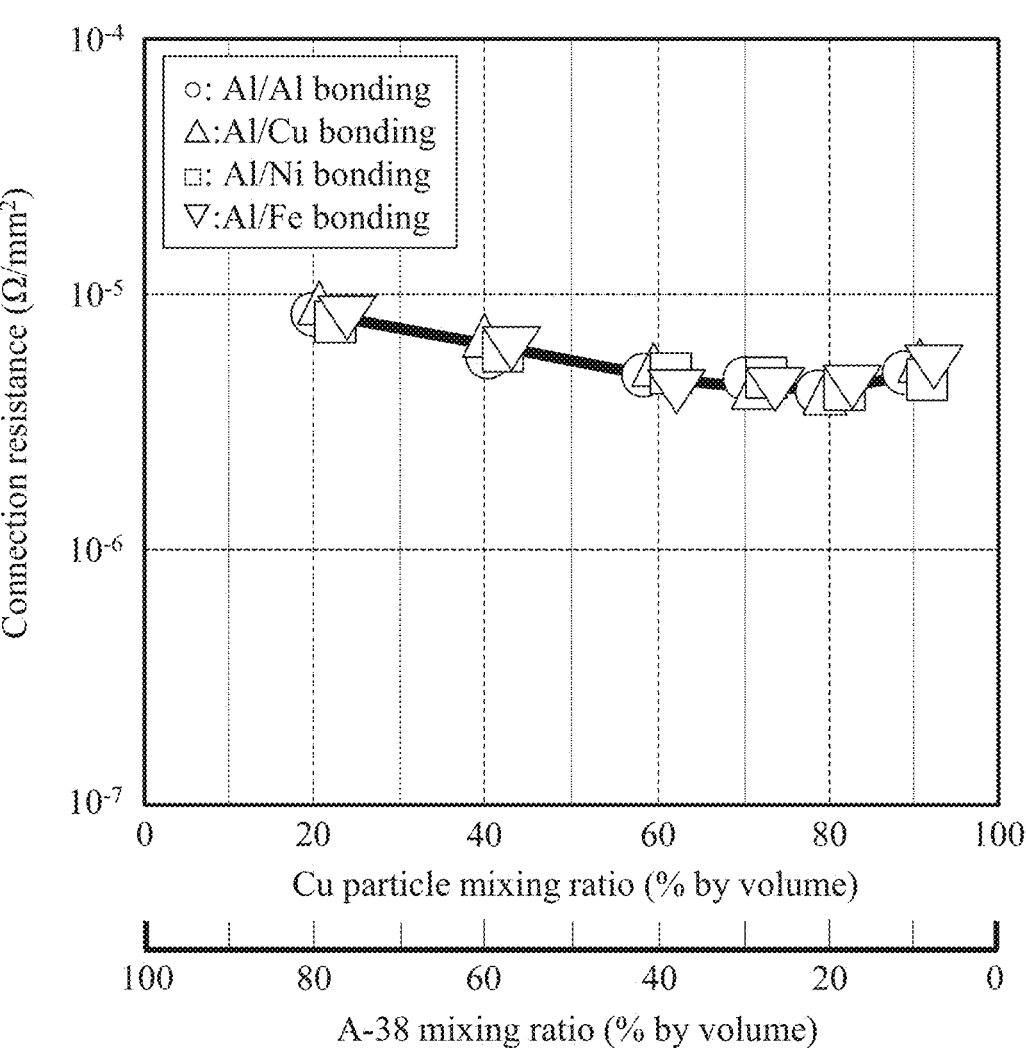
FIG. 4 is a graph showing a relationship between a connection resistance of a bonded body which was bonded with a lead-free glass composition of an Example, and a glass composite material containing Cu particles, and a mixing ratio of the lead-free glass composition and the Cu particles in the glass composite material.

FIG. 4 shows a relationship between a connection resistance and a mixing ratio, the connection resistances being values when Al and Al, Al and Cu, Al and Ni, and Al and Fe are bonded by the glass composite material containing the lead-free glass composition A-38 and the metal particles Cu, and the mixing ratio being of the A-38 and the Cu particles in the glass composite material.

In any of the bonded bodies of Al and Al, Al and Cu, Al and Ni, and Al and Fe, the connection resistances in the $10^{-6}$ $\Omega/mm^2$ range were achieved in a wide range of 10 to 80% by volume of A-38 and 20 to 90% by volume of Cu particles. In particular, the connection resistances were low when A-38 content in the glass composite material was 40 to 10% by volume and the Cu particle content in the glass composite material was 60 to 90% by volume. However, this is compared with FIG. 3 using Ag particles, the connection resistance is increased. This is considered to be caused by surface oxidation of Cu particles in the glass composite material.

Figure 5:
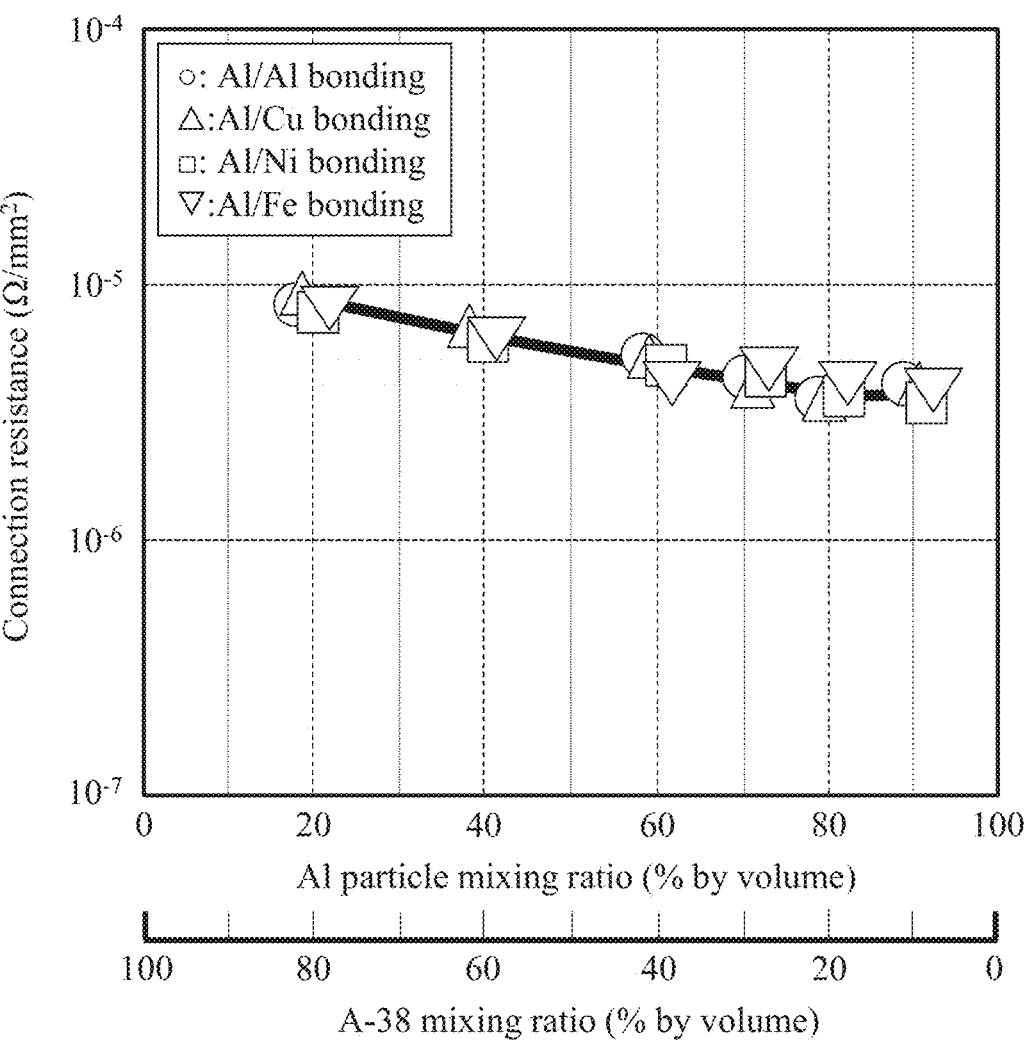
FIG. 5 is a graph showing a relationship between a connection resistance of a bonded body which was bonded with a lead-free glass composition of an Example, and a glass composite material containing Al particles, and a mixing ratio of the lead-free glass composition and the Al particles in the glass composite material.

FIG. 5 shows a relationship between a connection resistance and a mixing ratio, the connection resistances being values when Al and Al, Al and Cu, Al and Ni, and Al and Fe are bonded by the glass composite material containing the lead-free glass composition A-38 and the metal particles Al, and mixing ratio being of the A-38 and the Al particles in the glass composite material.

In any of the bonded bodies of Al and Al, Al and Cu, Al and Ni, and Al and Fe, the connection resistances in the $10^{-6}$ $\Omega/mm^2$ range were achieved in a wide range of 10 to 80% by volume of A-38 and 20 to 90% by volume of Al particles. In particular, the connection resistances were low when the A-38 content in the glass composite material was 40 to 10% by volume and the Al particle content in the glass composite material was 60 to 90% by volume.

However, as compared with FIG. 3 using Ag particles, the connection resistance is high, it was the same degree of connection resistance as the bonded body using Cu particles shown in FIG. 4.

Since Al particles have a feature of being much cheaper than Ag particles, it is considered that the use of both Al particles and Ag particles as metal particles is advantageous in reducing the resistance and cost of the glass composite material and its glass paste.

Therefore, a bonded body of Al and Cu in which A-38 mixing ratio in the glass composite material was kept constant at 20% by volume, and the mixing ratio of Al particles and Ag particles was 40:40 and 50:30 by volume percentage, respectively, was produced in the same manner as described above, and the connecting resistances thereof were evaluated.

As a result, it was found that the connection resistance equivalent to that of the bonded body in which the amount of the Ag particles containing no Al particles was 60% by volume or more was obtained, and that it was effective to use both of the Al particles and the Ag particles.

Figure 6:
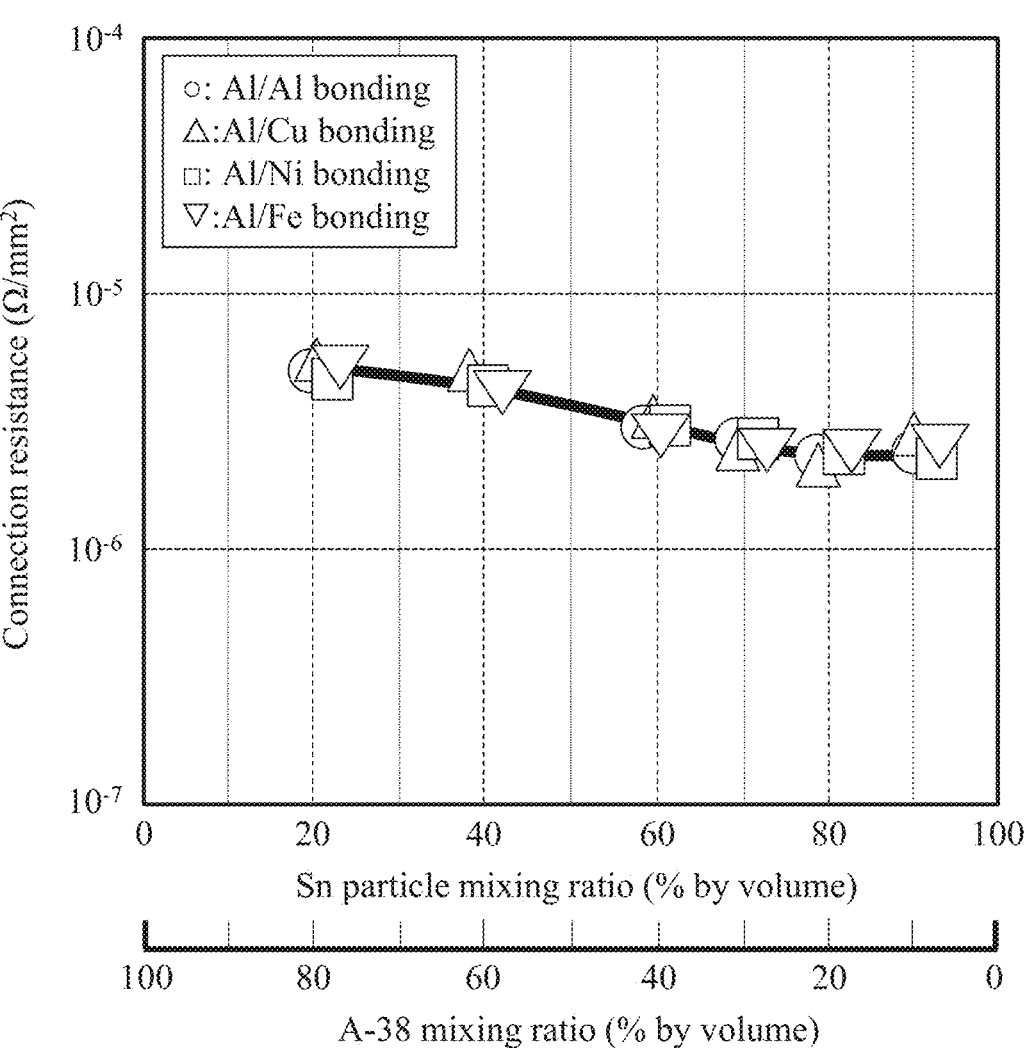
FIG. 6 is a graph showing a relationship between a connection resistance of a bonded body which was bonded with a lead-free glass composition of an Example, and a glass composite material containing Sn particles, and a mixing ratio of the lead-free glass composition and the Sn particles in the glass composite material.

FIG. 6 shows a relationship between a connection resistance and a mixing ratio, the connection resistances being values when Al and Al, Al and Cu, Al and Ni, and Al and Fe are bonded by a glass composite material containing the lead-free glass composition A-38 and the metal particles Sn, and the mixing ratio being of the A-38 and the Sn particles in the glass composite material.

In any of the bonded bodies of Al and Al, Al and Cu, Al and Ni, and Al and Fe, the connection resistances in the $10^{-6}$ $\Omega/mm^2$ range were achieved in a wide range of 10 to 80% by volume of A-38 and 20 to 90% by volume of Sn particles. In particular, the connection resistances were low when the A-38 content in the glass composite material was 40 to 10% by volume and the Sn particle content in the glass composite material was 60 to 90% by volume. This connection resistance was lower than that of FIGS. 4 and 5 using Cu particles and Al particles, and was almost the same as that of FIG. 3 using Ag particles. This is considered because it was bonded in the vicinity of the melting point of the metal Sn (232° C.), the metal Sn was also melted, and thereby a conductive pass with A-38 was formed in the direction of application of the current.

From the above, the lead-free low-melting glass composition of the present invention can be effectively applied to a glass composite material and a glass paste thereof in which a conductive joint for establishing conduction between metal base materials is formed at a low temperature by compositing the glass composite material and the metal particles. Further, since the conductivity and heat dissipation have a certain correlation, it is needless to say that it can be applied to glass composite material and its glass paste for forming not only the conductive joint but also the heat dissipation joint.

In this Example, the A-38 is exemplified as a lead-free glass composition, but equivalent performance can be obtained even when the lead-free glass composition of the other present invention is used. Although Ag, Cu, Al and Sn have been described in the case where the glass composite material or the glass paste thereof contains metal particles, the present invention is not limited thereto, and the same performance can be obtained even when these alloys are used.

In the formation of conductive joints and radiating joints between metal base materials, a lead-free tin solder is generally used, but Ag particles and Sn particles are effective as the metal particles contained in the glass composite materials and the glass paste, considering the differentiation from the solder.

Further, in the lead-free tin solder, it is difficult to perform good conductive bonding and heat dissipation bonding on the metal base material or the like the surface of which a native oxide film is formed on like Al. On the other hand, if the glass composite material of the present Example or the glass paste thereof is used, the conductive bonding or the heat dissipative bonding can be performed also on the metal base material or the like having a natural oxide film.

In addition, the lead-free tin solder is generally bonded in a reductive heating atmosphere in order to prevent oxidation. But if the glass composite material of the present Example or the glass paste thereof is used, the bonding can be performed in various heating atmospheres such as an oxidizing atmosphere or a reductive atmosphere.

The glass composite material or the glass paste containing the metal particles can be used as the glass composite material or the glass paste as described in Example 2 when conductivity is permitted in the bonded part or the sealed part. In this case, the thermal expansion coefficient is not matched with that of the material to be adhered or the material to be sealed as in Example 2, but the stress is relaxed by the size or the amount of the metal particles to be mixed to perform low-temperature bonding or low-temperature sealing.

Example 4

In this Example, an electrode/wiring was formed on various substrates using a glass composite material containing a lead-free glass composition and metal particles of Example 3. And an electrical resistance of the electrode/wiring (wiring resistance) and the stickiness to various substrates were evaluated.

A-16 shown in Table 1 was used as the lead-free glass composition, and silver (Ag) was used as the metal particles. As the substrate, an alumina ($Al_2O_3$) substrate, a borosilicate glass substrate, a silicon (Si) substrate, a ferritic substrate and a polyimide substrate were used. An electrode/wiring was formed by preparing a glass paste containing a powder of the lead-free glass composition, the metal particles, and a solvent, applying it to various substrates, drying and temporarily firing it. This was used as an evaluation sample.

(Preparation of Glass Paste)

A glass paste was prepared by combining and mixing a powder of the lead-free glass composition, the metal particles, and the solvent. In the powder of the lead-free glass composition, A-16 having a particle diameter of about 1 μm, and spherical silver (Ag) particles having an average particle diameter of about 1.5 μm were used for the metal particles. In addition, α-terpineol was used as the solvent, and isobornyl cyclohexanol was added as a viscosity modifier.

Table 15 shows the mixing ratio of the powder of the lead-free glass composition A-20 and the metal particles Ag.

Seven kinds of glass pastes were prepared at the mixing ratios shown in this table. Here, the solid content (the sum of the powder of the lead-free glass composition and the metal particles) in the glass paste was set to 75 to 80% by mass.

TABLE 15

Figure 7:
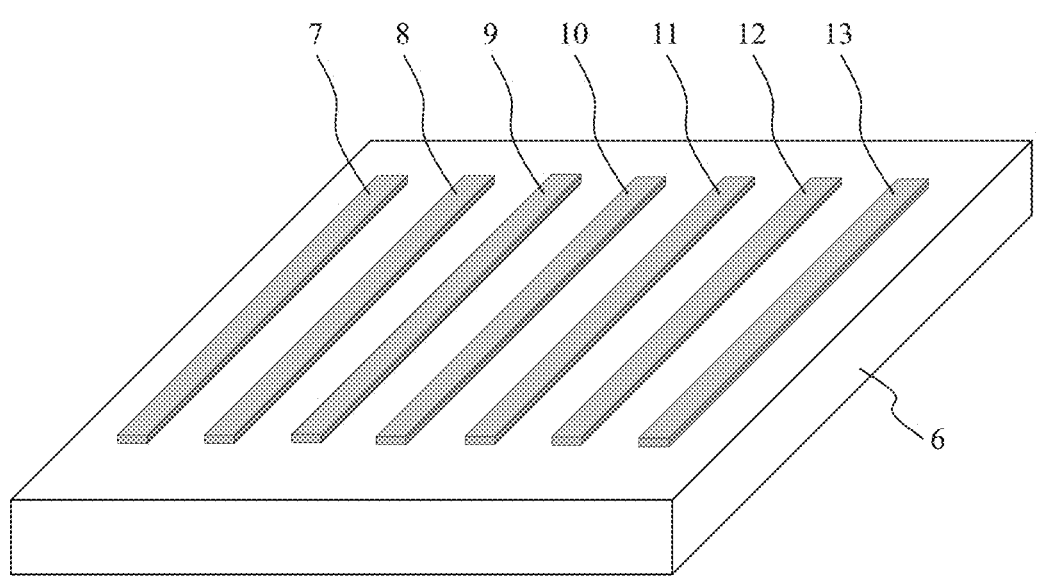
FIG. 7 is a schematic perspective view showing a wiring pattern for performing measurement of a wiring resistance and a peeling test in a formed electrode/wiring.

| Electrode/ Wiring No. | Lead-free low-melting glass composition A-16 (volume %) | Metal particle Ag (volume %) | Remarks |
|---|---|---|---|
| | Contents (Combined Amounts) of Lead-Free Low-Melting Glass Composition and Metal Particles in Electrode/Wiring | | |
| D-01 | 5 | 95 | Wiring 7 of FIG. 7 |
| D-02 | 10 | 90 | Wiring 8 of FIG. 7 |
| D-03 | 15 | 85 | Wiring 9 of FIG. 7 |
| D-04 | 20 | 80 | Wiring 10 of FIG. 7 |
| D-05 | 30 | 70 | Wiring 11 in FIG. 7 |
| D-06 | 40 | 60 | Wiring 12 in FIG. 7 |
| D-07 | 50 | 50 | Wiring 13 of FIG. 7 |

(Preparation of Evaluation Samples)

FIG. 7 shows a wiring pattern formed using the seven types of the glass paste D-01 to D-07 shown in Table 15.

In this figure, the wirings 7 to 13 are formed in parallel on the substrate 6. The wirings 7 to 13 correspond to D-01 to D-07 in Table 15, respectively. As the substrate 6, an alumina (Al$_2$O$_3$) substrate, a borosilicate glass substrate, a silicon (Si) substrate, a ferritic substrate and a polyimide substrate were used.

First, a pattern of 2 mm×40 mm was applied on each substrate using each glass paste by a screen printing method, respectively, and dried at 150° C. in air. The film thickness at this time was about 30 μm. This was put into an electric furnace, heated to 220 to 230° C. at a temperature rising rate of 10° C./min in the air, and held for 30 minutes, thereby forming the respective wirings 7 to 13 on the substrate 6.

(Evaluation of Wiring Resistance)

The wiring resistances of the wirings 7 to 13 formed on the respective substrates by the mixing ratio of the seven types of glass paste D-01 to D-07 shown in Table 15 were respectively measured by the four-terminal method.

(Evaluation of Stickiness)

Stickiness of the wirings 7 to 13 to each substrate was evaluated by a peeling test. A peeling tape was stuck to the wirings formed on each substrate. And when the wirings were not peeled off from the substrate and were not disconnected when peeling the tape, they were evaluated as "pass". On the other hand, the wiring that was peeled off and/or disconnected was evaluated as "fail".

Figure 8:
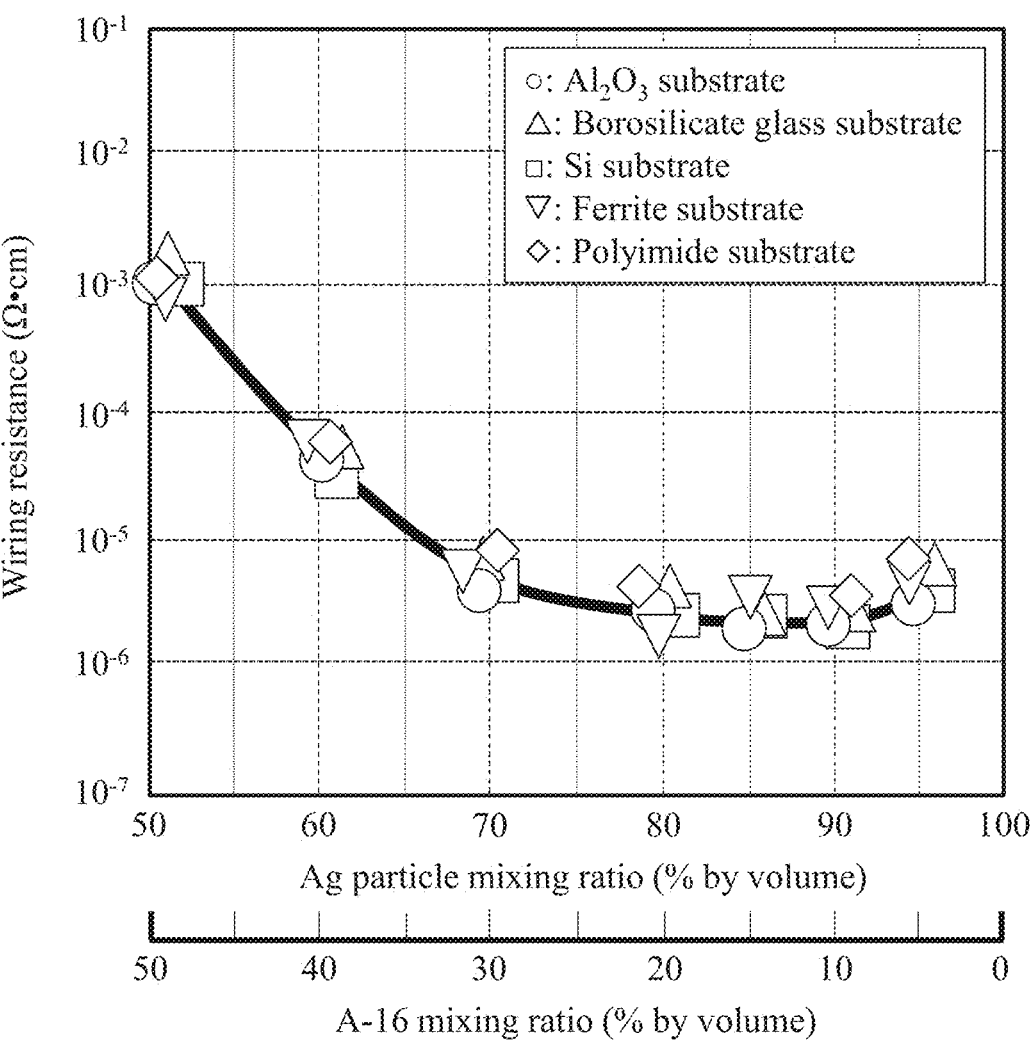
FIG. 8 is a graph showing a relationship between a wiring resistance of an electrode/wiring formed by a glass composite material containing a lead-free glass composition of an Example and Ag particles, and a mixing ratio of the lead-free glass composition and the Ag particles in the glass composite material.

FIG. 8 shows the relation between the wiring resistance and the mixing ratio of A-16 or Ag in a glass composite material in the wiring formed on each of substrates by the glass composite material containing the lead-free glass composition A-16 and the metal particles Ag.

Five types of substrates were examined: a A$_2$O$_3$ substrate, a borosilicate glass substrate, an Si substrate, a ferritic substrate, and a polyimide substrate. But a difference in the wiring resistances among the substrates was hardly observed. With increasing the Ag content and decreasing the A-16 content, the wiring resistance decreased. And the wiring resistance in the 10$^{-6}$ Ω·cm range was achieved with the Ag content ranging from 70% to 95% by volume and the A-16 content ranging from 30% to 5% by volume. As for the reduction in the wiring resistance, the smallest wiring resistance was obtained at 80 to 90% of Ag by volume and at 10 to 20% of the A-16 by volume.

Since the glass composite material of the present invention has a good softening fluidity at the time of wiring formation, necking of Ag particles can be promoted. Therefore, in this Example, the electrode/wiring having a remarkably low wiring resistance can be formed at a low temperature of 220 to 230° C. In the present Example, five types of A$_2$O$_3$ substrate, borosilicate glass substrate, Si substrate, ferrite substrate and polyimide substrate were examined, but it can be easily inferred that the present invention can be applied to the other substrates.

Table 16 shows results of the peeling test for each of the wiring formed on each substrate.

From this table, it can be seen that D-02 to D-07 pass on any of the substrates. Thus, D-02 to D-07 have adequate stickiness.

The mixing ratio corresponding to D-02 to D-07 is 10% by volume or more of the lead-free glass composition A-16 and 90% by volume or less of the metal particles Ag.

On the other hand, D-01 (A-16 of 5% by volume and 95% by volume of Ag) fails any of the substrates, and the stickiness is insufficient. This is considered to be because the mixing ratio of the lead-free glass composition in the glass composite material was small. From this, it was found that, as the glass composite material, a mixing ratio of the lead-free glass composition is preferably 10% by volume or more. However, even if the mixing ratio of the lead-free glass composition is 5% by volume, there is a sufficient possibility that good adhesiveness can be obtained if a contrivance such as pressurization can be performed at the time of forming the wiring.

TABLE 16

| Electrode/ Wiring No. | Al$_2$O$_3$ substrate | Borosilicate glass substrate | Si substrate | Ferrite substrate | Polyimide substrate |
|---|---|---|---|---|---|
| | Peeling Test Results for Electrode/Wiring | | | | |
| D-01 | fail | fail | fail | fail | fail |
| D-02 | pass | pass | pass | pass | pass |
| D-03 | pass | pass | pass | pass | pass |
| D-04 | pass | pass | pass | pass | pass |

TABLE 16-continued

| | | Peeling Test Results for Electrode/Wiring | | | |
|---|---|---|---|---|---|
| Electrode/ Wiring No. | $Al_2O_3$ substrate | Borosilicate glass substrate | Si substrate | Ferrite substrate | Polyimide substrate |
| D-05 | pass | pass | pass | pass | pass |
| D-06 | pass | pass | pass | pass | pass |
| D-07 | pass | pass | pass | pass | pass |

As for the lead-free glass composition of the Comparative Example B-35 shown in Table 2, an evaluation sample was prepared in the same manner as described above, and the wiring resistance and stickiness were evaluated.

The wiring resistance was slightly higher when compared to FIG. 8 using the Example A-16, it showed almost the same tendency. However, with respect to stickiness, the sample using the lead-free glass composition of the Comparative Example B-35 was greatly different from the results of the peeling test of Table 16 using the Example A-16. In the case of the mixing ratio of the B-35 was 30% by volume or less and the mixing ratio of Ag was 70% by volume, the wiring was peeled off for any of the substrates and thus said sample failed. This is a result that the wiring is easily peeled off when the wiring resistance is low, it is not preferable when applied to the electrode or wiring.

In the present Example, the lead-free glass composition is representatively described as the A-16, but it is needless to say that equivalent performance can be exhibited also with respect to the other lead-free glass compositions of the present invention. Further, in the present Example has been described Ag as metal particles contained in the glass composite material or a glass paste thereof, but the present invention is not limited thereto, Ag alloy or Cu, Al and Sn or these alloys it is needless to say that there is a possibility to be applied.

Example 5

In this Example, a glass composite material containing a lead-free glass composition and a resin was used to evaluate an adhesion strength to the base material of the metal, the ceramic and the glass.

A-51 shown in Table 1 was used as the lead-free glass composition. Six types of epoxy resin, phenoxy resin, phenolic resin, acrylic resin, urethane resin and fluororesin were used as the resins. Aluminum (Al), copper (Cu) and iron (Fe) were used as the metal base materials. Alumina ($Al_2O_3$) and magnesia (MgO) were used as the ceramic base materials. And soda lime glass and borosilicate glass were used as the glass base materials. A glass paste containing a powder of the lead-free glass composition, the resin and the solvent was used as a coating material. And materials were obtained by forming a coating film by coating the glass paste on various base materials and firing. The materials were used as evaluation samples.

(Preparation of Glass Paste)

The glass paste was prepared by combining and mixing the powder of the lead-free glass composition, the resin and the solvent. A-51 having a particle size of about 1 μm was used for the powder of the lead-free glass composition, and carbitol acetate was used as the solvent.

First, epoxy resin, phenoxy resin, phenolic resin, acrylic resin, urethane resin and fluororesin were dissolved in the solvent, respectively. Next, particles of the lead-free glass composition were introduced into the dissolution solution and stirred well to prepare the glass paste. The mixing ratio of the lead-free glass composition and the resin was set to 0:100 and 20:80 by volume percentage. In addition, the solid content (the sum of the lead-free glass composition and the resin) in the glass paste was set to 75 to 80% by mass. Here, the paste having a mixing ratio of the lead-free glass composition and the resin of 0:100, that is, no lead-free glass composition was used as a comparative material.

(Preparation of Evaluation Samples)

The prepared glass pastes were applied to metal base materials of Al, Cu and Fe, ceramic base materials of $Al_2O_3$ and MgO, and glass base materials of soda lime glass and borosilicate glass, respectively, heated to 150° C. at a temperature rising rate of 10° C./min in air for 15 minutes, and then heated to 220 to 230° C. at a temperature rising rate of 5° C./min and held for 10 minutes to form a coating film on each base material.

(Evaluation of Adhesion Strength)

The adhesion strength of the coating film formed on each base material was evaluated by a scratch test (peel strength). The adhesion strength of the coating film containing the lead-free glass composition was compared relative to that of the coating film containing the lead-free glass composition, setting the adhesion strength of the coating film in which the mixing ratio of the lead-free glass composition and the resin is 0:100, that is, which contains no lead-free glass composition to "1". That is, when it exceeds "1", the adhesion strength is improved. On the other hand, when it is less than "1", it means that the adhesion strength is reduced.

Table 17 shows the results of evaluation of the relative adhesion strength to the respective base materials when the lead-free glass composition A-51 is contained in an amount of 20% by volume.

As shown in the table, the adhesion strength was remarkably improved by a factor of 2 to 5 for any of the resins of epoxy resin, phenoxy resin, phenolic resin, acrylic resin, urethane resin and fluororesin, and for any of the base materials of Al, Cu, Fe, $Al_2O_3$, MgO, soda lime glass and borosilicate glass. This is considered because the A-51 softened and flowed when forming the coating film, and was firmly adhered to the respective base materials. Therefore, it is considered that the base material to which the A-51 can be firmly bonded has improved the adhesion strength. Also depending on the resin contained, the adhesion strength was different, and in particular, the adhesion strength increased when containing the phenoxy resin or the phenol resin. It is presumed that the softening fluidity of the A-51 in said resins was different from the other resins, and said samples had the good softening fluidity in the phenoxy resin and the phenolic resin.

TABLE 17

Evaluation Results of Relative Adhesion Strength to Each Base Material when
20% by Volume of Lead-Free Low-Melting Glass Composition A-51 was Contained

| Resin | Metal base material | | | Ceramic base material | | Glass base material | |
|---|---|---|---|---|---|---|---|
| | | | | | | Soda lime | Borosilicate |
| (80 volume %) | Al | Cu | Fe | $Al_2O_3$ | MgO | glass | glass |
| Epoxy resin | 2.9 | 2.7 | 2.6 | 3.3 | 3.3 | 3.2 | 2.7 |
| Phenoxy resin | 3.5 | 2.9 | 3.1 | 3.7 | 4.6 | 4.0 | 3.1 |
| Phenolic resin | 4.6 | 3.8 | 3.3 | 4.3 | 4.9 | 4.8 | 3.6 |
| Acrylic resin | 2.8 | 2.5 | 2.6 | 2.8 | 3.1 | 3.1 | 2.7 |
| Urethane resin | 3.1 | 2.6 | 2.7 | 2.6 | 3 | 3.2 | 3.1 |
| Fluororesin | 2.9 | 2.7 | 2.8 | 2.9 | 2.8 | 2.7 | 2.6 |

With respect to the lead-free glass composition of the Comparative Example B-29 shown in Table 2, an evaluation sample was prepared in the same manner as described above, and the adhesion strength was evaluated. Its adhesion strength was greater than that of the coating without the lead-free glass composition, but was 30 to 50% lower compared to Table 17 using the Example A-51.

From the above, it has been found that the coating film adhesion strength to the base material of the metal, the ceramic and the glass can be remarkably improved when the lead-free glass composition of the Example and the resin are composited.

In the present Example, although the A-51 is representatively described as the lead-free glass composition, the equivalent performance can be exhibited also in the other lead-free glass compositions of the present invention. As the resin to be contained, general epoxy resin, phenoxy resin, phenolic resin, acrylic resin, urethane resin, and fluorine resin were examined, but the present invention is not limited thereto. In addition, metal base materials of Al, Cu and Fe are used as the metal base material forming the coating film, $Al_2O_3$ and MgO are used as the ceramic base material, and soda lime glass and borosilicate glass are used as the glass base material, but they are not limited to these base materials.

Example 6

In Example 6, a glass composite material containing a lead-free glass composition and a resin was used, and an influence of the mixing ratio of the lead-free glass composition and the resin on the adhesion strength to the base material of the metal, the ceramic and the glass was evaluated.

A-42 shown in Table 1 was used as the lead-free glass composition, and a phenolic resin was used as the resin. Aluminum (Al), copper (Cu) and iron (Fe) were used as the metal base material. Alumina ($Al_2O_3$) and magnesia (MgO) were used as the ceramic base material. And soda lime glass and borosilicate glass were used as the glass base material. A glass paste containing a powder of the lead-free glass composition, the resin and a solvent was used as a coating material, and the glass paste was applied to various base materials and fired to form a coating film. This was used as an evaluation sample.

(Preparation of Glass Paste)

A powder of the lead-free glass composition, the resin and the solvent were combined and mixed to prepare a glass paste. The A-42 having a particle size of about 1 μm was used for particles of the lead-free glass composition, and carbitol acetate was used as the solvent. The particles of the lead-free glass composition were introduced into the carbitol acetate in which the phenol resin was dissolved, and stirred well to prepare the glass paste. The mixing ratio of the lead-free glass composition and the resin was five kinds of 5:95, 10:90, 30:70, 50:50 and 70:30 by volume percentage. In addition, the solid content (the sum of the lead-free glass composition and the resin) in the glass paste was set to 75 to 80% by mass.

(Preparation of Evaluation Samples)

The prepared glass pastes were applied to the metal base materials of Al, Cu and Fe, the ceramic base materials of $Al_2O_3$ and MgO, and the glass base materials of soda lime glass and borosilicate glass, respectively, heated to 150° C. at a temperature rising rate of 10° C./minute in the air and held for 15 minutes, and then heated to 220 to 230° C. at a temperature rising rate of 5° C./minute and held for 10 minutes to form a coating film on the respective base materials.

(Evaluation of Adhesion Strength)

The adhesion strength of the coating film formed on each base material was evaluated by a scratch test (peel strength). The adhesion strength of the coating film containing the lead-free glass composition was compared relative to that of the coating film containing the lead-free glass composition, setting the adhesion strength of the coating film in which the mixing ratio of the lead-free glass composition and the resin is 0:100, that is, which contains no lead-free glass composition to "1". That is, when it exceeds "1", the adhesion strength is improved. On the other hand, when it is less than "1", it means that the adhesion strength is reduced.

Table 18 shows the evaluation results of the relative adhesion strength to each base material when the phenol resin is used.

TABLE 18

Evaluation Results of Relative Adhesion Strength to Each Base Material when Phenolic Resin is Used

| Lead-free low-melting glass composition A-42 (volume %) | Resin Phenolic resin (volume %) | Metal base material | | | Ceramic base material | | Glass base material | |
|---|---|---|---|---|---|---|---|---|
| | | Al | Cu | Fe | Al₂O₃ | MgO | Soda lime glass | Borosilicate glass |
| 5 | 95 | 2.9 | 2.5 | 2.4 | 2.8 | 2.7 | 2.5 | 2.1 |
| 10 | 90 | 4.5 | 3.9 | 3.3 | 4.2 | 4.9 | 3.8 | 3.2 |
| 30 | 70 | 4.8 | 3.1 | 3.0 | 3.2 | 3.5 | 4.8 | 2.9 |
| 50 | 50 | 2.8 | 2.2 | 1.8 | 2.0 | 2.5 | 2.3 | 1.8 |
| 70 | 30 | 1.7 | 0.8 | 0.8 | 0.7 | 1.4 | 1.2 | 0.6 |

As shown in this table, for any base material of Al, Cu, Fe, $Al_2O_3$, MgO, soda lime glass and borosilicate glass, the mixing ratio at which the adhesion strength of the coating film is maximized is in the range of 10 to 30% by volume for the A-42 and 90 to 70% by volume for the phenol resin. In addition, when the mixing ratio of A-42 was 50% by volume or less and the mixing ratio of the phenolic resin was 50% by volume or more, the adhesion strength was more than "1" in any of the base materials, and an improvement in the adhesion strength was observed. However, when the content of the A-42 is more than 50% by volume and the mixing ratio of the phenolic resin is less than 50% by volume, it is less than "1" in most of the base materials, and the adhesion strength is insufficient. This is considered that the adhesion strength was lowered because the thermal stress at the time of forming the coating film could not be relaxed when the content of the lead-free glass composition was large.

However, in the Al base material, the MgO base material and the soda lime glass base material, the mixing ratio of A-42 and phenolic resin is more than "1" even at 70:30 by volume percentage. The adhesion strength of the coating film due to the difference in the base materials tends to be particularly large in the base materials of Al, MgO and soda lime glass, the base materials tending to adhere strongly when the A-42 softens and flows.

With respect to the lead-free glass composition of the Comparative Example B-39 shown in Table 2, an evaluation sample was prepared in the same manner as described above, and the adhesion strength was evaluated. The adhesion strength was 30 to 50% lower as in Example 5, although the same tendency was observed when compared to Table 18 using the Example A-42.

From the above, it has been found that the glass composite material containing the lead-free glass composition of the Examples and the resin and the glass paste thereof have improved the coating film adhesion strength to the base material of the metal, the ceramic and the glass and can be effectively applied as the coating material to the base material of a metal, the ceramic and the glass when the mixing ratio of the lead-free glass composition is in the range of 50% by volume or less and the mixing ratio of the resin is 50% by volume or more. In particular, it has been clarified that it exhibits the excellent adhesion strength and is very effective as the coating material to the base material of the metal, the ceramics and the glass when the mixing ratio of the lead-free glass composition is in the range of 10% by volume or more and 30% by volume or less and the mixing ratio of the resin is in the range of 90% by volume or less and 70% by volume or more.

As described above, it has been found that the lead-free glass composition of the Example can also be composited with a resin having a low heat resistance compared with these. As a result, it is considered that a new application area to a paint or the like is expanded. Especially, when the base material is metal, ceramics or glass, the base material can be firmly adhered to each other, so that the base material can be applied to various coated parts.

Example 7

In this Example, a double glazing panel for vacuum insulation was produced as one of the representative examples of a sealing structure by using two air-cooled reinforced soda lime glass substrates and a glass composite material. Here, a glass paste thereof is used for the glass composite material in this Example.

Figures 9A, 9B:
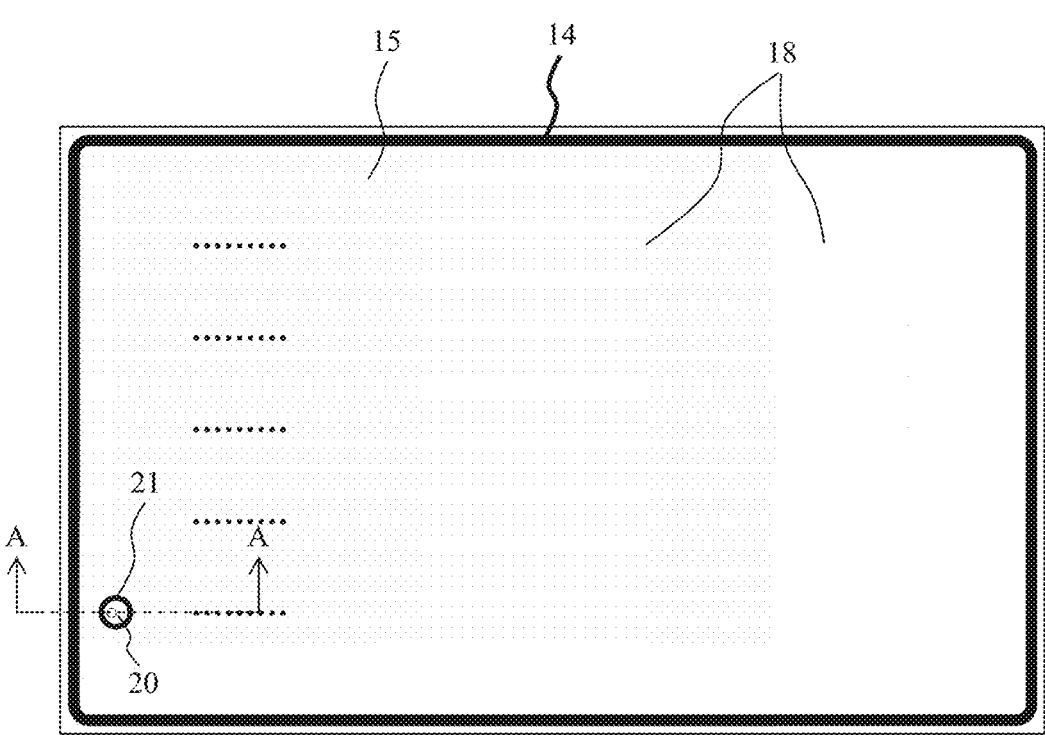
FIG. 9A is a schematic plan view showing a vacuum insulated double glazing panel of an Example.
FIG. 9B is a cross-sectional view taken along line A-A of FIG. 9A.

FIG. 9A is a schematic plan view of a produced double glazing panel for vacuum insulation.

As shown in this figure, the double glazing panel for vacuum insulation includes an air-cooled reinforced soda lime glass substrate 15, a sealed part 14 provided on a peripheral portion thereof, and a plurality of spacers 18 arranged two-dimensionally at equal intervals. Further, the double glazing panel for vacuum insulation includes an evacuation hole 20 and a cap 21.

FIG. 9B is an enlarged view of a cross section taken along the line A-A in the vicinity of the sealed part of FIG. 9A.

As shown in FIG. 9B, the double glazing panel for vacuum insulation is provided with a sealed part 14 and a spacer 18 between two air-cooled reinforced soda lime glass substrates 15 and 16. An exhaust hole 20 is formed on the air-cooled reinforced soda lime glass substrate 16. It is configured to perform an evacuation from the sealed space part 17 between the two air-cooled reinforced soda lime glass substrates 15 and 16 by using a vacuum pump (not shown.) from the evacuation hole 20. A cap 21 is attached to the evacuation hole 20. As a result, the vacuum state of the space part 17 is maintained. Further, if necessary, the cap 21 of the double glazing panel for vacuum insulation after installation can be removed to perform evacuation by a vacuum pump, even when the degree of vacuum of the space part 17 is reduced, it is possible to improve the degree of vacuum. A glass composite material is used for the sealed part 14.

This double glazing panel for vacuum insulation is applicable to a window glass for building materials, a window glass for vehicles, doors of commercial refrigerators and freezers, etc. As for the glass composite material used for the sealed part 14, low thermal expansion filler particles having a low thermal expansion coefficient is mixed in addition to containing a lead-free glass composition, the low thermal expansion filler particles being for matching the thermal expansion coefficients of the two air-cooled reinforced soda lime glass substrates 15 and 16.

The heatproof temperature of the two air-cooled reinforced soda lime glass substrates 15 and 16 is about 300° C., and since the strength is lowered at a temperature exceeding that temperature, it is necessary to form the sealed part 14 at a temperature of said temperature or lower. Further, the air-cooled reinforced soda lime glass substrates 15 and 16 used in the window glass and the doors or the like is large, and cannot be rapidly heated and quenched. Therefore, heating and cooling in the sealing should be performed gradually. In order to improve the productivity of double glazing panels for vacuum insulation, the sealing need to be carried out at the lowest possible temperature at 300° C. or low.

The reason for using the air-cooled reinforced soda lime glass substrates 15 and 16 for the double glazing panel for vacuum insulation is because they have a higher mechanical strength compared to a soda lime glass substrate without strengthening, the degree of vacuum in the space part 17 can be increased and the heat insulation can be improved. It is also advantageous for crime prevention and safety.

In order to maintain the thickness of the space part 17 at an appropriate value, it is effective to put spherical beads 19 having a uniform particle diameter into the spacer 18 and the sealed part 14. Furthermore, it is possible to utilize a glass composite material for fixing the spacer 18, similarly to the sealed part 14.

When it is applied as a window glass for building materials or a window glass for vehicles, a heat ray reflective film 22 may be formed in advance on an inner surface of the air-cooled reinforced soda lime glass substrate 15 by an evaporation method or the like.

In the present Example, the air-cooled reinforced soda lime glass substrate 15 having a size of 900×600×3 mm and the air-cooled reinforced soda lime glass substrate 16 having the same size in which the evacuation hole 20 is formed are used. The heat ray reflective film 22 was formed on the air-cooled reinforced soda lime glass substrate 15. In order to make the space between the two air-cooled reinforced soda lime glass substrates 15 and 16, that is, the thickness of the space part 17 about 200 μm, spherical beads 19 having a diameter of a little less than 200 μm were mixed in the sealed part 14 and the spacer 18. The soda lime glass was used for the spherical beads 19.

As the sealed part 14, a glass composite material containing the lead-free glass composition A-46 shown in Table 1 and the low thermal expansion filler particle C-01 shown in Table 7 was used. The mixing ratio is 60% by volume of the A-46 and 40% by volume of the C-01. Further, the ratio of the spherical beads 19 mixed with respect to 100 parts by volume of the glass composite material was set to 1 part by volume in the sealed part 14 and 20 parts by volume in the spacer 18.

(Preparation of Glass Paste)

In the present Example, the air-cooled reinforced soda lime glass substrate 15 having a size of 900×600×3 mm and the air-cooled reinforced soda lime glass substrate 16 having the same size in which the evacuation hole 20 is formed are used. A heat ray reflective film 22 was formed on the air-cooled reinforced soda lime glass substrate 15. In order to make the space between the two air-cooled reinforced soda lime glass substrates 15 and 16, that is, the thickness of the space part 17 about 200 μm, spherical beads 19 having a diameter of a little less than 200 μm were mixed in the sealed part 14 and the spacer 18. The soda lime glass was used for the spherical beads 19.

As the sealed part 14, a glass composite material containing the lead-free glass composition A-46 shown in Table 1 and the low thermal expansion filler particle C-01 shown in Table 7 was used. The mixing ratio is 60% by volume of the A-46 and 40% by volume of the C-01. Further, the ratio of the spherical beads 19 mixed with respect to 100 parts by volume of the glass composite material was set to 1 part by volume in the sealed part 14 and 20 parts by volume in the spacer 18.

A glass paste was prepared by combining and mixing a powder of the lead-free glass composition, the low thermal expansion filler particle, and the solvent.

A-46 having a particle diameter of about 15 μm was used for the powder of the lead-free glass composition, and C-01 having a particle diameter of about 30 μm was used for the low thermal expansion filler particles. In addition, α-terpineol was used as the solvent, and isobornyl cyclohexanol was added as a viscosity modifier. The glass pastes were prepared so that the total content of A-46 and C-01 (solid content) was 75 to 80% by mass.

In addition, spherical beads made of soda lime glass with a particle size of about 170 to 190 μm were mixed in the glass paste. The content thereof was set to 1 part by volume in the beads for low-temperature sealing, and 20 parts by volume in the beads for the spacer with respect to the solid content 100 parts by volume.

(Fabrication of Vacuum Insulated Double Glazing Panel)

The fabrication process of the vacuum insulated double glazing panel of this Example will be described with reference to FIGS. 10A to 12.

Figure 10A:
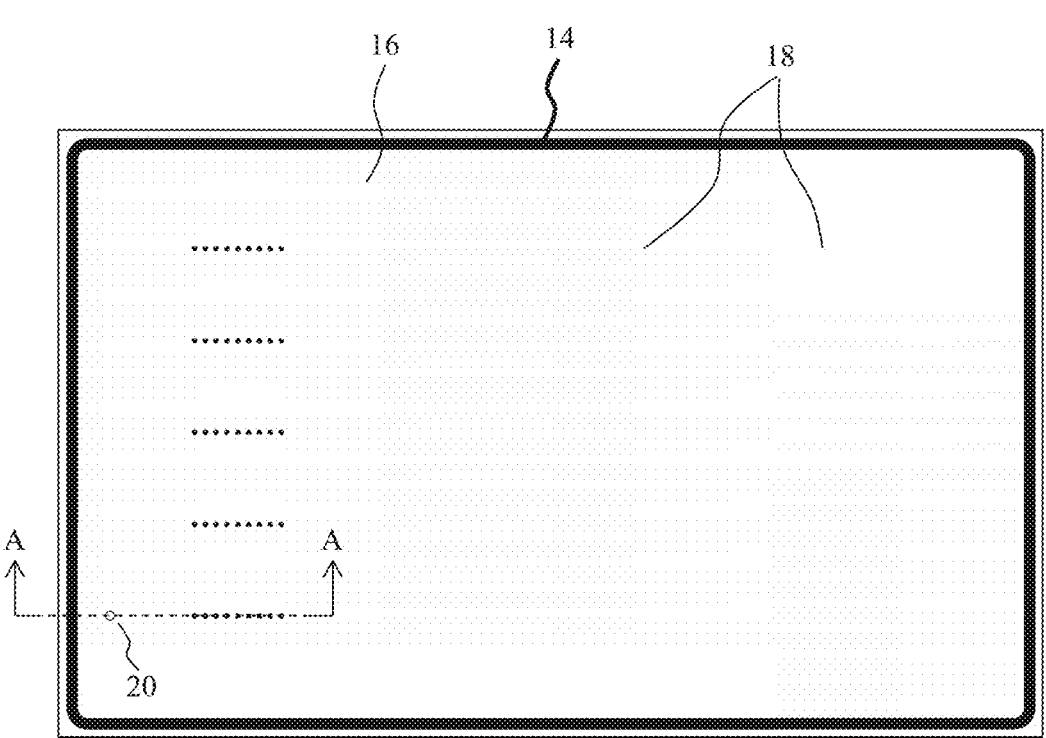
FIG. 10A is a schematic plan view showing a part of a manufacturing process of the vacuum insulated double glazing panel of FIG. 9A.

FIG. 10A shows a state in which the sealed part 14 and the spacer 18 are formed on the air-cooled reinforced soda lime glass substrate 16 constituting the vacuum insulated double glazing panels shown in FIGS. 9A and 9B.

As shown in the FIG. 10A, the produced glass pastes were applied to the outer peripheral portion (sealed part 14) and the inner portion (spacer 18) of the air-cooled soda lime glass substrates 16 by a dispenser method, and dried at 150° C. in the air. This was heated to 220° C. at a heating rate of 5° C./min in air and held for 30 minutes, the sealed part 14 and the spacer 18 was adhered to the air-cooled reinforced soda lime glass substrate 16.

Figure 10B:
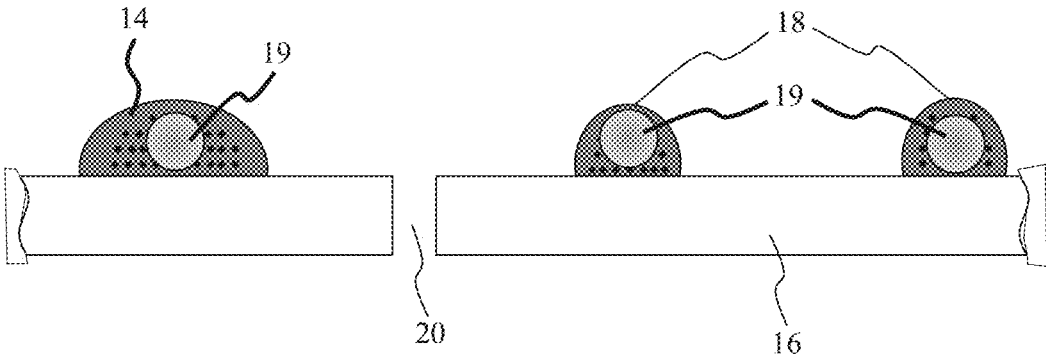
FIG. 10B is a cross-sectional view taken along line A-A of FIG. 10A.

FIG. 10B shows a cross section taken along the line A-A of FIG. 10A.

As shown in FIG. 10B, the sealed part 14 and the spacer 18 include spherical beads 19.

Figure 11A:
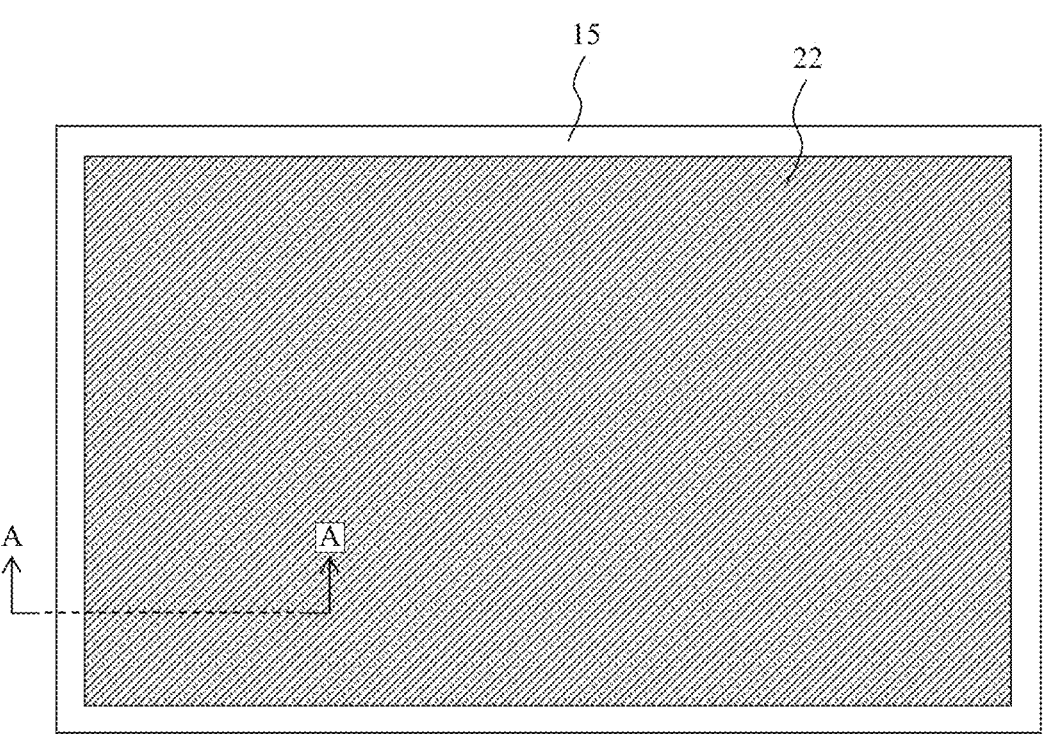
FIG. 11A is a schematic plan view showing a part of the manufacturing process of the vacuum insulated double glazing panel of FIG. 9A.

FIG. 11A shows the air-cooled reinforced soda lime glass substrate 15 constituting the vacuum insulated double glazing panel shown in FIG. 9B.

Figure 11B:
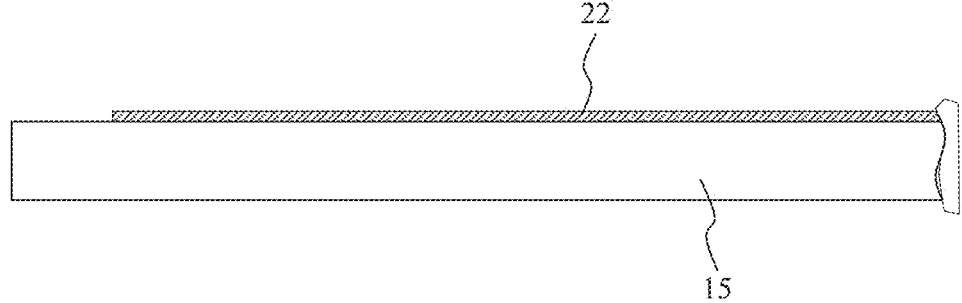
FIG. 11B is a cross-sectional view taken along line A-A of FIG. 11A.

FIG. 11B is a cross-sectional view taken along line A-A of FIG. 11A.

As shown in FIGS. 11A and 11B, a heat ray reflective film 22 is formed on one surface of the air-cooled reinforced soda lime glass substrate 15.

Figure 12:
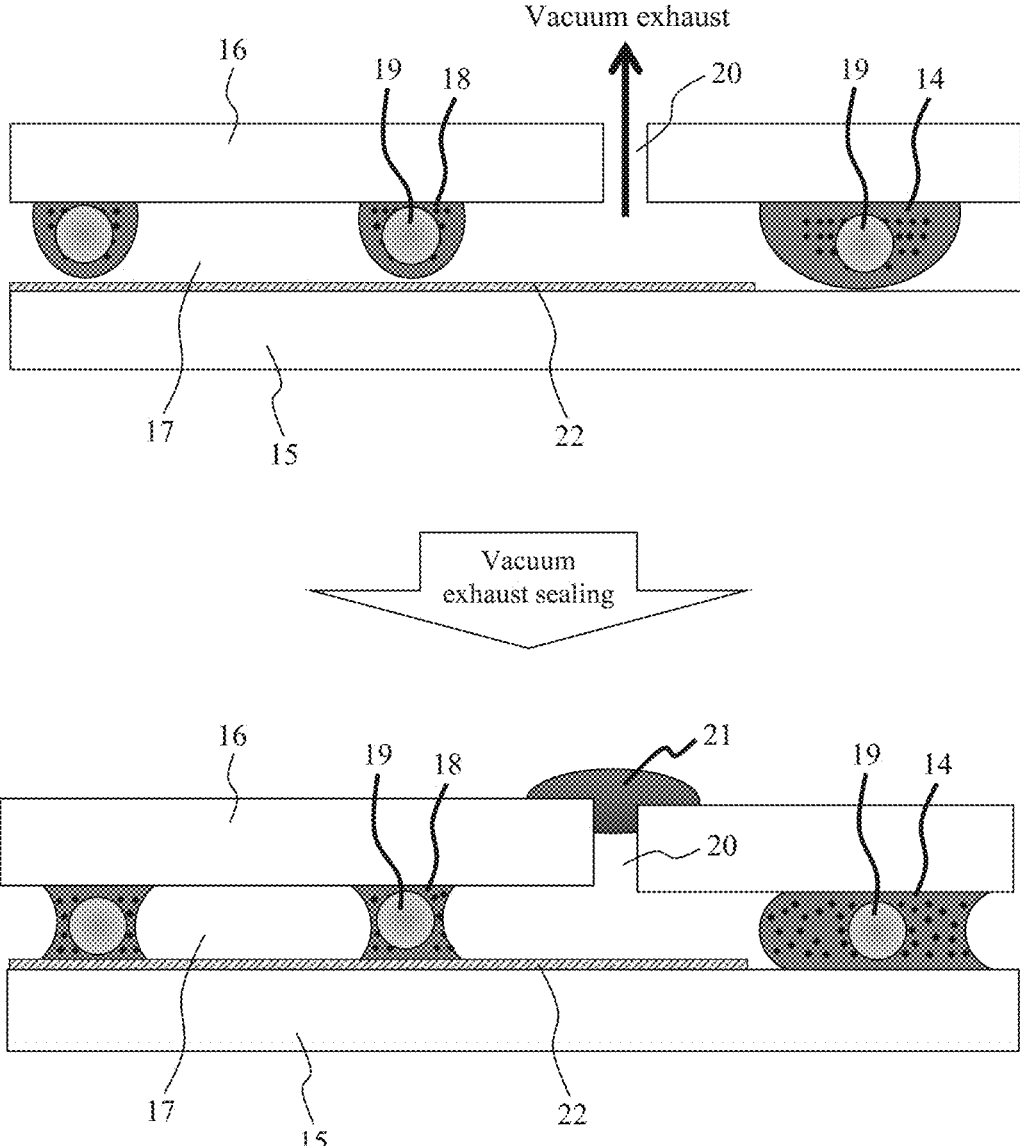
FIG. 12 is a schematic sectional view showing a part of the manufacturing process of the vacuum insulated double glazing panel of FIG. 9A.

FIG. 12 illustrates the last step in a producing method of the vacuum insulated double glazing panel shown in FIGS. 9A and 9B. In FIG. 12, two air-cooled reinforced soda lime glass substrates 15 and 16 were opposed to each other, aligned, and fixed by a plurality of heat-resistant clips. This was subjected to a heat treatment while evacuating to vacuum, and sealed.

Figure 13:
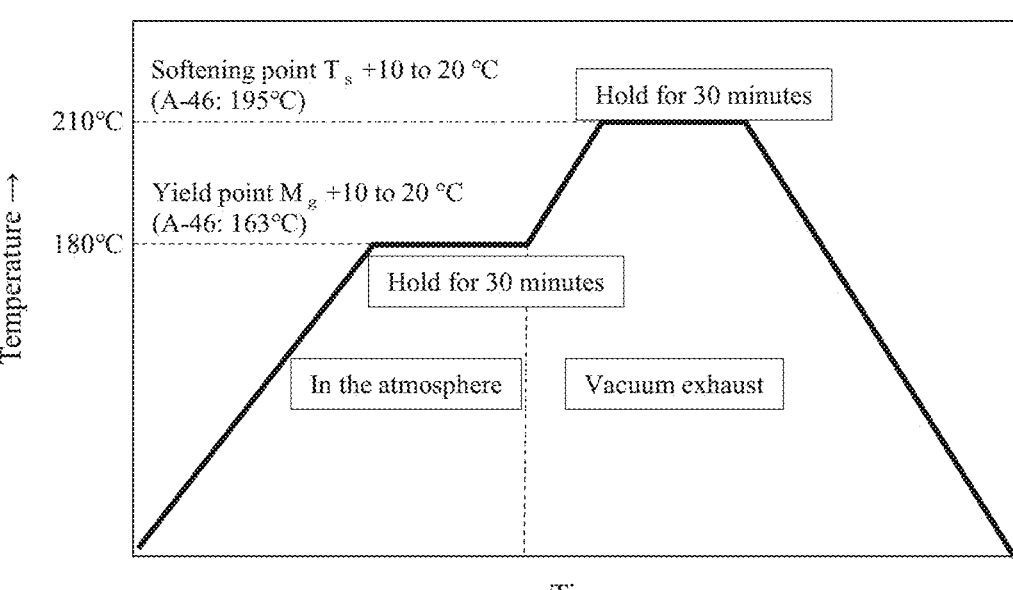
FIG. 13 is a sealing temperature profile in the manufacturing process of the vacuum insulated double glazing panel shown in FIG. 12.

FIG. 13 shows a sealing temperature profile in the heat treatment of FIG. 12.

As shown in FIG. 13, heating to 180° C. which is a temperature 10 to 20° C. higher than the bend point $M_g$ (163° C.) of the lead-free glass composition A-46 at a temperature rising rate of 5° C./min in the air, and holding for 30 minutes were carried out. Thereafter, the inside of the panels was evacuated from the evacuation hole 20 by a vacuum pump, and the panels was heated to 210° C. which is a temperature 10 to 20° C. higher than the softening point T$_s$ (195° C.) of the lead-free glass composition A-46 at a temperature rising rate of 5° C./min and held for 30 minutes, and sealed.

As shown in FIG. 12, the sealed part 14 and the spacer 18 were crushed by atmospheric pressure in the heat treatment, and were in close contact with the two air-cooled reinforced soda lime glass substrates 15 and 16. Thereafter, the cap 21 was attached to the evacuation hole 20 to produce the vacuum insulated double glazing panel.

Incidentally, in this Example, ten sheets of the vacuum insulated double glazing panels were produced.

(Evaluation Results of Manufactured Vacuum Insulated Double Glazing Panel)

First, an appearance inspection of the ten sheets of vacuum insulated double glazing panel produced in this Example was carried out. As a result, no break, cracks or the like in the sealed part 37 was not observed, either. Therefore, no problem in appearance was observed, cracks or the like were observed, and there was no problem in the appearance. Further, the space between the two air-cooled reinforced soda lime glass substrates 15 and 16 was substantially uniform thickness by the spherical beads 19 contained in the sealed part 14 and the spacer 18. That is, a vacuum insulated double glazing panel having a predetermined space part 17 was obtained. In addition, it was confirmed from the helium leak test that the inside of the panel was in a vacuum state, and that the outer peripheral portion of the panel was hermetically sealed.

In order to confirm the reliability of the sealed part 14, three vacuum insulated double glazing panels produced were immersed in hot water at 50° C. for 30 days. It was confirmed that the inside of the panel was maintained in the vacuum state without water infiltrating into the inside of all three panels.

Further, a temperature cycle test of –50 to +100° C. was carried out 1000 times on another three sheets of vacuum insulated double glazing panel. In this test, the inside of all three panels was kept in the vacuum state.

From these results, it was found that the vacuum insulated double glazing panel of this Example has the sealed parts formed having a high thermal insulation and reliability.

Furthermore, the air-cooled reinforced soda lime glass substrate can be applied to the vacuum insulated double glazing panel of this Example. Further, since the sealing temperature can be significantly lowered, it is possible to improve the productivity of the vacuum insulated double glazing panel.

Also, a vacuum insulated double glazing panel using the glass composite material containing the lead-free glass composition and the metal particles was produced and evaluated in the same manner as described above.

A-49 of the Example shown in Table 1 was used as the lead-free glass composition, and a tin-silver solder (Sn-3.5% Ag) having a melting point of 221° C. was used as the metal particles. And the mixing ratio thereof was 50:50 by volume percentage. Regarding the grain size, the A-49 was about 15 μm and the tin-silver solder was about 30 μm.

The glass paste was adhered to the air-cooled reinforced soda lime glass substrate 16 at 230° C. The sealing of the two air-cooled reinforced soda lime glass substrates 15 and 16 was also performed at 230° C.

The vacuum insulated double glazing panel produced did not show any cracks or cracks, and there was no problem in the appearance. The results of the helium leak test also showed no problems. Reliability by the hot water immersion test and the temperature cycle test was also passed. However, in the hot water immersion test, some corrosion was observed in the sealed part 14. it was found that the sealing is also possible by reducing the stress due to mixing soft metal particles, rather than taking the matching of the thermal expansion coefficient as described above.

Example 8

In this Example, a display in which a large number of organic light emitting diodes (OLED) were incorporated between two borosilicate glass substrates was manufactured as one of typical examples of the sealing structures. Here, a glass paste thereof is used for a glass composite material in this Example.

Figure 14A:
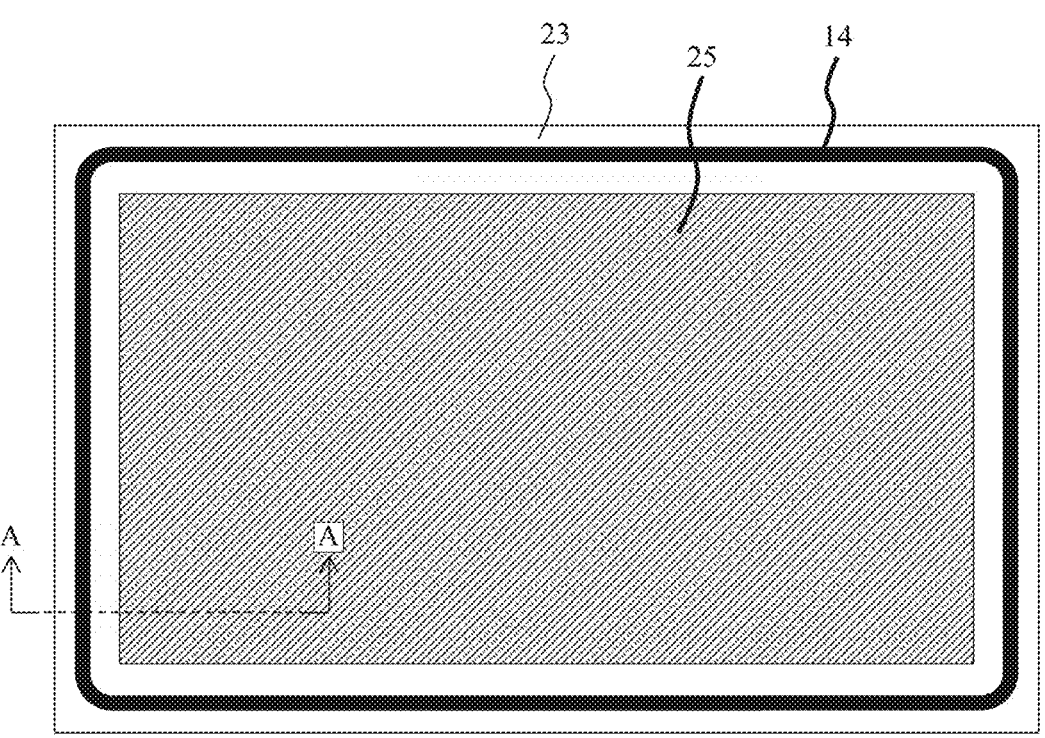
FIG. 14A is a schematic plan view showing an OLED display of an Example.

The FIG. 14A is a schematic plan view illustrating an exemplary OLED display.

As shown in this figure, the OLED display has a borosilicate glass substrate 23, and a sealed part 14 provided on the outer peripheral portion thereof. The sealed part 14 is formed of a glass composite material. An organic light emitting diode 25 is disposed inside the sealed part 14.

Figure 14B:
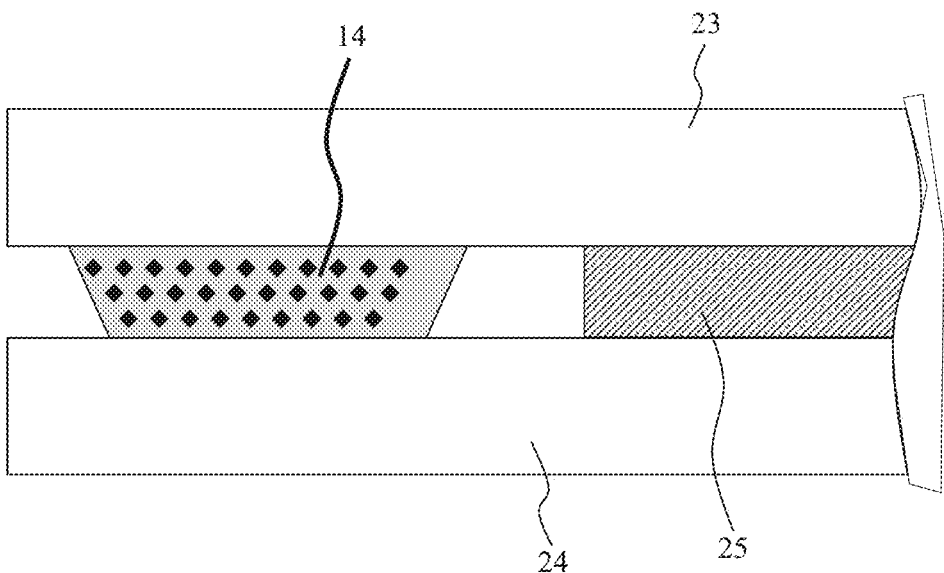
FIG. 14B is a cross-sectional view taken along line A-A of FIG. 14A.

FIG. 14B is a cross-sectional view taken along line A-A of FIG. 14A.

As shown in FIG. 14B, the OLED display includes two borosilicate glass substrates 23, 24, and a sealed part 14 and an organic light emitting diode 25 sandwiched therebetween.

Since the organic light emitting diode 25 is easily deteriorated by moisture and oxygen, it is very important to hermetically sealed by providing the sealed part 14.

For the glass composite material, it is effective to mix therewith low thermal expansion filler particles having a low thermal expansion coefficient in order to match the thermal expansion coefficients of the borosilicate glass substrates 23 and 24 as much as possible.

In this Example, a glass composite material including the lead-free glass composition A-39 shown in Table 1 and the low thermal expansion filler particle C-02 shown in Table 7 was used as the sealed part 14. The mixing ratio is 50% by volume of the A-39 and 50% by volume of the C-02. In addition, in this Example, a glass paste thereof was used for the glass composite material, and α-terpineol having a high viscosity was used as the solvent.

(Preparation of Glass Paste)

A powder of the lead-free glass composition, the low thermal expansion filler particle and the solvent were combined and mixed to prepare the glass paste. The A-39 having an average particle diameter of about 1 μm was used for the powder of the lead-free glass composition, and the C-02 having an average particle diameter of about 3 μm was used for the low thermal expansion filler particles. In addition, α-terpineol was used as the solvent, and isobornyl cyclohexanol was added as a viscosity modifier.

The low thermal expansion filler particle C-02 is obtained by adding iron tungstate (FeWO$_4$) into zirconium tungstate phosphate particles so as to efficiently absorb red semiconductor lasers and generate heat easily, though it will be described later. The mixing ratio is 60% by volume of the A-46 and 40% by volume of the C-02. The glass paste was prepared so that the total content of A-39 and C-02 (solid content) was about 80% by mass.

(Preparation of OLED Display)

Next, a manufacturing method of the OLED display of the present Example will be described with reference to FIGS. 15A to 17.

Figure 15A:
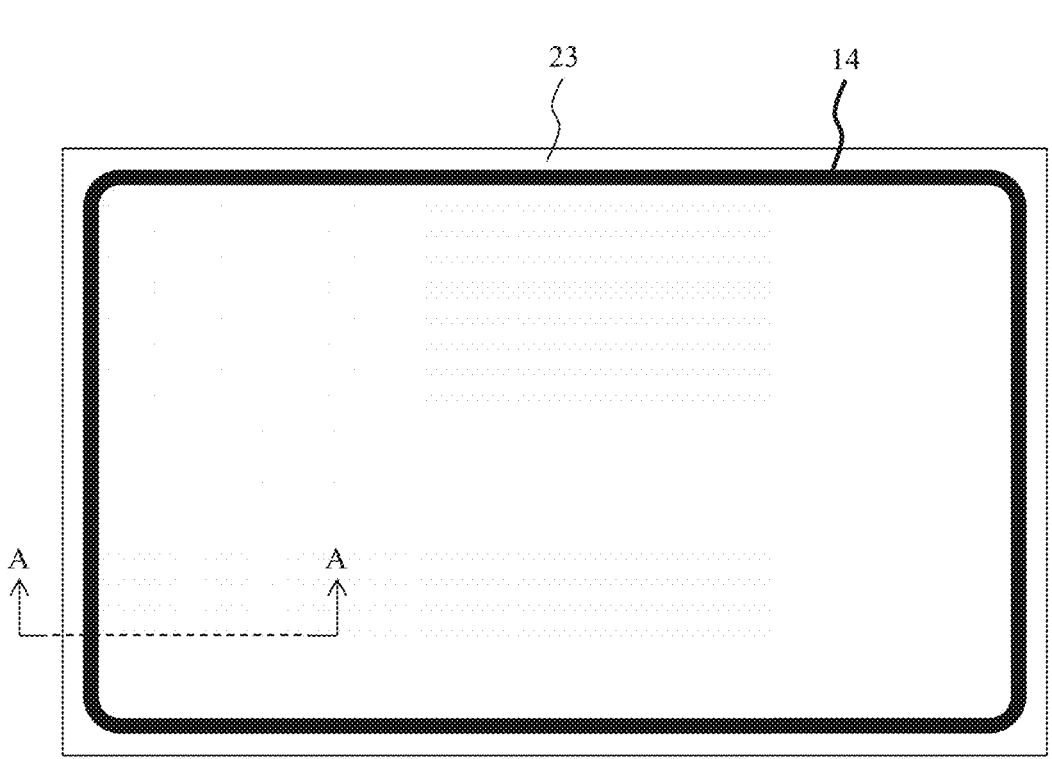
FIG. 15A is a schematic plan view showing a part of a manufacturing process of the OLED display of FIG. 14A.

FIG. 15A shows one of the substrates of the OLED display.

As shown in this figure, the prepared glass paste was applied to the outer peripheral portion of the borosilicate glass substrate 23 by a screen printing method, and dried at 150° C. in air. This was heated to 240° C. at a heating rate of 5° C./min in air and held for 30 minutes. Thus, the sealed part 14 was formed on the outer peripheral portion of the borosilicate glass substrate 23 The sealed part 14 formed on the outer periphery of the borosilicate glass substrate 23 had a line width of about 2 mm and a fired film thickness of about 15 μm.

Figure 15B:
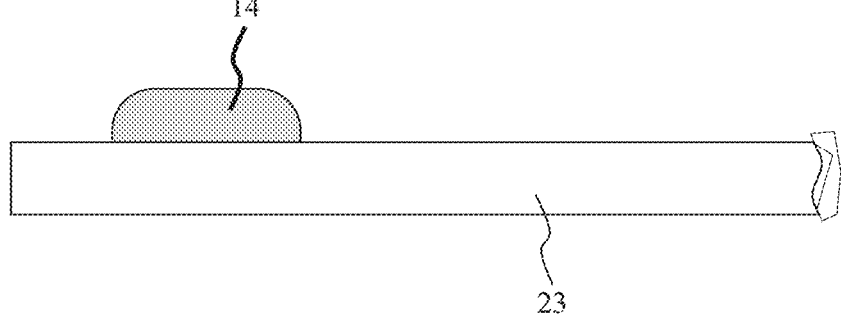
FIG. 15B is a cross-sectional view taken along line A-A of FIG. 15A.

FIG. 15B is a cross-sectional view taken along line A-A of FIG. 15A.

As shown in FIG. 15B, the sealed part 14 is applied to one surface of the borosilicate glass substrate 23.

Figure 16A:
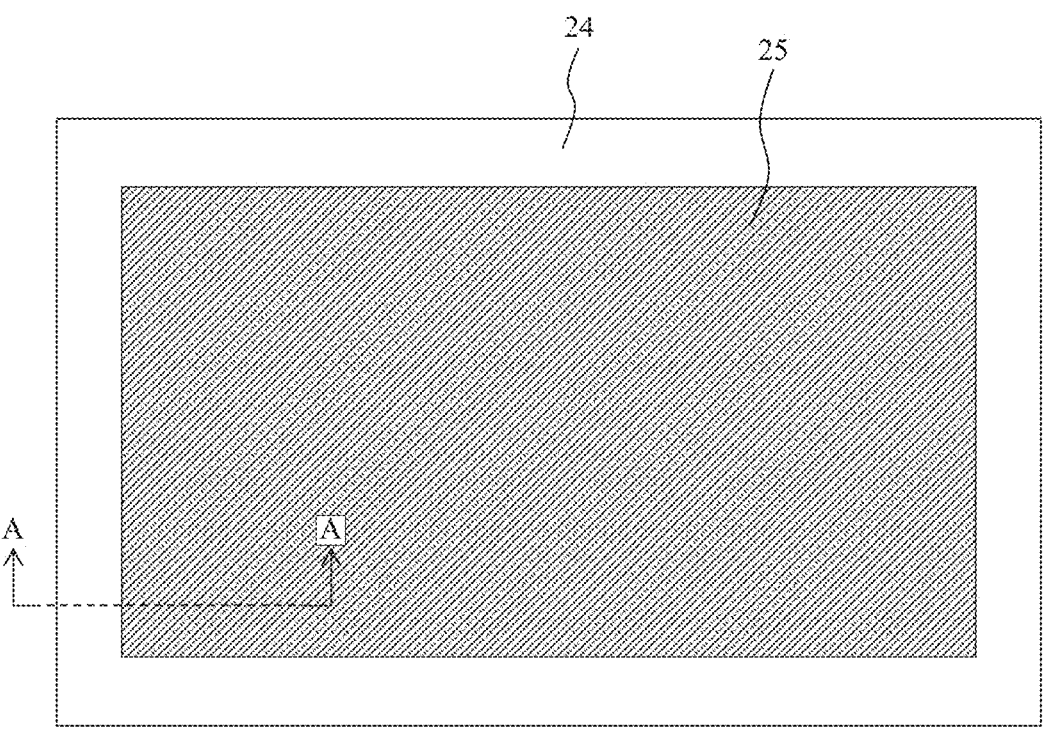
FIG. 16A is a schematic plan view showing a part of the manufacturing process of the OLED display of FIG. 14A.

FIG. 16A shows the other substrate of OLED display.

As shown in this figure, a large number of organic light emitting diodes 25 corresponding to the number of pixels were formed on the borosilicate glass substrate 24.

Figure 16B:
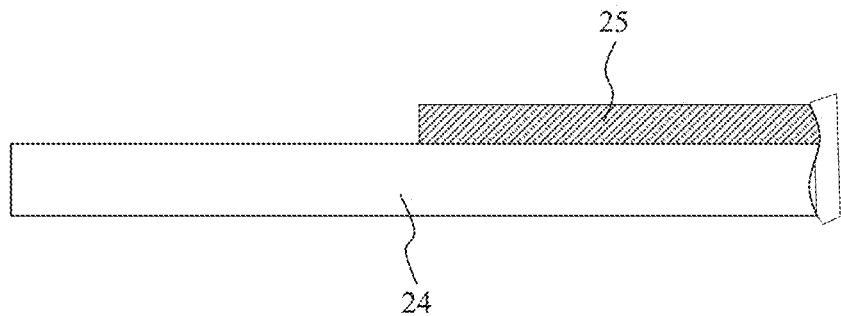
FIG. 16B is a cross-sectional view taken along line A-A of FIG. 16A.

FIG. 16B is a cross-sectional view taken along line A-A of FIG. 16A.

As shown in the FIG. 16B, the organic light emitting diodes 25 are formed on one surfaces of the borosilicate glass substrates 24.

Figure 17:
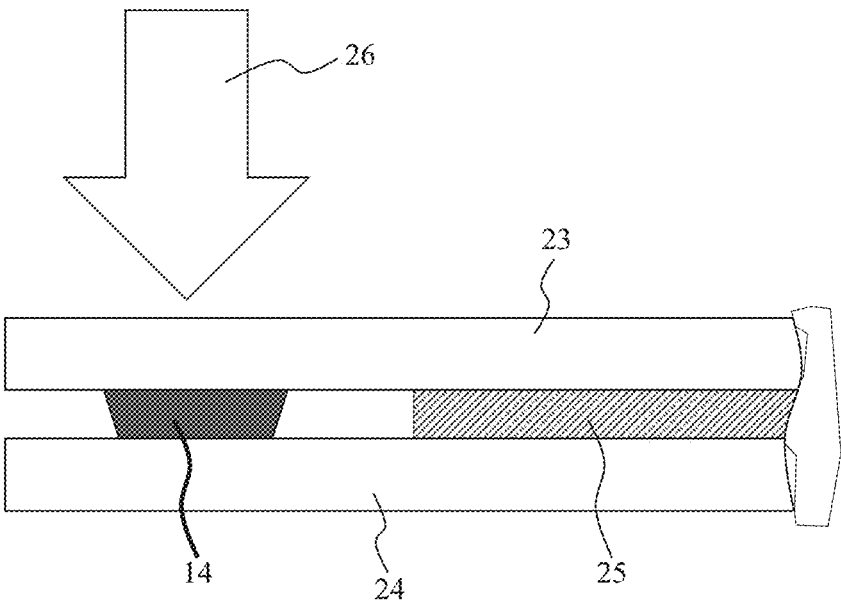
FIG. 17 is a schematic cross-sectional view showing a part of the manufacturing process of the OLED display of FIG. 14A.

FIG. 17 is a partial cross-sectional view showing a step of bonding two substrates shown in FIGS. 15A and 16A.

As shown in FIG. 17, the borosilicate glass substrates 23 and 24 are opposed to each other to adhere the sealed part 14 to the borosilicate glass substrate 24, and laser 26 is irradiated from the direction of the borosilicate glass substrate 23 toward the sealed part 14 in a reduced pressure atmosphere. The laser 26 was controlled to move the outer peripheral portion at a speed of 10 mm/sec.

As a result, the lead-free glass composition of the sealed part 14 was heated and softened and flowed to bond the borosilicate glass substrates 23 and 24, thereby fabricating the OLED display.

Here, a red semiconductor laser having a wavelength of 805 nm was used as the laser 26. This is because this wavelength is efficiently absorbed by the lead-free glass composition and the low thermal expansion filler particles described above and generates heat.

In this Example, five OLED displays were manufactured. The reason why lasers were used for the sealing is to prevent a thermal damage to the OLED and to improve productivity.

(Results of Assessment of Fabricated OLED Displays)

To begin with, a lighting test of the produced OLED display was carried out. As a result, it was confirmed that it lights up without any problems. In addition, adhesiveness and stickiness of the sealed part were also good.

Next, the OLED display was subjected to a high temperature and high humidity test (saturated pressure cooker test) for 1 day, 3 days, and 7 days under the condition of 120° C.-100% Rh-202 kPa, and the lighting test was performed in the same manner. For comparative purposes, an OLED display sealed only with a resin was also tested in the same manner. The resin sealing had a line width of about 5 mm and a thickness of about 15 μm.

In the high temperature and high humidity test for one day, any of the OLED displays illuminated without any trouble. However, the resin-sealed OLED display experienced a large degradation in the lighting after three days.

This is because water and oxygen diffused from the resin-sealed part to the inside of the OLED display, and the OLED of the resin-sealed part was deteriorated.

On the other hand, in the OLED display of the present Example, even in the high temperature and high humidity test for 7 days, no degradation was observed in the lighting of the OLED, and a good test result was obtained. This is a result of suggesting that high airtightness is maintained. Further, as a result of evaluating the adhesiveness and stickiness of the sealed part after the high temperature and high humidity test, a large decrease as in the case of sealing with a resin was not observed, and it was almost the same as before the test.

As described above, in the present Example, an application example to the OLED display has been described as one of typical examples of the sealing structures. It has been confirmed that the glass composite material containing the lead-free glass composition of the Example and the glass paste thereof can be effectively applied to the sealed part of the sealing structure, and thereby high functionality including reliability and productivity are achieved.

Further, from the result of the present Example, the lead-free glass composition of the Example can be effectively applied to a sealing structure susceptible to thermal damage such as a lighting equipment using an OLED, an organic photovoltaic cell, a MEMS sensor using an organic device and the like.

Example 9

In this Example, as one of the representative examples of the electrical and electronic parts, a solar cell using a silicon (Si) substrate having a pn junction was prepared, it was examined and evaluated whether the glass composite material of the Example can be applied to the electrode/wiring of the solar cell. Here, a glass paste thereof is used for the glass composite material in this Example.

Figure 18A:
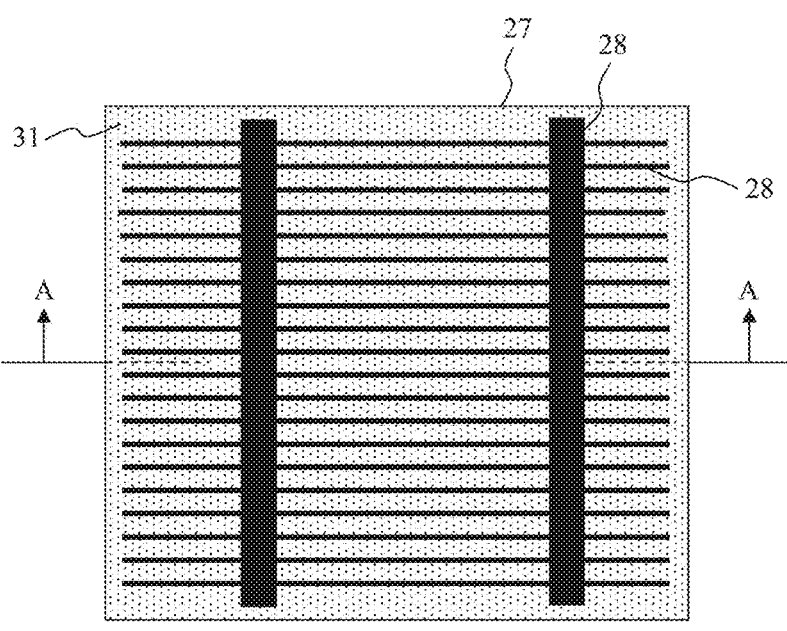
FIG. 18A is a schematic plan view showing a light receiving surface of a solar cell of an Example.

FIG. 18A shows a light receiving surface of a fabricated photovoltaic cell.

In this figure, a light receiving surface electrode/wiring 28 and an anti-reflective coating 31 are formed on the light receiving surface of a Si substrate 27 of the solar cell (silicon substrate).

Figure 18B:
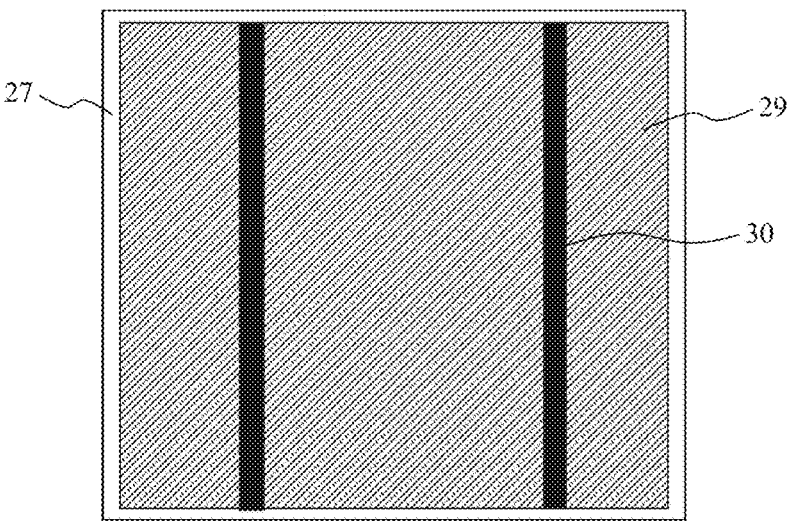
FIG. 18B is a schematic plan view showing a back surface of the solar cell of FIG. 18A.

FIG. 18B shows the back surface of the photovoltaic cells in FIG. 18A.

As shown in FIG. 18B, a current collector electrode/wiring 29 and an output electrode/wiring 30 are formed on the back surface of the solar cell.

Figure 18C:
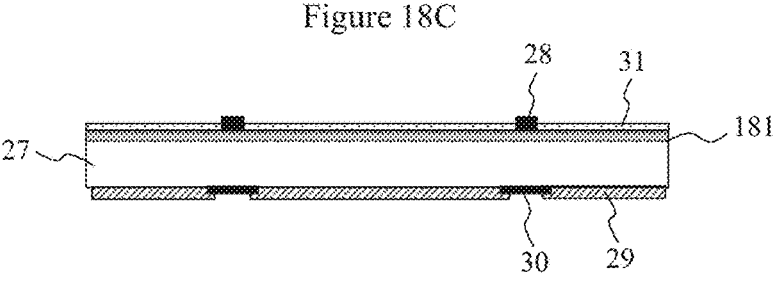
FIG. 18C is a cross-sectional view taken along line A-A of FIG. 18A.

FIG. 18C is a cross-sectional view taken along line A-A of FIG. 18A.

As shown in FIG. 18C, a pn junction surface 181 is disposed on the light receiving surface side of the Si substrate 27 of the solar cell. The glass composite material of the Example is used for the light receiving surface electrode/wiring 28, the current collector electrode/wiring 29 and the output electrode/wiring 30.

A single crystal Si substrate for a solar cell of 150×150× 0.2 mm was used for the Si substrate 27. The anti-reflective coating 31 made of silicon nitride (SiN) was formed with about 100 nm on the light receiving surface of the Si substrate 27. As the light receiving surface electrode/wiring 28 and the output electrode/wiring 30, a glass composite material containing the lead-free glass composition A-18 (average particle diameter of about 1 μm) shown in Table 1 and spherical silver (Ag) particles (average particle diameter of about 1.5 μm) was used. The mixing ratio is 20% by volume of the A-18 and 80% by volume of the Ag particles.

As the current collector electrode/wiring 29, a glass composite material containing the lead-free glass composition A-17 (average particle diameter is about 1 μm) shown in Table 1 and spherical aluminum (Al) particles (average particle diameter is about 3 μm) was used. The mixing ratio is 15% by volume of the A-17 and 85% by volume of the Al particles.

Conventionally, a leaded glass paste containing silver (Ag) particles and particles of a leaded glass composition has been used to form the light receiving surface electrode/wiring 28 and the output electrode/wiring 30, and the leaded glass paste containing aluminum (Al) particles and a powder of the leaded glass composition has been used to form the current collector electrode/wiring 29. Each of these leaded glass pastes was applied to both surfaces of the Si substrate 27 by a screen printing method or the like, and after drying, fired at 600 to 900° C. in the air. In this case, although it is also a problem to contain harmful lead, the solar cell is large warped, there is also a problem in handling, such that Si substrate 27 is easily damaged, or cracks or the like tends to occur in the Si substrate 27 when the stress is concentrated by generating a brittle intermetallic compound by a reaction between Al in the current collector electrode/wiring 29 and Ag in the output electrode/wiring 30 since the firing temperature for forming the electrode/wiring is high.

(Preparation of Conductive Glass Paste)

A glass paste was prepared by mixing a solvent to the glass composite material containing particles of Ag or Al described above. α-Terpineol was used as the solvent. Also, isobornyl cyclohexanol was added as a viscosity modifier.

In both glass pastes, the total content (solid content) of the particles of the lead-free glass composition and the metal particles was set to about 80% by mass.

(Preparation of Solar Cell)

The producing method of the photovoltaic cells shown in FIGS. 18A to 18C will be described.

A glass paste containing the above-mentioned Ag particles was applied to the light receiving surface side of the Si substrate 27 having the anti-reflective coating 31 by a screen printing method, and dried at about 150° C. This was heated to 250° C. at a heating rate of about 20° C./min in a tunnel furnace held for 30 minutes, the light receiving surface electrode/wiring 28 was formed on the light receiving surface of the Si substrate 27.

Next, a glass paste containing the above-mentioned Ag particles was applied to the back surface of the Si substrate 27 by a screen printing method, and dried at about 150° C.

Further, a glass paste containing particles of Ag or Al described above was applied by a screen printing method and dried at about 150° C. This was fired under the same heating conditions as the formation of the light receiving surface electrode/wiring 28 to form a current collector electrode/wiring 29 and the output electrode/wiring 30 on the back surface of the Si substrate 27.

Two heating history was applied to the light receiving surface electrode/wiring 28, but thereby the electrical connection to the Si substrate 27 of the light receiving surface electrode/wiring 28 became better.

Ten solar cells were manufactured by the above process.

(Evaluation Result of Manufactured Solar Cell)

First, an appearance inspection of ten solar cells manufactured in this Example was performed. As a result, break, cracks or the like were not observed on the Si substrate 27, the light receiving surface electrode/wiring 28 formed on the Si substrate 27, the current collector electrode/wiring 29 and the output electrode/wiring 30. In addition, no large warpage was observed. Therefore, there was no problem in appearance. This is an effect of remarkably lowering the formation temperature of various electrodes/wirings by the lead-free glass composition of the Example.

Next, it was confirmed that there is no problem in the ten solar cells produced because an electrical connection between the Si substrate 27 and the light receiving surface electrode/wiring 28, and an ohmic contact between the Si substrate 27 and the current collector electrode/wiring 29 and between the Si substrate 27 and the output electrode/wiring 30 is obtained.

Subsequently, when the power generation efficiency of the ten produced solar cells was evaluated by a solar simulator, about 18% equivalent to the conventional one was obtained in spite of remarkably lowering the fabrication temperature.

In order to confirm the reliability, three of the produced solar cells were immersed in warm water at 50° C. for 5 days, and the power generation efficiency was measured in the same manner.

In the conventional solar cell, the electrode/wiring was corroded and the power generation efficiency was degraded to about 12 to 13%. In contrast, in the solar cell of this Example, corrosion of the electrode/wiring was hardly observed. In addition, no deterioration in power generation efficiency was observed. As described in Examples 3 and 4, it is considered that such a highly reliable solar cell can be obtained by the specific reaction between the lead-free glass composition of the Examples and Ag or Al.

Next, when the overlapping portion of the current collector electrode/wiring 29 and the output electrode/wiring 30 formed on the back surface was decomposed and confirmed, the formation of a brittle intermetallic compound due to the reaction of Ag and Al was not observed. Therefore, it is considered to be less likely that to generate cracks or the like in the Si substrate 27 even if stress is concentrated. Further, it is considered that it is possible to reduce the breakage in handling such as incorporating into the module since the warpage of the Si substrate 27 can be reduced. The prevention of the formation of the brittle intermetallic compounds and the reduction of the warpage are due to the fact that the firing temperature (250° C.) of the solar cell of the Example is significantly lower than that of the conventional type (600 to 900° C.).

As described above, in the present Example, the solar cell having electrodes/wirings formed using the glass composite material containing the lead-free glass composition of the Example or the glass paste thereof has been described as one of representative examples of the electrical and electronic parts. These glass composite materials and glass paste thereof are not limited to the solar cell, can be effectively applied to the electrodes/wirings of various electrical and electronic parts, and contributes to the provision of electrical and electronic parts having such excellent properties as high functionality including reliability, productivity and yield improvement.

Example 10

In this Example, a package of a quartz oscillator was manufactured as one of representative examples of the electrical and electronic parts, and it was examined whether the glass composite material of the Example can be applied to the conductive joint or the sealed part of the package. Here, a glass paste thereof is used for a glass composite material in this Example.

FIGS. 19A to 19F shows a manufacturing method of the quartz oscillator package.

Figure 19A:
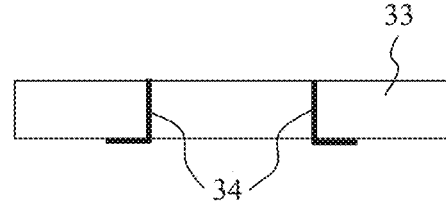
FIG. 19A is a schematic cross-sectional view showing a method of manufacturing a quartz oscillator package of an Example.
Figure 19B:
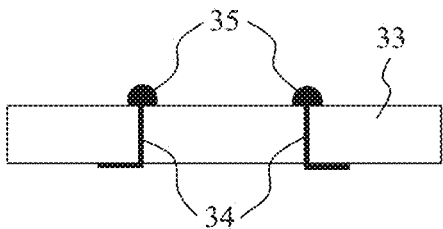
FIG. 19B is a schematic cross-sectional view showing the method of manufacturing the quartz oscillator package of the Example.
Figure 19C:
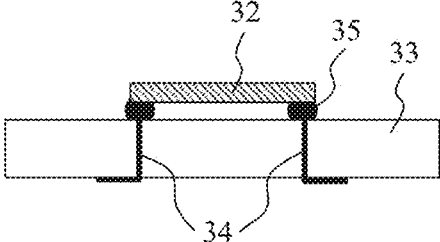
FIG. 19C is a schematic cross-sectional view showing the method of manufacturing the quartz oscillator package of the Example.
Figure 19D:
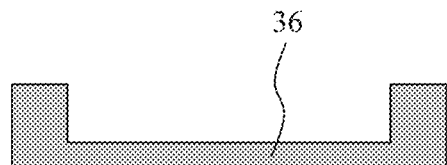
FIG. 19D is a schematic cross-sectional view showing the method of manufacturing the quartz oscillator package of the Example.
Figure 19E:
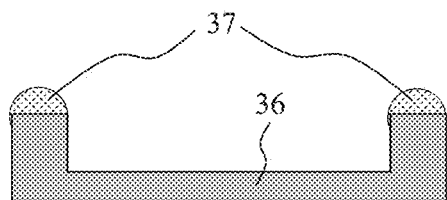
FIG. 19E is a schematic cross-sectional view showing the method of manufacturing the quartz oscillator package of the Example.
Figure 19F:
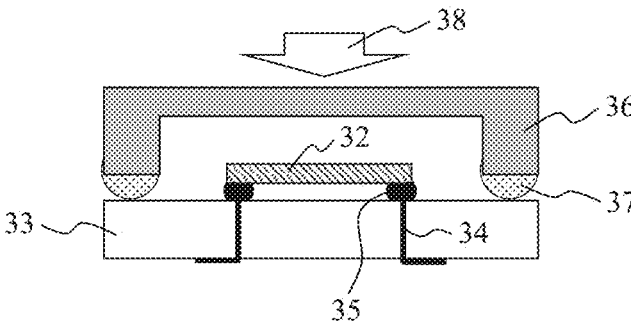
FIG. 19F is a schematic cross-sectional view showing the method of manufacturing the quartz oscillator package of the Example.
Figure 19G:
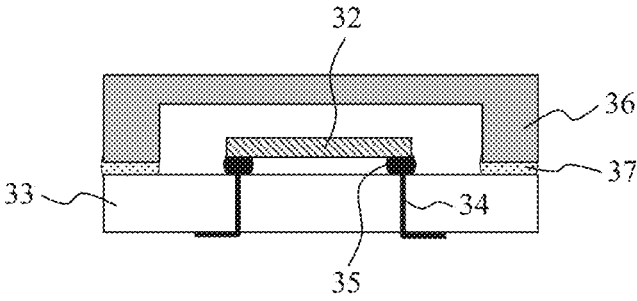
FIG. 19G is a schematic cross-sectional view showing the quartz oscillator package manufactured by the method of FIGS. 19A to 19F.

FIG. 19G is a schematic cross-sectional view of the fabricated quartz oscillator package.

The method for manufacturing the quartz oscillator package is as follows.

First, as shown in the FIG. 19A, the ceramic substrate 33 on which the wirings 34 are formed is manufactured.

Next, as shown in the FIG. 19B, a glass paste containing metal particles is applied onto the wiring 34, dried, heated in the air, and the lead-free glass composition in the glass composite material is softened and flowed to form the conductive bonded part 35.

Next, as shown in the FIG. 19C, a quartz oscillator 32 is disposed on the conductive bonded part 35, heated in an inert gas or in a vacuum, and the lead-free glass composition in the conductive bonded part 35 is softened and flowed again to electrically connect the lead-free glass composition.

On the other hand, a ceramic cap 36 shown in the FIG. 19D is prepared. Then, as shown in FIG. 19E, a glass paste containing low thermal expansion filler particles is applied to an outer peripheral portion of the ceramic cap 36, dried, and heated in an atmosphere to form a sealed part 37 by softening and flowing the lead-free glass composition in the glass composite material.

A ceramic substrate 33 having a quartz oscillator 32 and a conductive bonded part 35 shown in FIG. 19C, and a ceramic cap 36 having a sealed part 37 shown in FIG. 19E put together as shown in FIG. 19F, and the lead-free glass composition in the sealed part 37 is softened and fluidized again by applying a slight load 38 while heated in an inert gas or in a vacuum. Thus, the quartz oscillator packaging shown in FIG. 19G is obtained.

In the above step, care must be taken so that the conductive bonded part 35 does not peel off from the quartz oscillator 32 or the wiring 34. For this purpose, it is effective to make the softening point $T_s$ of the lead-free glass composition in the sealed part 37 lower than the softening point $T_s$ of the lead-free glass composition in the conductive bonded part 35. In other words, it is effective to make the lead-free glass composition included in the glass composite material different depending on an area to which the part is applied.

As shown in FIG. 19G, the completed quartz oscillator package includes a quartz oscillator 32 installed via a conductive bonded part 35 on the surface of the ceramic substrate 33 having a wiring 34. The wiring 34 and the conductive bonded part 35 is electrically connected. Thus, the quartz oscillator 32 is electrically connected to the outside. The ceramic cap 36 is for protecting the quartz oscillator 32 is hermetically bonded to the outer peripheral portion of the ceramic substrate 33 by the sealed part 37. The glass composite material containing the lead-free glass composition of the Example and the metal particles is used for the conductive bonded part 35, and the glass composite material containing the lead-free glass composition of the Example and the low thermal expansion filler particles is used for the sealed part 37.

(Preparation of Glass Paste for Conductive Bonded Parts and Sealing Parts)

In this Example, in A-47 having the softening point $T_s$ shown in Table 1 of 220° C. as the lead-free glass composition in the glass paste used to form the conductive bonded part 35, A-46 having the softening point $T_s$ shown in Table 1 of 195° C. was used as the lead-free glass composition in the glass paste used to form the sealed part 37. Since the temperature difference between the temperature of the A-47 and the temperature of the softening point $T_s$ of the A-46 is 25° C., sealing can be performed without causing problems such as peeling of the conductive bonded part 35. That is, the good conductive bonded part 35 and the sealed part 37 is obtained at the same time.

A glass paste for forming the conductive bonded part 35 was prepared by combining and mixing a powder of the lead-free glass composition of the Example, metal particles, and a solvent. A-47 having an average particle diameter of about 3 μm was used for the powder of the lead-free glass composition, spherical silver (Ag) particles having an average particle diameter of about 1.5 μm were used for the metal particles. And α-terpineol was used for the solvent, and isobornyl cyclohexanol was added for a viscosity modifier. The mixing ratio is 25% by volume of the A-47 and 85% by volume of the Ag particles. The glass paste for forming the conductive bonded part 35 was prepared so that the total content of the A-47 and the Ag particles (solid content) was about 80% by mass.

A glass paste for forming the sealed part 37 was prepared by combining and mixing a powder of the lead-free glass composition of the Example, the low thermal expansion filler particles and a solvent. A-46 having an average particle diameter of about 3 μm was used for particles of the lead-free glass composition. C-01 having an average particle diameter of about 10 μm shown in Table 7 was used for the low thermal expansion filler particles. α-terpineol was used for the solvent. And isobornyl cyclohexanol was added for a viscosity modifier. The mixing ratio is 60% by volume of A-46 and 40% by volume of C-01. The glass paste for forming the sealed part 37 was prepared so that the total content (solid content) of A-46 and C-01 was about 80% by mass.

(Preparation of Quartz Oscillator Package)

A method for manufacturing a quartz oscillator package of this Example will be specifically described.

In this Example, alumina (α-Al₂O₃) is used for the ceramic substrate 33 and the ceramic scanner 36.

As shown in FIGS. 19A and 19B, a glass paste for forming the conductive bonded part 35 was applied onto the wirings 34 formed on the ceramic substrate 33 by a dispenser method, and the glass paste was dried at about 150° C. in the atmosphere. This was heated to 240° C. at a temperature rising rate of 10° C./min in the air and held for 30 minutes, thereby forming the conductive bonded part 35 on the wiring 34 of the ceramic substrate 33.

Next, as shown in FIG. 19C, the quartz oscillator 32 was disposed on the conductive bonded part 35, heated to 240° C. at a temperature rising rate of 20° C./min in an inert gas (argon) and held for 10 minutes, and the quartz oscillator 32 was connected to the conductive bonded part 35.

On the other hand, as shown in FIGS. 19D and 19E, a glass paste for forming the sealed part 37 was applied to the outer periphery of the ceramic cap 36 by a screen-printing method, and the glass paste was dried at about 150° C. in the air. This was held for 30 minutes heated to 220° C. at a heating rate of 10° C./min in air, the sealed part 37 was formed on the outer peripheral portion of the ceramic cap 36.

The ceramic cap 36 forming the sealed part 37 was aligned with the ceramic substrate 33 connecting the quartz oscillator 32 as shown in FIG. 19F, placed on a dedicated fixing jig, and loaded. This was heated to 210° C. at a temperature rising rate of 10° C./min in a vacuum and held for 15 minutes, and the ceramic cap 36 and the ceramic substrate 33 were sealed, whereby a quartz oscillator package shown in the FIG. 19G was manufactured. In this Example, twenty-four quartz oscillator packages were produced.

(Evaluation Result of Produced Quartz Oscillator Package)

First, the eighteen quartz oscillator packages produced in this Example were inspected for the appearance by a stereomicroscope. As a result, there was almost no misalignment of the ceramic cap 36 at the time of sealing. Further, any devitrification due to crystallization, or break, cracks or the like in the sealed part 37 was not observed, either. Therefore, no problem in appearance was observed.

Next, a conduction test was performed from the wiring 34 on the back surface of the ceramic substrate 33 about whether the conductive bonded part 35 inside the sealed ceramic cap 36 is electrically connected to the quartz oscillator 32 and the wiring 34. As a result, it was confirmed that the quartz oscillator operated in all the produced quartz oscillator packages.

And a helium leak test was carried out in five produced quartz oscillator packages. As a result, it was confirmed that the inside of the package was in a vacuum state and the outer peripheral portion was hermetically sealed by the sealed part 37.

In order to confirm the reliability of the sealed part 37, a high temperature and high humidity test (saturation-type pressure cooker test) was conducted for three days under the condition of 120° C.-100% Rh-202 kPa with respect to the five produced quartz oscillator packages. Thereafter, a helium leak test was carried out. And it was confirmed that the airtightness and stickiness of the sealed part 37 is maintained in all of the quartz oscillator packages subjected to the high temperature and high humidity test.

From the above, it has been found that a highly reliable quartz oscillator package can be obtained in consideration of the influence on the environmental load by applying the glass composite material containing the lead-free glass composition of the Examples and the metal particles or the low thermal expansion filler particles or the glass paste thereof to the conductive joint or the sealed part.

In the present Example, an example of application to a quartz oscillator package has been described as a representative example of an electrical and electronic part and a sealing structure, but the present invention is not limited to the quartz oscillator package and can be effectively applied to the other electrical and electronic parts or sealing structures.

The present invention is applicable to various display panels, package devices, image display devices, multilayer capacitors, inductors, light emitting diodes, multilayer circuit boards, semiconductor modules, semiconductor sensors, and sealing structures and electrical and electronic parts of the semiconductor sensors.

REFERENCE SIGNS LIST

1: cylindrical base material, 1': cylindrical metal base material, 2, 2': bonding surface, 3, 3': glass paste, 4, 4': glass composite material, 5: plate-shaped base material, 5': plate-shaped metal base material, 6: substrate, 7, 8, 9, 10, 11, 12, 13: wiring, 14: sealed part, 15, 16: air-cooled reinforced soda lime glass substrate, 17: space part, 18: spacer, 19: spherical bead, 20: evacuation hole, 21: cap, 22: heat ray reflective film, 23, 24: borosilicate glass substrate, 25: organic light emitting diode, 26: laser, 27: Si substrate, 28: light receiving surface electrode/wiring, 29: current collector electrode/wiring, 30: output electrode/wiring, 31: antireflective coating, 32: quartz oscillator, 33: ceramic substrate, 34: wiring, 35: conductive bonded part, 36: ceramic cap, 37: sealed part, 38: load, 181: pn junction surface.

The invention claimed is:

1. A lead-free low-melting glass composition containing:
vanadium oxide;
tellurium oxide;
silver oxide; and
lithium oxide,
said composition satisfying the following two relational expressions (1) and (2) in terms of oxides:

$$[Ag_2O] \geq [TeO_2] \geq [V_2O_5] \geq [Li_2O] \qquad (1)$$

$$2[V_2O_5] \geq [Ag_2O] + [Li_2O] \geq 40 \qquad (2)$$

(In the formula, [X] represents a content of component X, and the unit thereof is "mol % "; the same applies hereinafter).

2. The lead-free low-melting glass composition according to claim 1,
wherein the following relation (3) is satisfied:

$$[V_2O_5] + [TeO_2] + [Ag_2O] + [Li_2O] \geq 90 \qquad (3).$$

3. The lead-free low-melting glass composition according to claim 1,
wherein the following relation (4) is satisfied:

$$3 \geq [Li_2O] \geq 25 \qquad (4).$$

4. The lead-free low-melting glass composition according to claim 1,
wherein the following relation (5) is satisfied:

$$5 \geq [Li_2O] \geq 15 \qquad (5).$$

5. The lead-free low-melting glass composition according to claim 1,
wherein the following three relational expressions (6) to (8) are satisfied:

$$20 \geq [V_2O_5] \geq 30 \qquad (6)$$

$$24 \geq [TeO_2] \geq 35 \qquad (7)$$

$$24 \geq [Ag_2O] \geq 42 \qquad (8).$$

6. The lead-free low-melting glass composition according to claim 1,
further containing one or more of yttrium oxide, lanthanum oxide, cerium oxide, erbium oxide, ytterbium oxide, aluminum oxide and iron oxide,
wherein the following relation (9) is satisfied:

$$0.5 \leq [Y_2O_3] + [La_2O_3] + [CeO_2] + [Er_2O_3] + [Yb_2O_3] + [Al_2O_3] + [Fe_2O_3] \leq 3 \qquad (9).$$

7. The lead-free low-melting glass composition according to claim 1,
further containing one or more of an oxide of an alkaline earth metal, tungsten oxide and molybdenum oxide,
wherein the following relation (10) is satisfied:

$$0.5 \leq [MgO] + [CaO] + [SrO] + [BaO] + [WO_3] + [MoO_3] \leq 5 \qquad (10).$$

8. The lead-free low-melting glass composition according to claim 1
wherein a second endothermic peak temperature by a differential thermal analysis was 220° C. or lower,
a crystallization temperature by the differential thermal analysis was 260° C. or higher, and
a difference between the crystallization temperature and the second endothermic peak temperature is 60° C. or more.

9. A low-melting glass composite material comprising:
the lead-free low-melting glass composition according to claim 1; and one or more of low thermal expansion filler particles, metal particles and a resin.

10. The low-melting glass composite material according to claim 9, wherein a content of the lead-free low-melting glass composition is 35% by volume or more and less than 100% by volume, wherein a content of the low thermal expansion filler particles is more than 0% by volume and 65% by volume or less.

11. The low-melting glass composite material according to claim 10, wherein the low thermal expansion filler particles include one or more of zirconium tungstate phosphate ($Zr_2(WO_4)(PO_4)_2$), β-eucryptite ($Li_2O \cdot Al_2O_3 \cdot 2SiO_2$), cordierite ($2MgO \cdot 2Al_2O_3 \cdot 5SiO_2$), quartz glass ($SiO_2$), niobium oxide ($Nb_2O_5$), and silicon (Si).

12. The low-melting glass composite material according to claim 10, wherein the low thermal expansion filler particles are zirconium tungstate phosphate ($Zr_2(WO_4)(PO_4)_2$) or a compound mainly composed of zirconium tungstate phosphate ($Zr_2(WO_4)(PO_4)_2$), wherein a content of the low thermal expansion filler particles is 30% by volume or more and 60% by volume or less.

13. The low-melting glass composite material according to claim 9, wherein a content of the lead-free low-melting glass composition is 10% by volume or more and 80% by volume or less, and a content of the metal particles is 20% by volume or more and 90% by volume or less.

14. The low-melting glass composite material according to claim 9, wherein the metal particles include one or more of gold (Au), silver (Ag), silver alloy, copper (Cu), copper alloy, aluminum (Al), aluminum alloy, tin (Sn) and tin alloy.

15. The low-melting glass composite material according to claim 14, wherein the metal particles include silver (Ag) or tin (Sn), and a content of the metal particles is 30% by volume or more and 90% by volume or less.

16. The low-melting glass composite material according to claim 9, wherein a content of the lead-free low-melting glass composition is 5% by volume or more and less than 100% by volume, and a content of the resin is more than 0% by volume and 95% by volume or less.

17. The low-melting glass composite material according to claim 9, wherein the resin includes one or more of an epoxy resin, a phenoxy resin, a phenolic resin, an acrylic resin, a urethane resin and a fluororesin.

18. A low-melting glass paste comprising:

the low-melting glass composite material according to claim 9; and a solvent.

19. The low-melting glass paste according to claim 18, wherein the solvent contains dihydroterpineol, a-terpineol or carbitol acetate.

20. A sealing structure comprising:

a sealed part which is formed using the low-melting glass composite material according to claim 9 and constitutes at least a part of a boundary between an inner space separated from an outside and the outside.

21. An electrical and electronic part comprising:

an electrode, a wiring, a conductive joint, or a heat dissipation joint which is formed using the low-melting glass composite material according to claim 13.

22. A coated part comprising:

a member; and a coating film formed on the member, wherein the coating film includes the low-melting glass composite material according to claim 9.

23. The coated part according to claim 22, wherein the member includes a base material of a metal, ceramic or glass.

\* \* \* \* \*